United States Patent
Yonemura

(10) Patent No.: US 9,180,667 B2
(45) Date of Patent: Nov. 10, 2015

(54) LIQUID-EJECTING HEAD AND LIQUID-EJECTING APPARATUS

(71) Applicant: SEIKO EPSON CORPORATION, Tokyo (JP)

(72) Inventor: Takayuki Yonemura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/263,714

(22) Filed: Apr. 28, 2014

(65) Prior Publication Data

US 2014/0232794 A1  Aug. 21, 2014

Related U.S. Application Data

(63) Continuation of application No. 13/040,627, filed on Mar. 4, 2011, now Pat. No. 8,789,927.

(30) Foreign Application Priority Data

Mar. 8, 2010  (JP) .................................. 2010-051187

(51) Int. Cl.
| | |
|---|---|
| B41J 2/045 | (2006.01) |
| B41J 2/14 | (2006.01) |
| C04B 35/462 | (2006.01) |
| C04B 35/468 | (2006.01) |
| C04B 35/475 | (2006.01) |
| H01L 41/187 | (2006.01) |

(52) U.S. Cl.
CPC ........... *B41J 2/14201* (2013.01); *C04B 35/462* (2013.01); *C04B 35/4682* (2013.01); *C04B 35/475* (2013.01); *H01L 41/1873* (2013.01); *C04B 2235/3201* (2013.01); *C04B 2235/3215* (2013.01); *C04B 2235/3298* (2013.01); *C04B 2235/768* (2013.01)

(58) Field of Classification Search
None
See application file for complete search history.

(56) References Cited

U.S. PATENT DOCUMENTS

| | | | |
|---|---|---|---|
| 7,090,785 | B2 | 8/2006 | Chiang et al. |
| 8,179,025 | B1 | 5/2012 | Takeuchi et al. |
| 2003/0001131 | A1 | 1/2003 | Takase et al. |

(Continued)

FOREIGN PATENT DOCUMENTS

| | | |
|---|---|---|
| JP | 11-180769 | 7/1999 |
| JP | 2001-151566 | 6/2001 |
| JP | 2001-223404 | 8/2001 |

(Continued)

OTHER PUBLICATIONS

Shunsuke et al, Giant Strain in lead free (Bi0.5Na0.5)TiO3 Based Single Crystals, Applied Physics Letters, AIP Publishing, May 7, 2008, 92, 202908, p. 1-3.*

(Continued)

*Primary Examiner* — Erica Lin
(74) *Attorney, Agent, or Firm* — Workman Nydegger

(57) ABSTRACT

A liquid-ejecting head includes a pressure-generating chamber communicating with a nozzle opening and includes a piezoelectric element including a piezoelectric layer and electrodes. The piezoelectric layer contains bismuth sodium potassium titanate and satisfies the inequality $0 \leq P_r/P_m \leq 0.25$ at 25° C., where $P_m$ and $P_r$ are the saturation polarization and remanent polarization, respectively, of the piezoelectric layer.

5 Claims, 40 Drawing Sheets

(56) References Cited

U.S. PATENT DOCUMENTS

2008/0237530 A1    10/2008    Tsukada et al.
2011/0291522 A1    12/2011    Kounga Njiwa et al.

FOREIGN PATENT DOCUMENTS

| JP | 2007-266346 | | 10/2007 |
|----|----|----|----|
| JP | 2007266346 A | * | 10/2007 |
| JP | 2008-239380 | | 1/2008 |
| WO | 2009-133194 | | 11/2009 |

OTHER PUBLICATIONS

M. Abazri et al, Dielectric and piezoelectric properties of lead-free (Bi, Na) TiO3-based thin films, Applied Physics Letters, AIP Publishing, Feb. 23, 2010, 96, 082803, p. 1-3.

G. Fan et al., Morphotropic phase boundary and piezoelectric properties of (Bi1/2Na1/2)TiO3—(Bi1/2K1/2)TiO3—KNbO3 lead-free piezoelectric ceramics, Applied Physics Letters, AIP Publishing, Nov. 15, 2007, 91, 202908, p. 1-3.

S. Teranishi et al., Giant strain in lead-free (Bi0.5Na0.5)TiO3-based single crystals, Applied Physics Letters, AIP Publishing, May 7, 2008, 92, 182905, p. 1-3.

A. Hussain, Effects of Hafnium Substitution on Dielectric and Electromechanical Properties of Lead-free Bi0.5(Na0.78K0.22)0.5(Ti1-xHfx)O3 Ceramics, Japanese Journal of Applied Physics, Apr. 20, 2010, 49, 041504, p. 1-5.

W. Sakamoto, "Lead-Free Niobate-Based Piezoelectric Ceramics Thin Films" Materials Integration, vol. 22 No. 8 (2009) pp. 10-19.

A. Sasaki et al, "Dielectric and Piezoelectric Properties of (Bi0.5Na0.5)TiO3—(Bi0.5K0.5)TiO3 Systems" Jpn. J. Appl. Phys., vol. 38 (1999) pp. 5564-5567.

Y. Hiruma et al., "Phase Transition Temperatures and Piezoelectric Properties of (Bi1/2Na1/2)TiO3—(Bi1/2K1/2)TiO3—BaTiO3 Lead-Free Piezoelectric Ceramics" Jpn. J. Appl. Phys., vol. 45, No. 9B (2006), pp. 7409-7412.

X. X. Wang, et al "Electromechanical and ferroelectric properties of (Bi1/2Na1/2)TiO3—(Bi1/2K1/2)TiO3—BaTiOx lead-free piezoelectric ceramics" Appl. Phys. Lett. vol. 85, No. 1 (2004) pp. 91-93.

D. Y. Wang, et al "Piezoresponse and ferroelectric properties of lead-free [Bi0.5(Na0.7K0.2Li0.1)0.5]TiO3 thin films by pulsed laser deposition" Appl. Phys. Lett. 92 222909 (2008).

Z. H. Zhou, et al "Ferroelectric and electrical behavior of (Na0.5Bi0.5)TiO3 thin films" Appl. Phys. Lett, vol. 85, No. 5 (2004), pp. 804-806.

F. Remondiere, et al "Piezoforce microscopy study of lead-free perovskite Na0.5Bi0.5TiO3 thin films" Appl. Phys. Lett., 90 152905 (2007).

* cited by examiner

LIQUID-EJECTING HEAD AND LIQUID-EJECTING APPARATUS

CROSS-REFERENCE TO RELATED APPLICATIONS

This application is a continuation application of U.S. patent application Ser. No. 13/040,627, filed Mar. 4, 2011, which patent application is incorporated herein by reference in its entirety. U.S. patent application Ser. No. 13/040,627 claims the benefit of priority to Japanese Patent Application No. 2010-051187 filed Mar. 8, 2010, the contents of which are hereby incorporated by reference in its entirety.

BACKGROUND

1. Technical Field

The present invention relates to a liquid-ejecting head which changes the pressure in a pressure-generating chamber communicating with a nozzle opening and which includes a piezoelectric layer and electrodes for applying a voltage to the piezoelectric layer and also relates to a liquid-ejecting apparatus.

2. Related Art

Piezoelectric elements each include two electrodes and a piezoelectric layer which is made of a piezoelectric material, such as a crystallized piezoelectric material, having an electromechanical transducing function and which is sandwiched between the electrodes. The piezoelectric elements are used as, for example, flexural vibration-mode actuators and are mounted in liquid-ejecting apparatuses. Typical example of the liquid-ejecting apparatuses are ink jet recording heads which include diagrams forming portions of pressure-generating chambers communicating with nozzle openings for ejecting ink droplets and which eject ink droplets in such a manner that the diagrams are deformed with piezoelectric elements such that ink in the pressure-generating chambers is pressurized.

A piezoelectric material for use in piezoelectric layers (piezoelectric ceramics) making up the piezoelectric elements need to have high piezoelectric properties. A typical example of the piezoelectric material is lead zirconate titanate (PZT) (see JP-A-2001-223404). The piezoelectric layers are formed in such a manner that, for example, a colloid solution prepared by dissolving an organometallic compound in a solvent is applied to a target, is heated, and is then crystallized into the piezoelectric layers, which are filmy. Known examples of processes for forming the piezoelectric layers include chemical solution processes such as sol-gel processes and metal-organic deposition (MOD) processes.

A ferroelectric such as lead zirconate titanate has domains having polarization axes in random directions when being in an unpolarized state. Therefore, an unpolarized piezoelectric layer made of the ferroelectric does not expand or contract. In order to use the ferroelectric as a piezoelectric, the ferroelectric needs to be polarized in such a manner that an electric field is applied to the ferroelectric in a single direction such that the polarization axes are aligned with each other. For the above filmy piezoelectric layers, a voltage not greater than a voltage $V_c$, referred to as a midpoint potential, sufficient to create a coercive electric field $E_c$ is continuously applied to each filmy piezoelectric layer such that polarization axes are aligned in a predetermined direction, a diagram is deformed by applying a pulse to the diagram on the basis of the midpoint potential, and the pressure in a pressure chamber is thereby changed, whereby ink is ejected. In order to drive a piezoelectric element including a filmy piezoelectric layer made of lead zirconate titanate, a midpoint potential not less than the coercive electric field $E_c$ needs to be applied to the piezoelectric element. Therefore, the piezoelectric element has a problem that the piezoelectric element is unlikely to be driven at low voltage. In awareness of environment issues, piezoelectric materials with a reduced lead content are being demanded.

SUMMARY

An advantage of some aspects of the invention is to provide a liquid-ejecting head which needs no midpoint potential, which can be driven at low voltage, and which has a less negative impact on the environment. Another advantage of some aspects of the invention is to provide a liquid-ejecting apparatus.

An aspect of the invention solves the above problems and provides a liquid-ejecting head which includes a pressure-generating chamber communicating with a nozzle opening and also includes a piezoelectric element including a piezoelectric layer and electrodes disposed on the piezoelectric layer. The piezoelectric layer contains perovskite-structured bismuth sodium potassium titanate and satisfies the inequality $0 \leq P_r/P_m \leq 0.25$ at 25° C., where $P_m$ and $P_r$ are the saturation polarization and remanent polarization, respectively, of the piezoelectric layer.

In this aspect, the piezoelectric layer contains perovskite-structured bismuth sodium potassium titanate and satisfies the inequality $0 \leq P_r/P_m \leq 0.25$ at 25° C., where $P_m$ and $P_r$ are the saturation polarization and remanent polarization, respectively, of the piezoelectric layer. Therefore, the piezoelectric layer can be driven at low voltage because a piezoelectric material need not be polarized and no midpoint potential is needed to drive the piezoelectric layer. Furthermore, the content of lead can be reduced and therefore negative impacts on the environment can be reduced.

The piezoelectric layer preferably further contains perovskite-structured barium titanate. This allows the piezoelectric element, which is included in the liquid-ejecting head, to have high piezoelectric properties (strain).

The piezoelectric layer is preferably one prepared in such a manner that a piezoelectric precursor film is formed on a substrate, is calcined, and is then crystallized. This allows no midpoint potential to be needed to drive the liquid-ejecting head, which includes the piezoelectric element, because the tensile stress generated by heating the piezoelectric precursor film is present in the piezoelectric layer.

The piezoelectric layer may be a thin film with a thickness of 2 µm or less. This allows no midpoint potential to be needed to drive the liquid-ejecting head, which includes the piezoelectric element, because the piezoelectric layer is such a thin film.

Another aspect of the invention provides a liquid-ejecting apparatus including the liquid-ejecting head. In this aspect, the liquid-ejecting apparatus needs no midpoint potential, can be driven at low voltage, and has a reduced lead content and a less negative impact on the environment.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
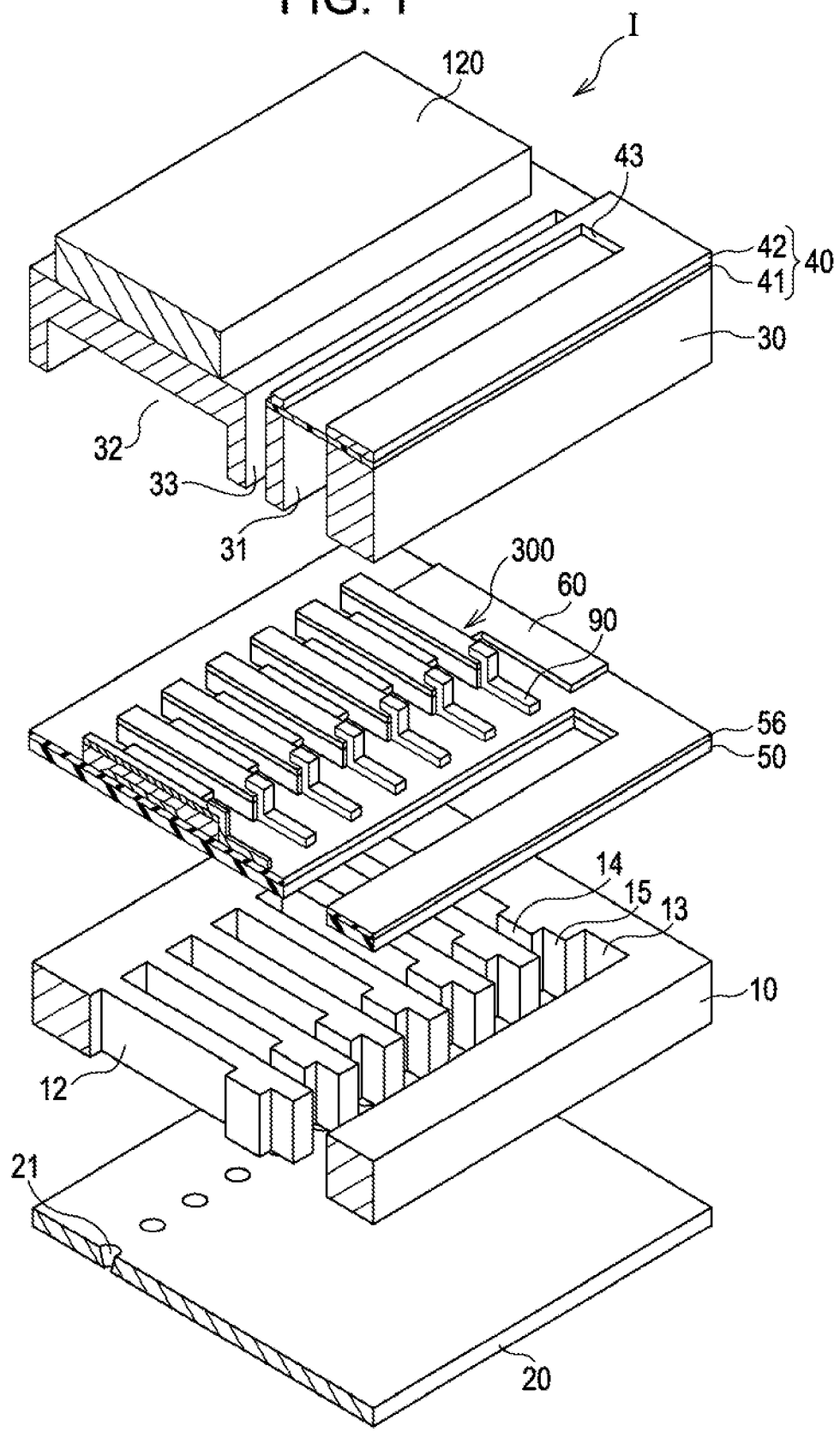
FIG. 1 is an exploded perspective view of an ink jet recording head that is an example of a liquid-ejecting head according to a first embodiment of the invention.
Figure 2A:
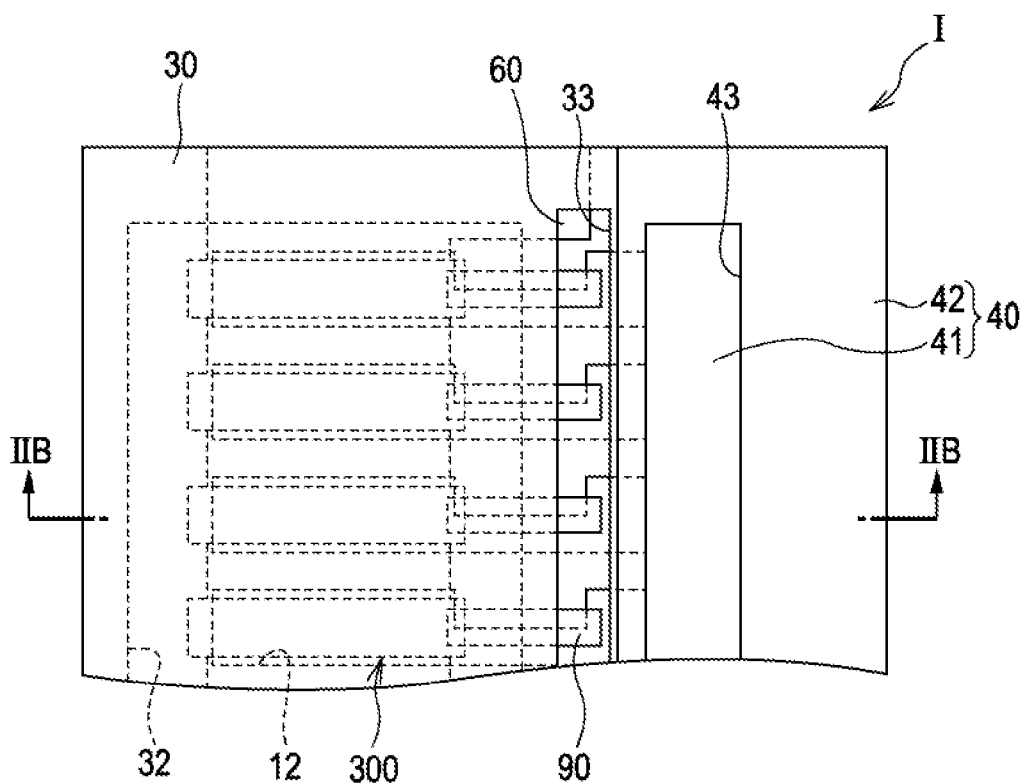
FIG. 2A is a plan view of the ink jet recording head according to the first embodiment.
Figure 2B:
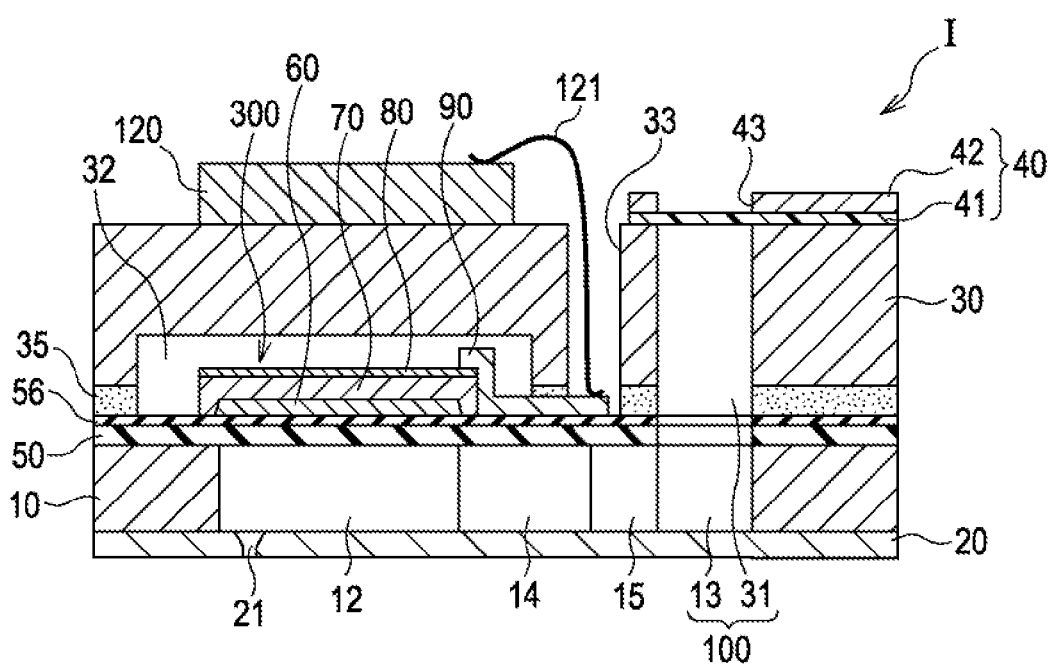
FIG. 2B is a sectional view of the ink jet recording head taken along the line IIB-IIB of FIG. 2A.

FIG. 1 is an exploded perspective view of an ink jet recording head that is an example of a liquid-ejecting head according to a first embodiment of the invention. FIG. 2A is a plan view of the ink jet recording head. FIG. 2B is a sectional view taken along the line IIB-IIB of FIG. 2A. The ink jet recording head includes a channeled substrate 10 made from a single-crystalline silicon wafer and an elastic film 50 which is made of silicon dioxide and which is disposed on a surface of the channeled substrate 10.

The channeled substrate 10 includes a plurality of pressure-generating chambers 12 arranged in the width direction thereof. A communicating portion 13 is disposed in a region of the channeled substrate 10 that is outwardly spaced from the pressure-generating chambers 12 in the longitudinal direction thereof. The communicating portion 13 is communicatively connected to the pressure-generating chambers 12 through ink supply channels 14 and communicating channels 15 each connected to a corresponding one of the pressure-generating chambers 12. The communicating portion 13 communicates with a reservoir portion 31 described below and is a portion of a reservoir 100 serving as an ink chamber common to the pressure-generating chambers 12. The ink supply channels 14 are smaller in width than the pressure-generating chambers 12 and maintain the flow resistance of ink flowing from the communicating portion 13 into the pressure-generating chambers 12 constant. In this embodiment, the ink supply channels 14 are unilaterally narrow in the width direction thereof. The ink supply channels 14 may be bilaterally narrow in the width direction thereof or may be narrow in the depth direction thereof. The channeled substrate 10 has a liquid passage including the pressure-generating chambers 12, the communicating portion 13, the ink supply channels 14, and the communicating channels 15.

A nozzle plate 20 is fixed on an open end surface of the channeled substrate 10 with an adhesive or a thermo-weldable film. The nozzle plate 20 has nozzle openings 21 communicating with end portions of the pressure-generating chambers 12 that are located opposite the ink supply channels 14. The nozzle plate 20 is made of, for example, glass-ceramic, single-crystalline silicon, stainless steel, or the like.

The elastic film 50 is located opposite the open end surface of the channeled substrate 10. The elastic film 50 is overlaid with an adhesive layer 56, made of titanium oxide or the like, for increasing the adhesion between the elastic film 50 and a base of a first electrode 60. An insulating layer made of zirconium oxide or the like may be disposed between the elastic film 50 and the first electrode 60 as required.

The adhesive layer 56 is overlaid with piezoelectric elements 300 formed by depositing the first electrode 60, piezoelectric layers 70 prepared by a chemical solution process as described below in detail, and second electrodes 80 on the adhesive layer 56 in that order. The piezoelectric layers 70 are filmy and preferably have a thickness of 2 μm or less and more preferably 1 μm to 0.3 μm. The piezoelectric elements 300 herein refer to regions each containing a portion of the first electrode 60, a corresponding one of the piezoelectric layers 70, and a corresponding one of the second electrodes 80. In usual, the piezoelectric elements 300 include a common electrode and other electrodes and the piezoelectric layers 70 are formed by patterning so as to correspond to the pressure-generating chambers 12. In this embodiment, the first electrode 60 is used as a common electrode for the piezoelectric elements 300 and the second electrodes 80 are used as individual electrodes for the piezoelectric elements 300. The first and second electrodes 60 and 80 may be reversely used depending on driving circuits or wiring. Combinations of the piezoelectric elements 300 and vibrating diaphragms deformed by driving the piezoelectric elements 300 are herein referred to as actuators. In this embodiment, the elastic film 50, the adhesive layer 56, the first electrode 60, and the insulating layer used as required act as diagrams. The invention is not limited to such a configuration. For example, the elastic film 50 or the adhesive layer 56 need not be formed. The piezoelectric elements 300 may act substantially as diagrams.

In this embodiment, the piezoelectric layers 70 contain perovskite-structured bismuth sodium potassium titanate and may further contain a barium titanate-containing piezoelectric material, that is, a complex oxide, as required. The complex oxide contains titanium (Ti), bismuth (Bi), sodium (Na), and potassium (K) or contains Ti, Bi, Na, K, and Ba and has a perovskite structure. The A-site of the perovskite structure, that is, the $ABO_3$ structure, is coordinated with 12 oxygen atoms and the B-site thereof is coordinated with eight oxygen atoms, whereby an octahedron is formed. A Bi, Na, or K atom is located at the A-site and a Ti atom is located at the B-site.

When the piezoelectric layers 70 contain perovskite-structured bismuth sodium potassium titanate, the piezoelectric layers 70 preferably have a composition represented by the following formula:

$$\{x[(Bi_a,Na_{1-a})TiO_3]-(1-x)[(Bi_b,K_{1-b})TiO_3]\} \quad (1)$$

wherein $0.4<a<0.6$, $0.4<b\leq0.6$, and $0.5\leq x\leq0.85$.
In Formula (1), it is more preferred that $0.6\leq x\leq0.8$.

When the piezoelectric layers 70 contain perovskite-structured bismuth sodium potassium titanate containing barium titanium, the piezoelectric layers 70 preferably have a composition represented by the following formula:

$$\{x[(Bi_a,Na_{1-a})TiO_3]-(1-x)[(Bi_b,K_{1-b})TiO_3]\}-y[BaTiO_3] \quad (2)$$

wherein $0.4<a<0.6$, $0.4<b\leq0.6$, $0.5\leq x\leq0.9$, and $0<y\leq0.2$. In Formula (2), it is more preferred that $0.6\leq x\leq0.8$ and $0<y\leq0.1$.

The molar ratio of [(Bi$_a$, Na$_{1-a}$)TiO$_3$] to [(Bi$_b$, K$_{1-b}$)TiO$_3$] is x:(1-x). The molar ratio of the sum of [(Bi$_a$, Na$_{1-a}$)TiO$_3$] and [(Bi$_b$, K$_{1-b}$)TiO$_3$] to [BaTiO$_3$] is 1:y.

In this embodiment, the piezoelectric layers 70 preferably satisfy the inequality 0≤P$_r$/P$_m$≤0.25, more preferably 0≤P$_r$/P$_m$≤0.20, and further more preferably 0≤P$_r$/P$_m$≤0.15 at 25° C., wherein P$_m$ and P$_r$ are the saturation polarization and remanent polarization, respectively, of each piezoelectric layer 70.

When the piezoelectric layers 70 are made of the piezoelectric material containing perovskite-structured bismuth sodium potassium titanate and satisfy the inequality 0≤P$_r$/P$_m$≤0.25 at 25° C., wherein P$_m$ and P$_r$ are the saturation polarization and remanent polarization, respectively, of each piezoelectric layer 70, the piezoelectric material need not be polarized and the piezoelectric layers 70 need no midpoint potential, can be driven at low voltage, and have little lead content. The term "saturation polarization P$_m$" herein refers to the polarization of each piezoelectric layer 70 supplied with a sufficiently high voltage V$_m$ of about 200 kV/cm to 1,000 kV/cm. The term "remanent polarization P$_r$" herein refers to the polarization of the piezoelectric layer 70 supplied with a voltage of 0 V. The polarization of the piezoelectric layer 70 supplied with a voltage of 30 V, which satisfies the above electric field range, is herein represented by P$_m$.

Figure 3:
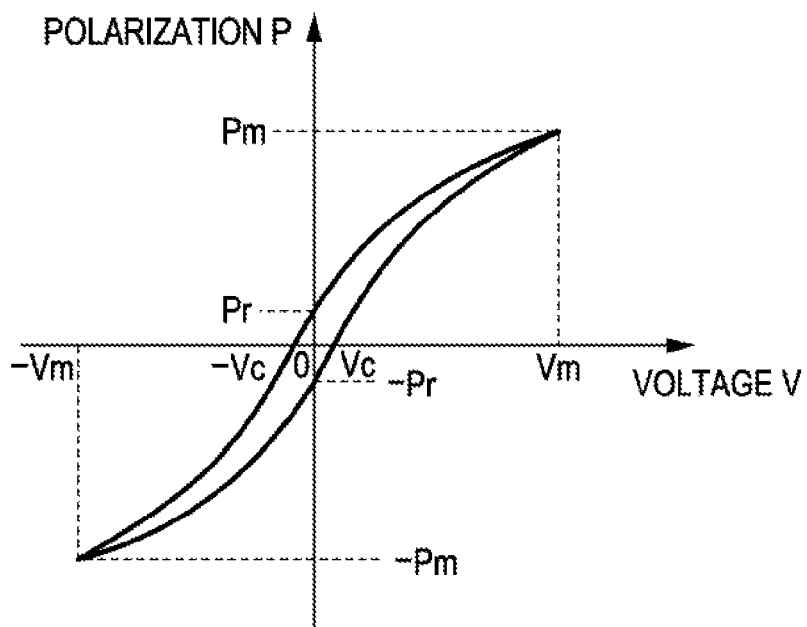
FIG. 3 is a graph showing a P-V hysteresis curve of a piezoelectric layer used in the first embodiment.
Figure 4:
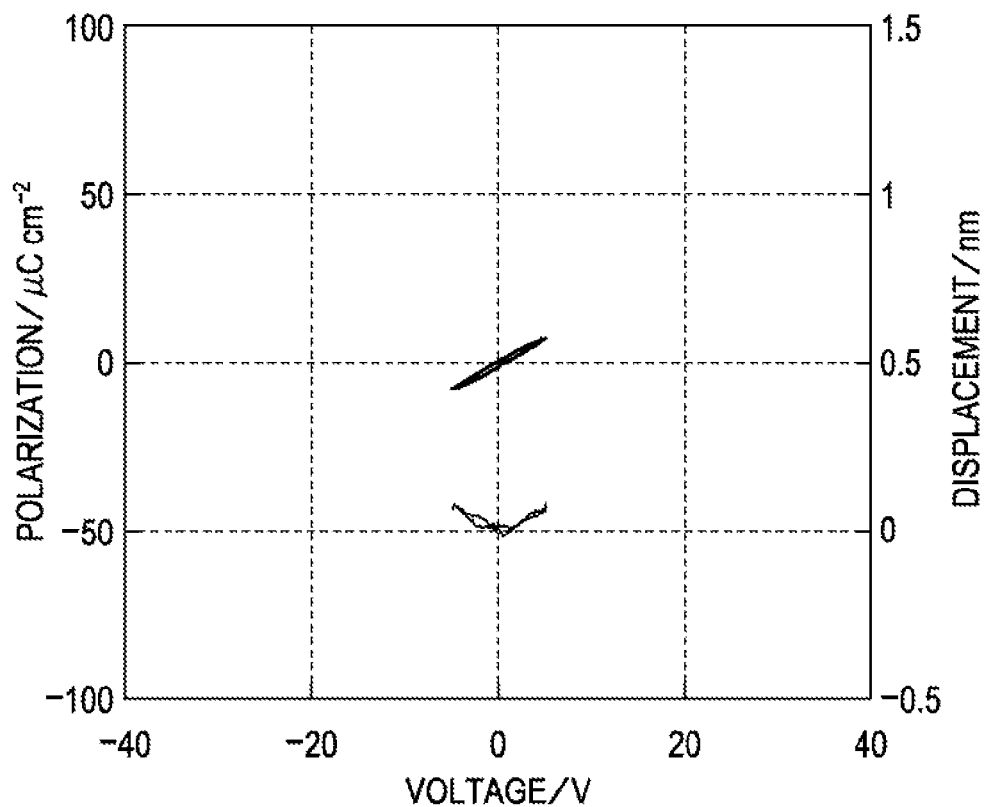
FIG. 4 is a graph showing a P-V curve and S-V curve obtained by applying a voltage of 5 V to the piezoelectric layer used in the first embodiment.
Figure 5:
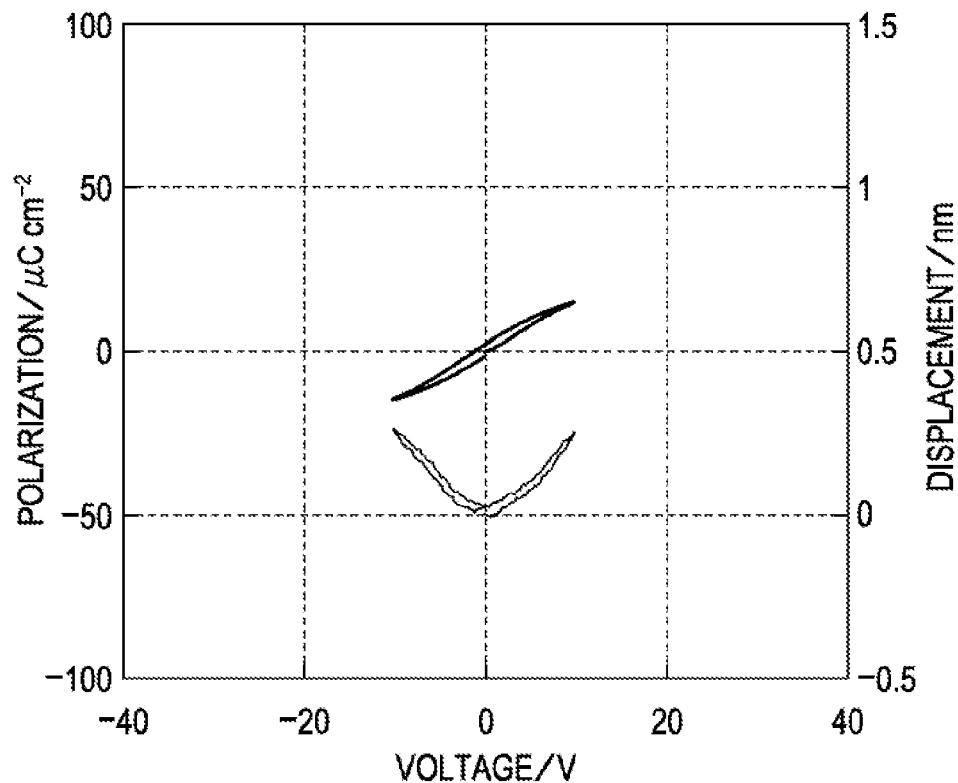
FIG. 5 is a graph showing a P-V curve and S-V curve obtained by applying a voltage of 10 V to the piezoelectric layer used in the first embodiment.
Figure 6:
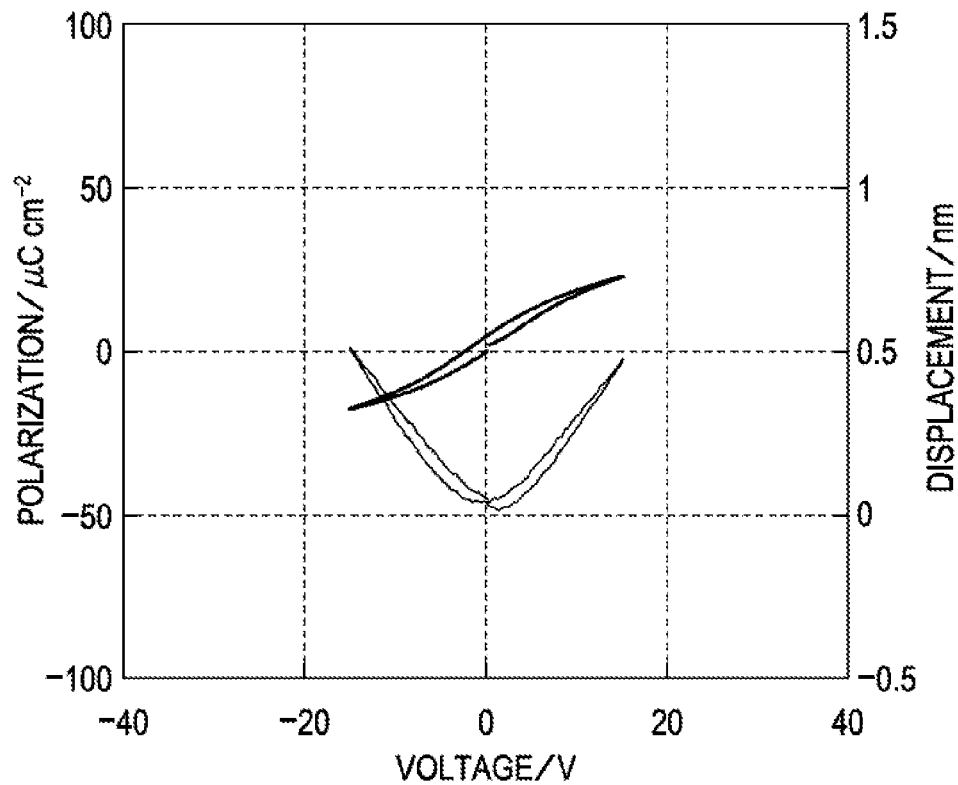
FIG. 6 is a graph showing a P-V curve and S-V curve obtained by applying a voltage of 15 V to the piezoelectric layer used in the first embodiment.
Figure 7:
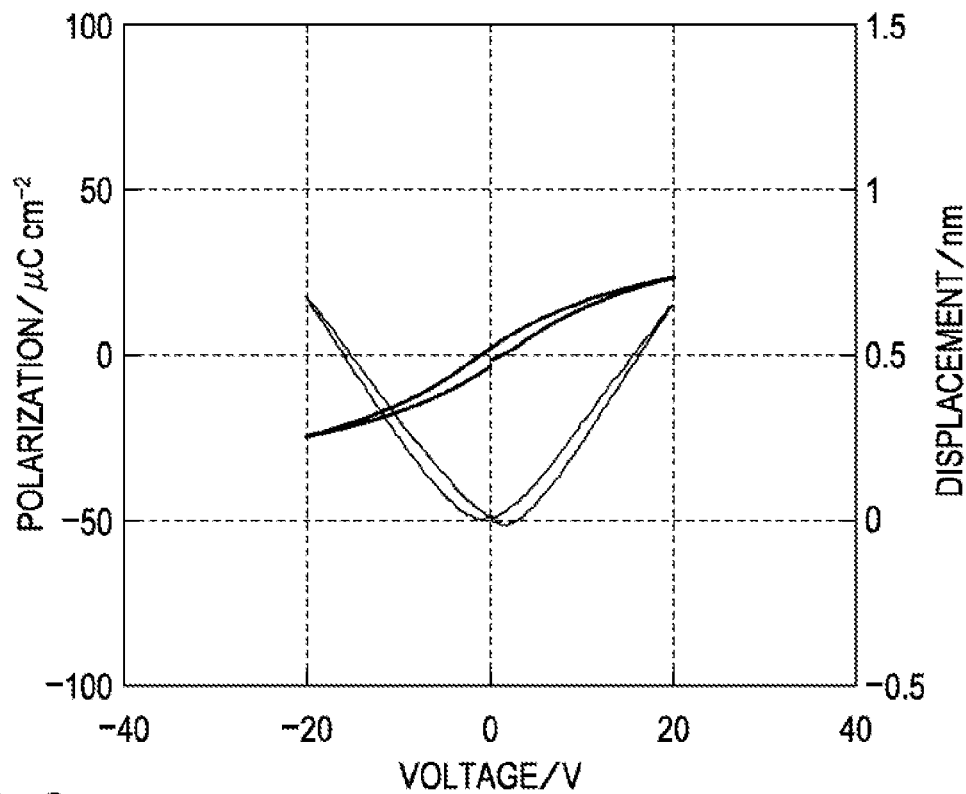
FIG. 7 is a graph showing a P-V curve and S-V curve obtained by applying a voltage of 20 V to the piezoelectric layer used in the first embodiment.
Figure 8:
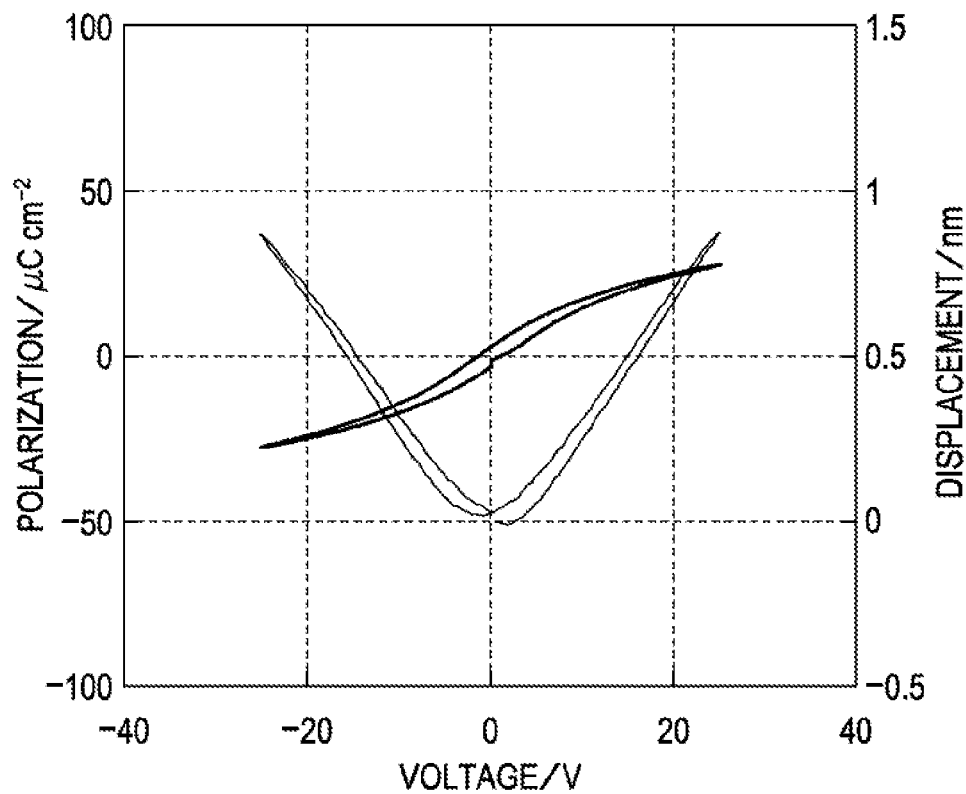
FIG. 8 is a graph showing a P-V curve and S-V curve obtained by applying a voltage of 25 V to the piezoelectric layer used in the first embodiment.
Figure 9:
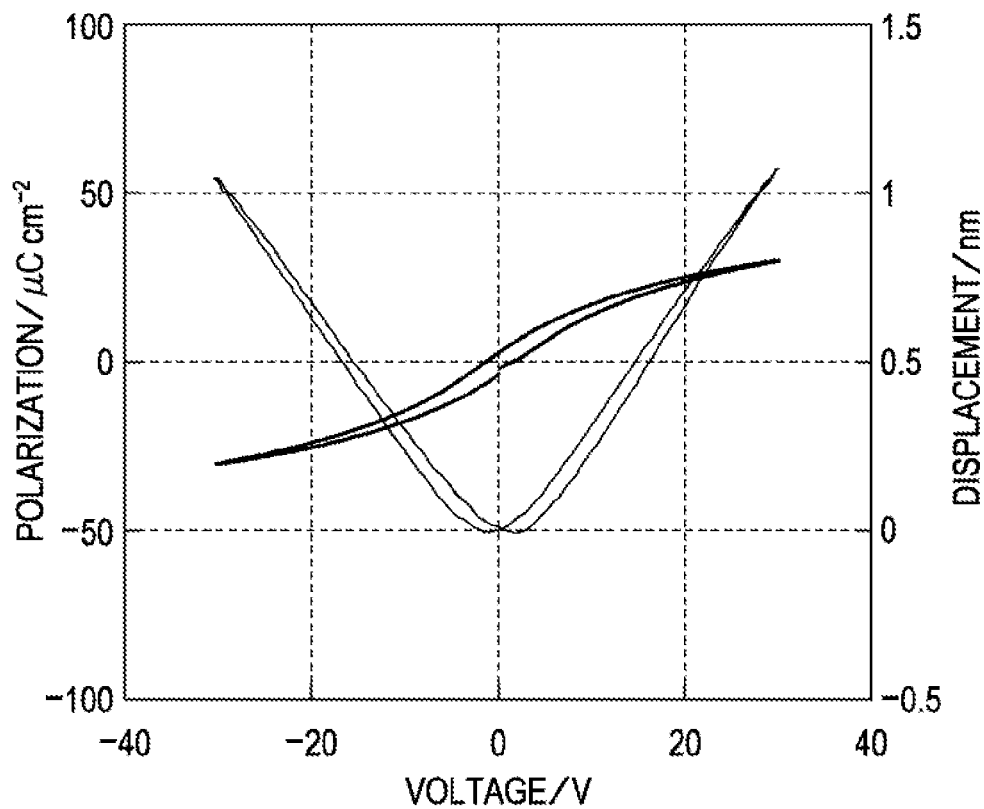
FIG. 9 is a graph showing a P-V curve and S-V curve obtained by applying a voltage of 30 V to the piezoelectric layer used in the first embodiment.

In particular, a P-V curve shown in FIG. 3 is obtained by applying a voltage to the piezoelectric layer 70, which is included in the ink jet recording head according to this embodiment. In this embodiment, P$_r$ of the piezoelectric layer 70 is less than P$_m$ thereof as shown in FIG. 3 and is, for example, 6 μC/cm$^2$ or less. The voltage V$_c$ to create a coercive electric field E$_c$ is small. In this embodiment, the piezoelectric layer 70 contains bismuth sodium potassium titanate and satisfies the inequality 0≤P$_r$/P$_m$≤0.25 at 25° C. and P$_r$ in the P-V curve is very small; hence, the piezoelectric material need not be polarized and the piezoelectric layer 70 needs no midpoint potential and can be driven at low voltage.

The fact that the voltage V$_c$ to create the coercive electric field E$_c$ in the P-V curve shown in FIG. 3 is low indicates that the piezoelectric layer 70 needs no midpoint potential and can be driven at low voltage. The piezoelectric layer 70, which is made of the piezoelectric material containing bismuth sodium potassium titanate and barium titanium, is exemplified below in detail. P-V curves and S-V curves shown in FIGS. 4 to 9 are each obtained in such a manner that a voltage of 5 V (FIG. 4), 10 V (FIG. 5), 15 V (FIG. 6), 20 V (FIG. 7), 25 V (FIG. 8), or 30 V (FIG. 9) is applied to the ink jet recording head, which includes the piezoelectric layer 70 made of the piezoelectric material containing bismuth sodium potassium titanate and barium titanium, according to this embodiment and the relationship between the polarization of the piezoelectric layer 70 and the voltage applied to the ink jet recording head and the relationship between the displacement of the piezoelectric layer 70 and the voltage applied to the ink jet recording head are determined. In each of FIGS. 4 to 9, a thick line represents the polarization and a thin line represents the displacement. The polarization and the displacement can be measured under the same conditions as those used in examples below. In this embodiment, displacement occurs even at 5 V as shown in FIGS. 4 to 9 and therefore the ink jet recording head can be driven at low voltage. That is, a midpoint potential needed to drive an ink-ejecting head including conventional filmy piezoelectric layers made of a ferroelectric is not necessary for the ink jet recording head. In this embodiment, the ink jet recording head can be driven by applying a midpoint potential thereto. Since the ink jet recording head needs no midpoint potential, the midpoint potential applied thereto is not particularly limited and any driving waveform can be set. Furthermore, polarization necessary for bulk described below is not necessary during manufacture.

Figure 10:
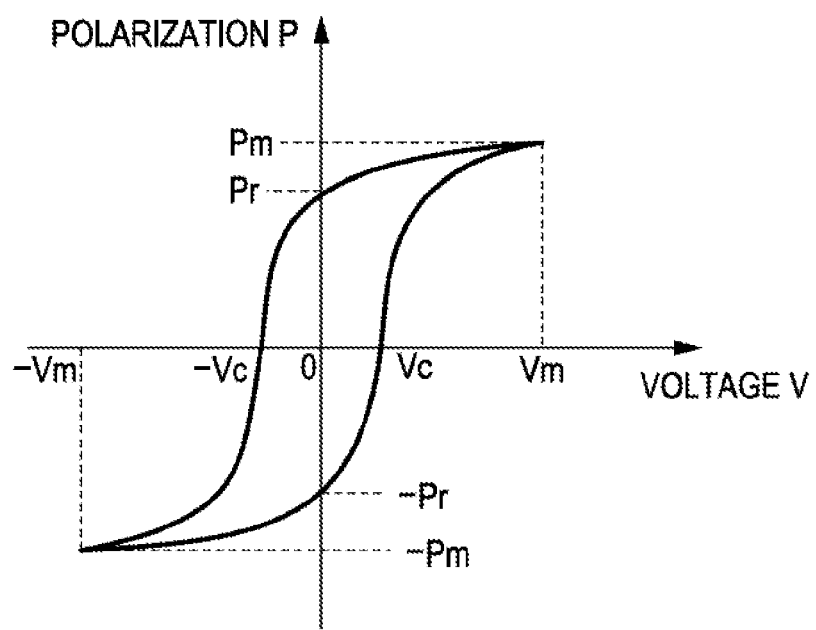
FIG. 10 is a graph showing a P-V hysteresis curve of a piezoelectric layer made of a conventional ferroelectric.
Figure 11:
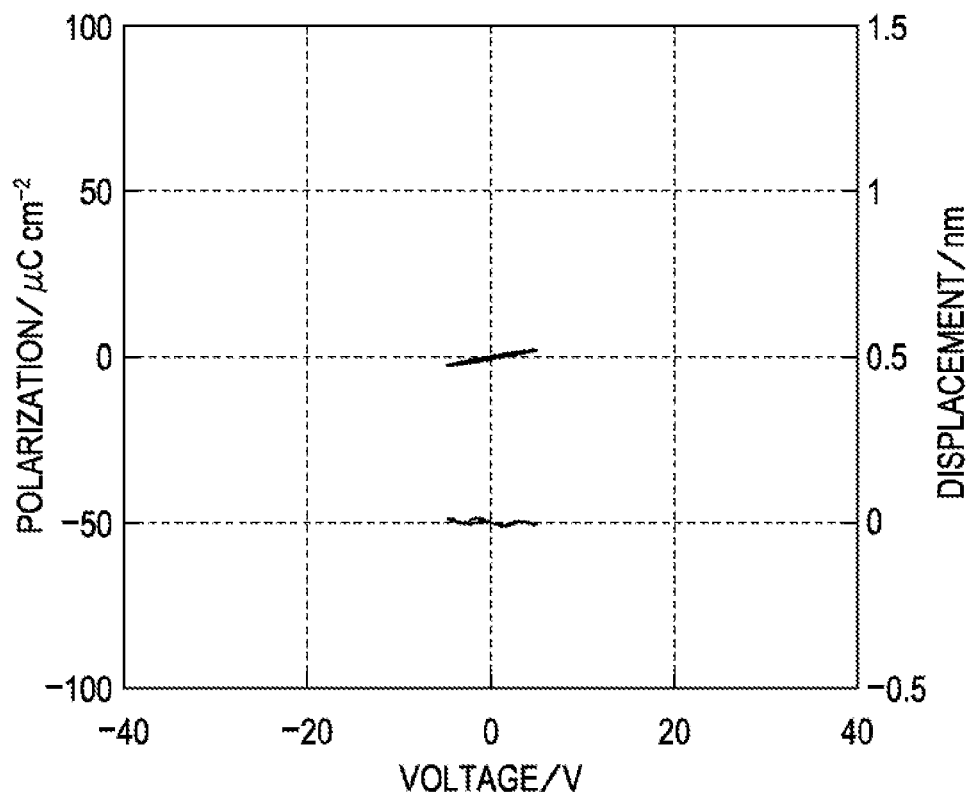
FIG. 11 is a graph showing a P-V curve and S-V curve obtained by applying a voltage of 5 V to the piezoelectric layer made of the conventional ferroelectric.
Figure 12:
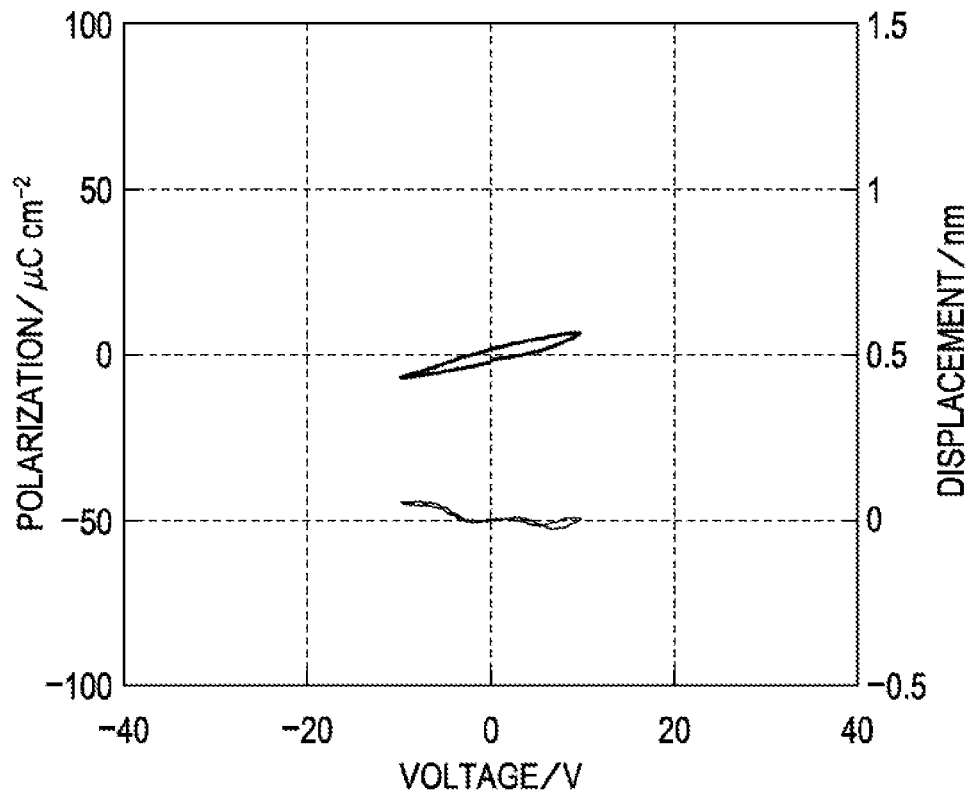
FIG. 12 is a graph showing a P-V curve and S-V curve obtained by applying a voltage of 10 V to the piezoelectric layer made of the conventional ferroelectric.
Figure 13:
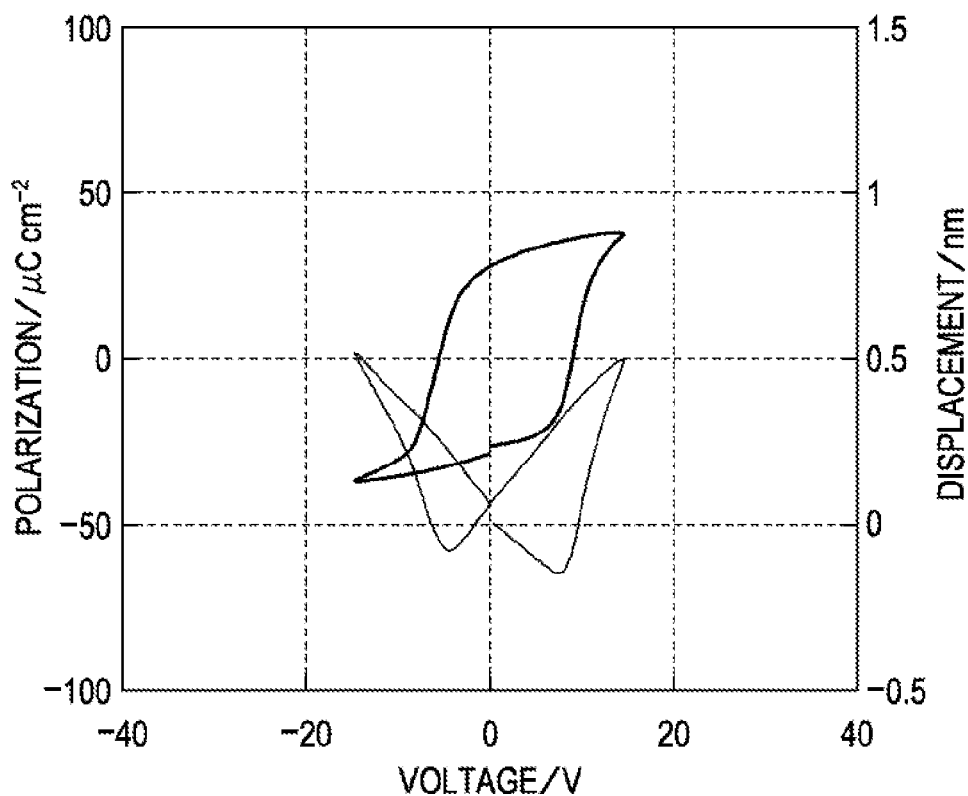
FIG. 13 is a graph showing a P-V curve and S-V curve obtained by applying a voltage of 15 V to the piezoelectric layer made of the conventional ferroelectric.
Figure 14:
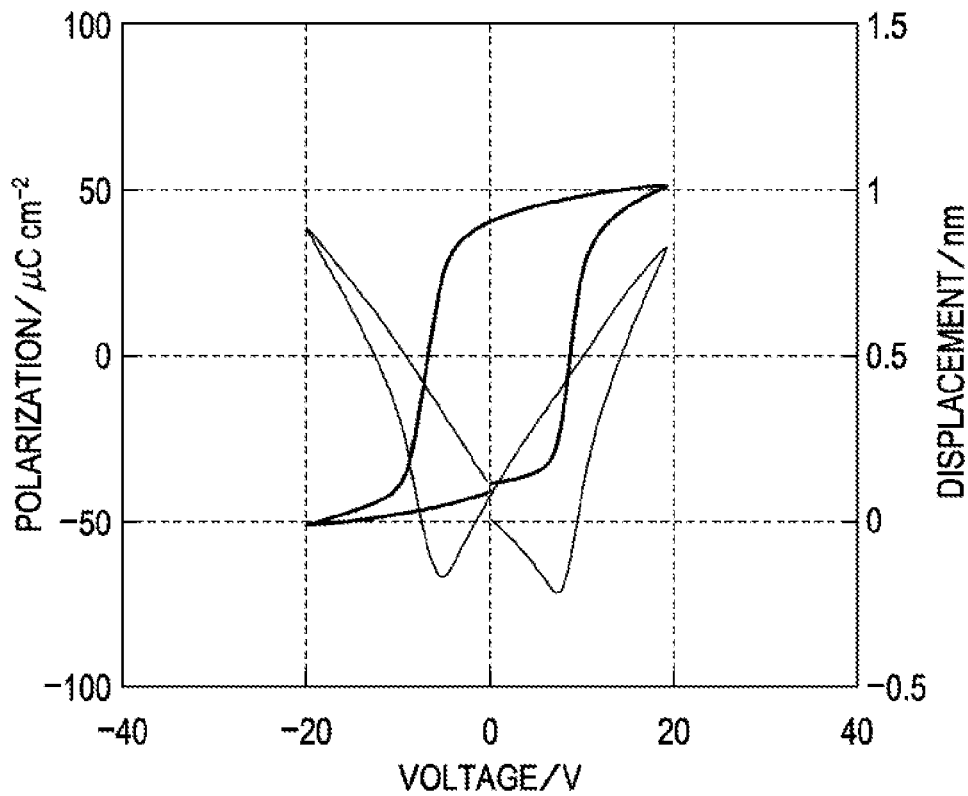
FIG. 14 is a graph showing a P-V curve and S-V curve obtained by applying a voltage of 20 V to the piezoelectric layer made of the conventional ferroelectric.
Figure 15:
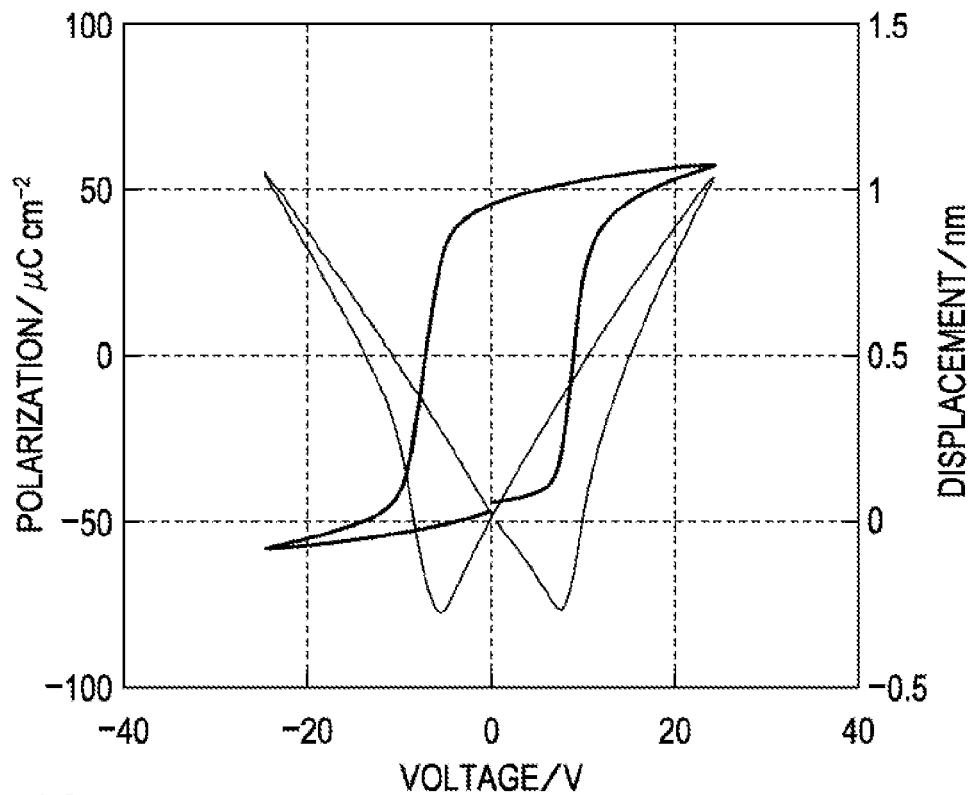
FIG. 15 is a graph showing a P-V curve and S-V curve obtained by applying a voltage of 25 V to the piezoelectric layer made of the conventional ferroelectric.
Figure 16:
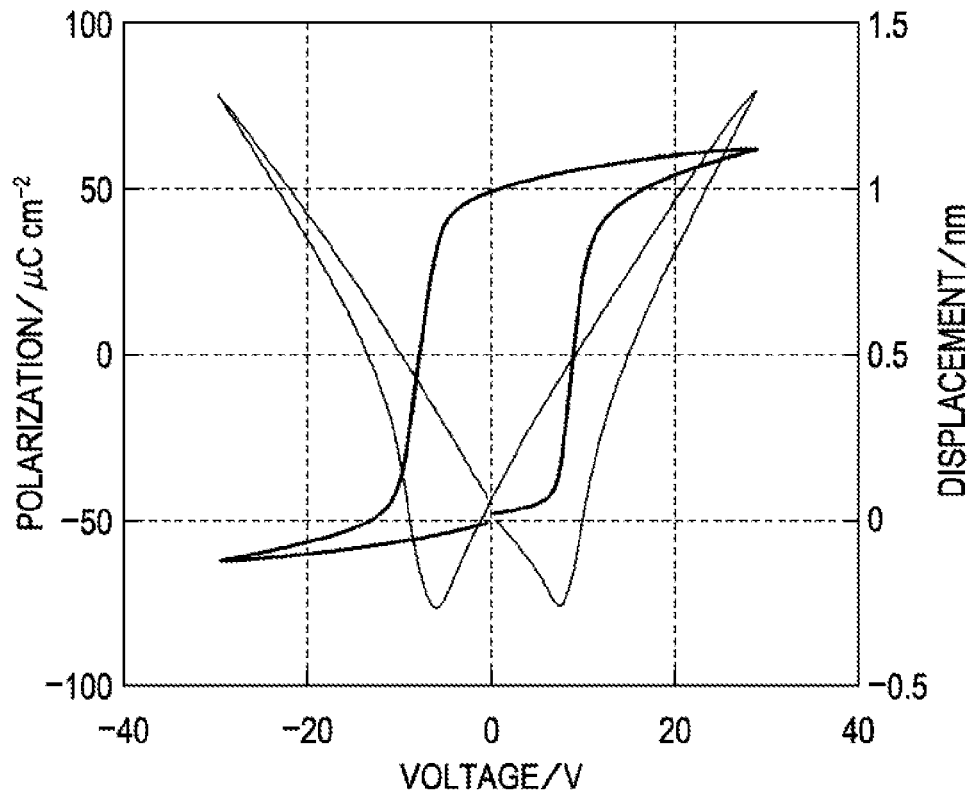
FIG. 16 is a graph showing a P-V curve and S-V curve obtained by applying a voltage of 30 V to the piezoelectric layer made of the conventional ferroelectric.

A P-V curve shown in FIG. 10 is obtained in such a manner that a voltage is applied to a piezoelectric layer made of a filmy piezoelectric material containing a conventional ferroelectric such as lead zirconate titanate (PZT) or BiFeO$_3$ in the same way as that shown in FIG. 3. As is clear from the hysteresis shown in FIG. 10, P$_r$ of the piezoelectric layer containing the conventional ferroelectric is greater than P$_r$ obtained in this embodiment. In addition, the P$_r$/P$_m$ ratio of the piezoelectric layer containing the conventional ferroelectric is greater than the P$_r$/P$_m$ ratio obtained in this embodiment. The piezoelectric layer containing the conventional ferroelectric needs high voltage V$_c$ to create a coercive electric field E$_c$. In order to drive an ink jet recording head including the piezoelectric layer containing the conventional ferroelectric, a voltage not less than the coercive electric field E$_c$, that is, a midpoint potential needs to be applied to the ink jet recording head.

This is due to a problem that the conventional ferroelectric needs to be polarized. Since a ferroelectric such as lead zirconate titanate has domains having polarization axes in random directions when being in an unpolarized state, an unpolarized piezoelectric layer made of the ferroelectric does not expand or contract; hence, the piezoelectric layer needs to be subjected to polarization (poling) in such a manner that an electric field is applied to the piezoelectric layer in a single direction such that the polarization axes are aligned with each other.

For a filmy piezoelectric layer used in this embodiment, a voltage not greater than a voltage V$_c$, referred to as a midpoint potential, sufficient to create a coercive electric field E$_c$ is continuously applied to the filmy piezoelectric layer such that polarization axes are aligned in a predetermined direction, a diagram is deformed by applying a pulse to the diagram on the basis of the midpoint potential, and the pressure in a pressure chamber is thereby changed, whereby ink is ejected. That is, in order to drive a piezoelectric element including a filmy piezoelectric layer made of a ferroelectric such as lead zirconate titanate, a midpoint potential not less than the coercive electric field E$_c$ needs to be applied to the piezoelectric element. This causes an increase in power consumption and a limitation in driving waveform. In the case of using a so-called bulk ferroelectric to prepare a piezoelectric layer by a solid-phase process, polarization axes can be aligned in a predetermined direction by performing polarization during manufacture. A filmy ferroelectric is different in characteristic from the bulk ferroelectric and polarization during manufacture is insufficient; hence, a midpoint potential is necessary for driving as described above.

The fact that the voltage V$_c$ to create the coercive electric field E$_c$ in the P-V curve shown in FIG. 10 is high indicates that the conventional ferroelectric needs a midpoint potential and cannot be driven at low voltage. A piezoelectric layer made of a typical piezoelectric material principally containing bismuth ferrate (BFO) is exemplified below in detail. P-V curves and S-V curves shown in FIGS. 11 to 16 are each obtained in such a manner that a voltage of 5 V (FIG. 11), 10 V (FIG. 12), 15 V (FIG. 13), 20 V (FIG. 14), 25 V (FIG. 15), or 30 V (FIG. 16) is applied to an ink jet recording head including the piezoelectric layer made of the piezoelectric material principally containing BFO and the relationship between the polarization of the piezoelectric layer and the voltage applied to the ink jet recording head and the relationship between the displacement of the piezoelectric layer and the voltage applied to the ink jet recording head are determined. In each of FIGS. 11 to 16, a thick line represents the polarization and a thin line represents the displacement. The polarization and the displacement can be measured under the same conditions as those used in examples below. As shown in FIGS. 11 to 16, the piezoelectric material principally containing bismuth ferrate is not displaced by applying a voltage of 10 V thereto when being in an unpolarized state.

Figure 17:
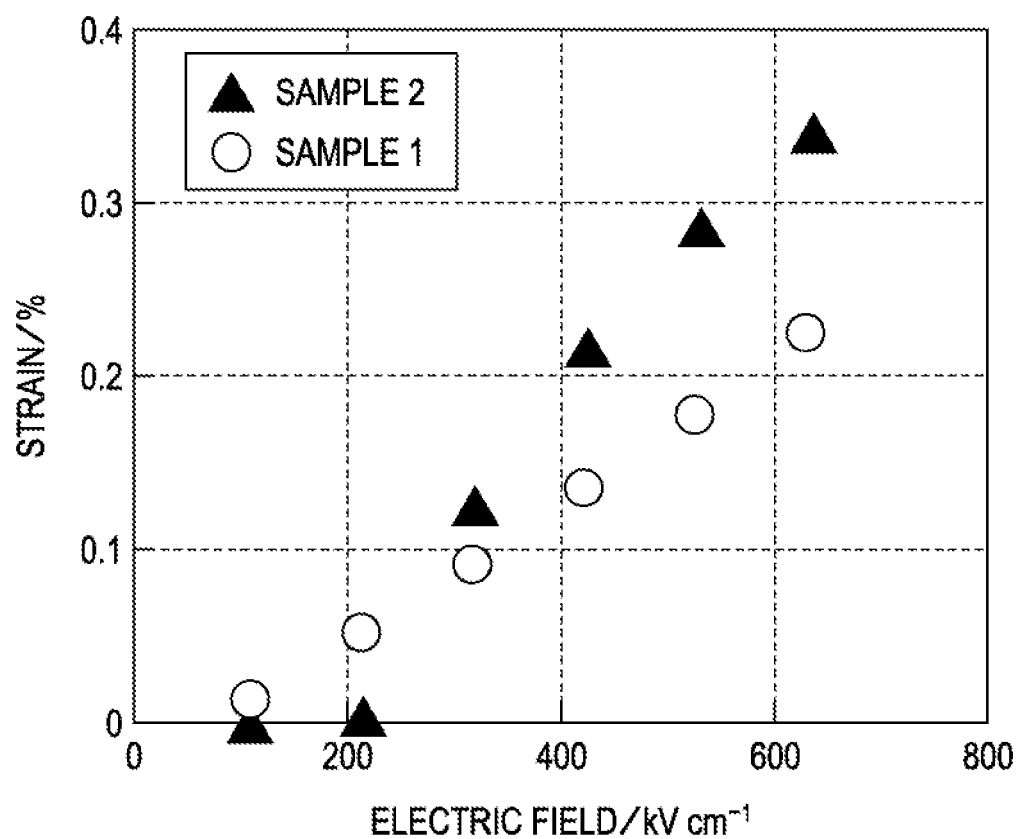
FIG. 17 is a graph showing the relationship between the strain of each of the piezoelectric layer used in the first embodiment and the piezoelectric layer made of the conventional ferroelectric and the electric field applied thereto.

The relationship between the strain and the electric field is determined from FIGS. 4 to 9 (Sample 1) and FIGS. 11 to 16 (Sample 2). The results are shown in FIG. 17. The term "strain" as used herein is defined as a percentage value obtained by dividing the maximum displacement obtained by subtracting the attained minimum displacement from the attained maximum displacement by the thickness. As shown in FIG. 17, Sample 1, which includes the piezoelectric layers 70 used in this embodiment, has a small offset electric field causing no displacement and the displacement of Sample 1 linearly increases with the application of an electric field thereto and Sample 2, which is made of the conventional ferroelectric, is not deformed until being polarized.

When a piezoelectric material containing perovskite-structured bismuth sodium potassium titanate and a piezoelectric material containing perovskite-structured bismuth sodium potassium titanate and barium titanium are bulky, the piezoelectric materials do not satisfy the inequality $0 \leq P_r/P_m \leq 0.25$ and are completely different from the piezoelectric layers 70 used in this embodiment. Bulky piezoelectric materials usually have a large thickness of, for example, 10 μm to 1,000 μm and are prepared in such a manner that powders of metal oxides and/or metal carbonates are physically mixed, pulverized, and then formed into pieces and the pieces are calcined at a temperature of about 1,000° C. to 1,300° C. Therefore, the stress caused by the expansion or contraction of substrates or ceramics during the preparation thereof is not present or very small as compared to those prepared by a chemical solution process. In particular, such a bulky piezoelectric material as described above is larger in $P_r$ and $P_r/P_m$ as compared to this embodiment as indicated by a hysteresis curve, which is a P-V curve of Comparative Example 3, shown in FIG. 47. The hysteresis curve shows a ferroelectric.

The piezoelectric layers 70 used in this embodiment can have a piezoelectric constant $d_{33}$ of 40 pm/V or more.

The second electrodes 80, which are individual electrodes for the piezoelectric elements 300, are connected to lead electrodes 90 which extend from regions near end portions of the ink supply channels 14 to the adhesive layer 56 and which are made of for example, gold (Au) or the like.

A protective substrate 30 including the reservoir portion 31, which is a portion of the reservoir 100, is fixed on the channeled substrate 10 having the piezoelectric elements 300, that is, on the first electrode 60, the adhesive layer 56, and the lead electrodes 90, with an adhesive 35. In this embodiment, the reservoir portion 31 extends through the protective substrate 30 in the thickness direction thereof and also extends in the width direction of the pressure-generating chambers 12. The communicating portion 13 communicates with the reservoir portion 31 of the channeled substrate 10 to form reservoir 100, which serves as an ink chamber common to the pressure-generating chambers 12, as described above. The reservoir portion 31 may be divided into a plurality of subportions corresponding to the pressure-generating chambers 12 such that the reservoir portion 31 alone serves as a reservoir. The ink supply channels 14 may be arranged in members (for example, the elastic film 50, the adhesive layer 56, and/or the like) disposed between the channeled substrate 10 and the protective substrate 30 so as to communicatively connect the reservoir 100 to the pressure-generating chambers 12 in such a state that, for example, only the pressure-generating chambers 12 are arranged in the channeled substrate 10.

The protective substrate 30 has a region facing the piezoelectric elements 300 and includes a piezoelectric element-holding portion 32 which is disposed in this region and which has such a space that does not prevent the motion of the piezoelectric elements 300. In the piezoelectric element-holding portion 32, the space may be sealed or unsealed as long as the space does not prevent the motion of the piezoelectric elements 300.

The protective substrate 30 is preferably made of a material, such as a glass or ceramic material, having substantially the same thermal expansion coefficient as that of the channeled substrate 10. In this embodiment, the protective substrate 30 is made from a single-crystalline silicon wafer which is the same material as that used to form the channeled substrate 10.

The protective substrate 30 has a through-hole 33 extending therethrough in the thickness direction of the protective substrate 30. The lead electrodes 90 each extend from a corresponding one of the piezoelectric elements 300 and have end portions exposed in the through-hole 33.

The protective substrate 30 is overlaid with a driving circuit 120, fixed thereon, for driving the piezoelectric elements 300. Examples of the driving circuit 120 include circuit boards and semiconductor integrated circuits (ICs). The driving circuit 120 is electrically connected to the lead electrodes 90 through connecting lines 121 including conductive wires such as bonding wires.

The protective substrate 30 is also overlaid with a compliance substrate 40, fixed thereon, including a sealing film 41 and a fixed plate 42. The sealing film 41 is made of a flexible material having low stiffness. The sealing film 41 seals a surface of the reservoir portion 31. The fixed plate 42 is made of a relatively hard material. The fixed plate 42 has an opening 43 formed by entirely removing a region of the fixed plate 42 that faces the reservoir 100 in the thickness direction of the fixed plate 42 and therefore a surface of the reservoir 100 is sealed with the sealing film 41, which is flexible.

After the ink jet recording head I according to this embodiment is supplied with ink from an ink supply port connected to an external ink supply unit, which is not shown, and an inner region extending from the reservoir 100 to the nozzle openings 21 is filled with the ink, voltages corresponding to the pressure-generating chambers 12 are applied between the first electrode 60 and the second electrodes 80 in accordance with recording signals transmitted from the driving circuit 120, whereby the elastic film 50, the adhesive layer 56, the first electrode 60, and the piezoelectric layers 70 are deformed. This increases the pressure in the pressure-generating chambers 12, thereby ejecting droplets of the ink from the nozzle openings 21.

An exemplary method for manufacturing the ink jet recording head will now be described with reference to FIGS. 18 to 22. FIGS. 18 to 22 are sectional views taken in the longitudinal direction of the pressure-generating chambers 12.

Figure 18A:
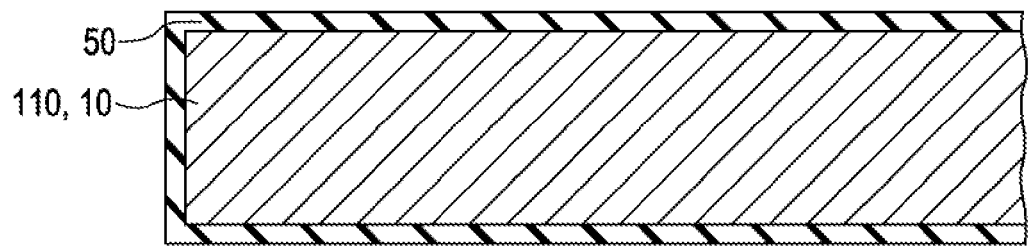
FIGS. 18A and 18B are sectional views illustrating steps of manufacturing the ink jet recording head according to the first embodiment.
Figure 18B:
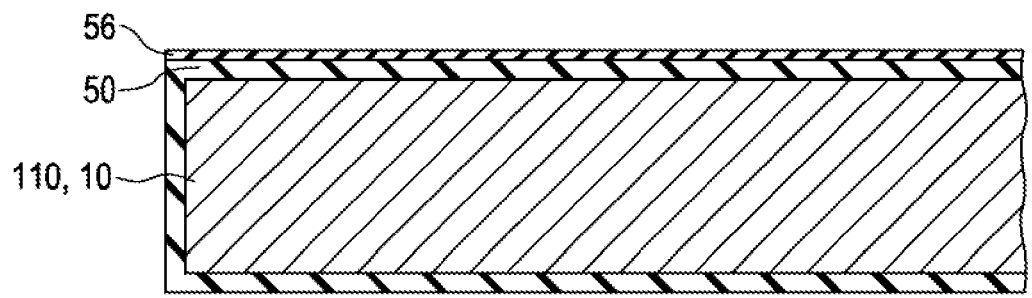

As shown in FIG. 18A, a silicon dioxide film, made of silicon dioxide ($SiO_2$), forming the elastic film 50 is formed on a channeled substrate-forming wafer 110 made of silicon by thermal oxidation or the like. As shown in FIG. 18B, the adhesive layer 56 is formed on the elastic film 50 (the silicon dioxide film) by reactive sputtering, thermal oxidation, or the like using titanium oxide or the like.

Figure 19A:
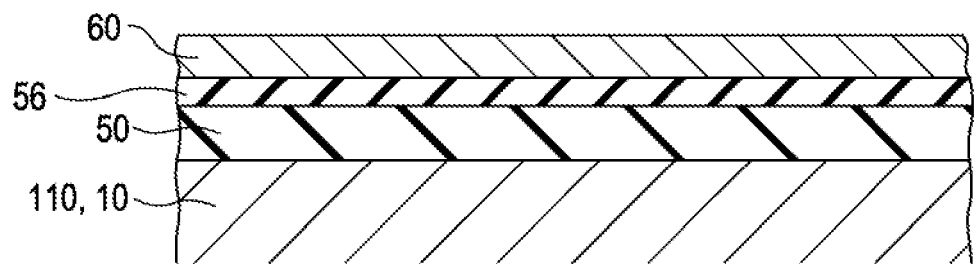
FIGS. 19A to 19C are sectional views illustrating steps of manufacturing the ink jet recording head according to the first embodiment.

As shown in FIG. 19A, platinum, iridium, and/or iridium oxide is deposited on the adhesive layer 56 by sputtering or the like such that the first electrode 60 is formed over the adhesive layer 56. The first electrode 60 is then patterned.

The piezoelectric layers 70 are deposited on the first electrode 60. A process for preparing the piezoelectric layers 70 is not particularly limited. The piezoelectric layers 70 can be formed by, for example, a chemical solution process such as a metal-organic deposition (MOD) process or a sol-gel process in such a manner that a solution prepared by dissolving or dispersing an organometallic compound in a solvent is applied to the first electrode 60, is dried, is heated, and is then crystallized into the piezoelectric layers 70, which are made of a metal oxide.

Figure 19B:
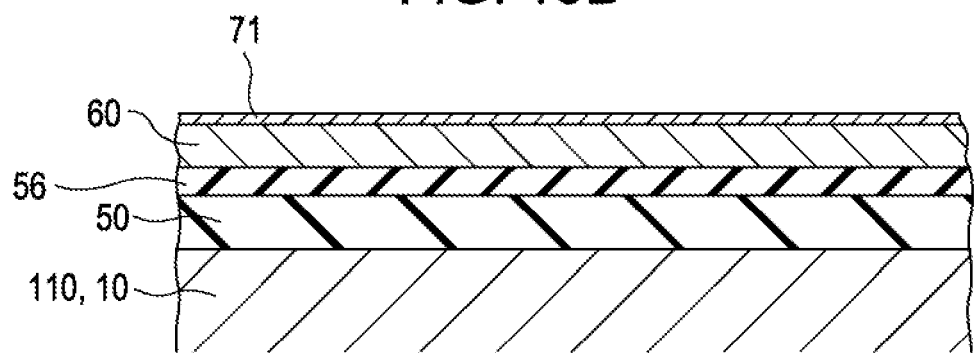

In particular, a procedure for forming the piezoelectric layers 70 is as follows: a sol or MOD solution (precursor solution) containing organometallic compounds, particularly organometallic compounds containing Ti, Bi, Na, and K and further containing Ba as required at a target composition ratio, is applied to the first electrode 60 by a spin coating process or the like, whereby a piezoelectric precursor film 71 is formed as shown in FIG. 19B (a coating step).

The precursor solution applied thereto is one prepared in such a manner that the particularly organometallic compounds containing Ti, Bi, Na, and K and further containing Ba as required are mixed such that the molar ratio of these metals is a desired value and the mixture is dissolved or dispersed in an organic solvent such as alcohol. Examples of the organometallic compounds containing Ti, Bi, Na, and K and further containing Ba as required include metal alkoxides, salts of organic acids, and β-diketone complexes. Examples of an organometallic compound containing Ti include titanium isopropoxide, titanium 2-ethylhexanoate, and titanium (di-i-propoxide) bis(acetylacetonate). Examples of an organometallic compound containing Bi include bismuth 2-ethylhexanoate and bismuth acetate. Examples of an organometallic compound containing Na include sodium 2-ethylhexanoate, sodium acetate, and sodium acetylacetonate. Examples of an organometallic compound containing K include potassium 2-ethylhexanoate, potassium acetate, and potassium acetylacetonate. Examples of an organometallic compound containing Ba include barium isopropoxide, barium acetate, and barium acetylacetonate.

The piezoelectric precursor film 71 is heated at a predetermined temperature for a predetermined time, whereby the piezoelectric precursor film 71 is dried (a drying step). The dried piezoelectric precursor film 71 is heated to a predetermined temperature and is then held a predetermined time, whereby the piezoelectric precursor film 71 is degreased (a degreasing step). The term "degreasing" as used herein means that an organic component contained in the piezoelectric precursor film 71 is removed in the form of $NO_2$, $CO_2$, $H_2O$, or the like. An atmosphere used in the drying or degreasing step is not particularly limited and may be an air or inert gas atmosphere.

Figure 19C:
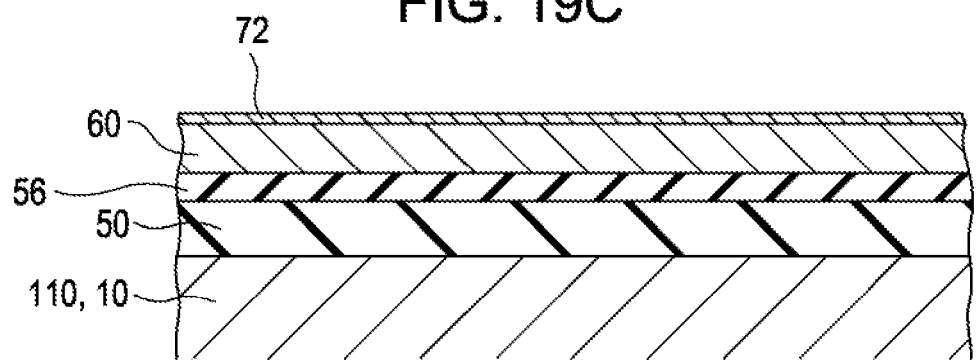

As shown in FIG. 19C, the piezoelectric precursor film 71 is crystallized in such a manner that the piezoelectric precursor film 71 is heated at a predetermined temperature of, for example, about 600° C. to 800° C. and is then held for a predetermined time, whereby a piezoelectric film 72 is formed (a calcining step). An atmosphere used in the calcining step is not particularly limited and may be an air or inert gas atmosphere.

Examples of a heating unit useful in the drying step, the degreasing step, and the calcining step include hotplates and rapid thermal annealing (RTA) systems including infrared lamps for heating.

Figure 20A:
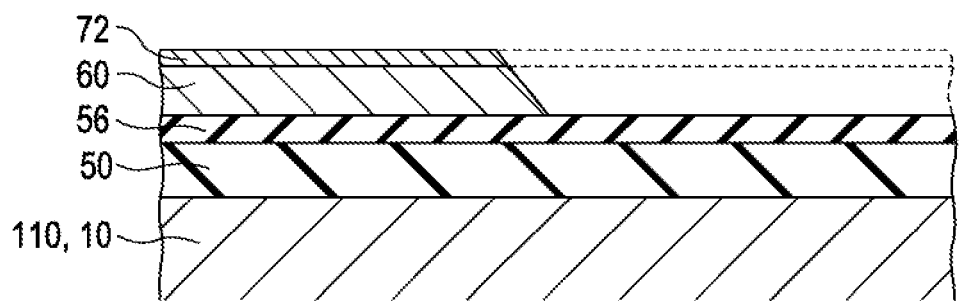
FIGS. 20A and 20B are sectional views illustrating steps of manufacturing the ink jet recording head according to the first embodiment.

As shown in FIG. 20A, a resist (not shown) having a predetermined pattern is provided on the piezoelectric film 72 and the first electrode 60 and the piezoelectric film 72 are patterned together using the resist as a mask such that side surfaces of one of the first electrode 60 and the piezoelectric film 72 are inclined.

Figure 20B:
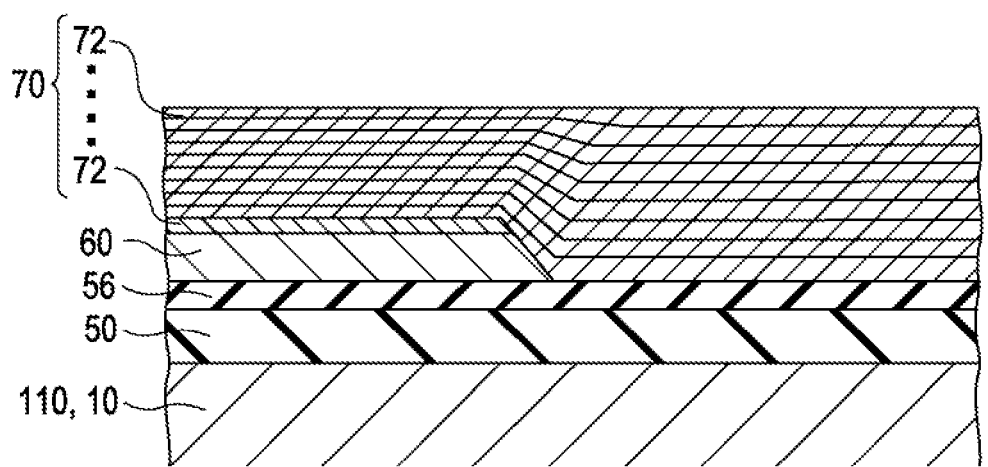

After the resist is stripped off, the coating step, the drying step, the degreasing step, and/or the calcining step is repeated several times depending on the target thickness of the piezoelectric layers 70, whereby the piezoelectric layers 70 are formed so as to each include a plurality of piezoelectric films 72 and so as to have a predetermined thickness as shown in FIG. 20B. When the thickness of a film obtained by one shot of the precursor solution is about 0.1 μm and the piezoelectric layers 70 each include ten of the piezoelectric films 72, the piezoelectric layers 70 have a thickness of about 1.1 μm. In this embodiment, the piezoelectric layers 70 each include the stacked piezoelectric films 72. The piezoelectric layers 70 may each include the single piezoelectric film 72.

The formation of the piezoelectric layers 70 by the above procedure allows the piezoelectric layers 70 to be made of the piezoelectric material, which contains perovskite-structured bismuth sodium potassium titanate and satisfies the inequality $0 \leq P_r/P_m \leq 0.25$ at 25° C., wherein $P_m$ and $P_r$ are the saturation polarization and remanent polarization, respectively.

In the course of forming the piezoelectric layers 70, the solvent contained in the precursor solution volatilizes by heating in the drying step, the degreasing step, the calcining step and therefore the piezoelectric layers 70 contract in volume. The piezoelectric layers 70 suffer from stress from a base such as a substrate or an electrode to have tensile stress.

Figure 21A:
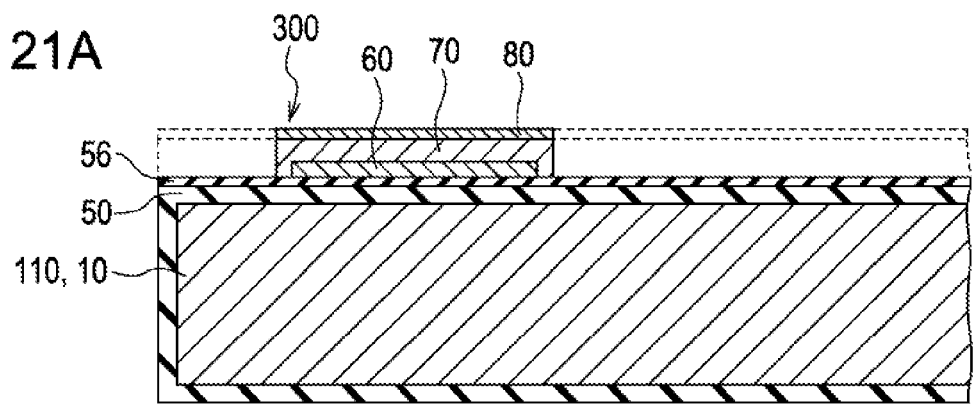
FIGS. 21A to 21C are sectional views illustrating steps of manufacturing the ink jet recording head according to the first embodiment.

After the piezoelectric layers 70 are formed as described above, the second electrodes 80 are formed on the piezoelectric layers 70 by a sputtering process or the like using platinum or the like. The piezoelectric layers 70 and the second electrodes 80 are patterned together so as to be located in regions facing the pressure-generating chambers 12, whereby the piezoelectric elements 300, which include portions of the first electrode 60, the piezoelectric layers 70, and the second electrodes 80, are formed as shown in FIG. 21A. The piezoelectric layers 70 and the second electrodes 80 can be patterned together in such a manner that a resist (not shown) having a predetermined pattern is formed thereover and is then dry-etched. The piezoelectric elements 300 may be post-annealed at a temperature of 600° C. to 800° C. as required. This allows the interfaces between the piezoelectric layers 70 and the first electrode 60 and those between the piezoelectric layers 70 and the second electrodes 80 to be good and also allows the crystallinity of the piezoelectric layers 70 to be improved.

Figure 21B:
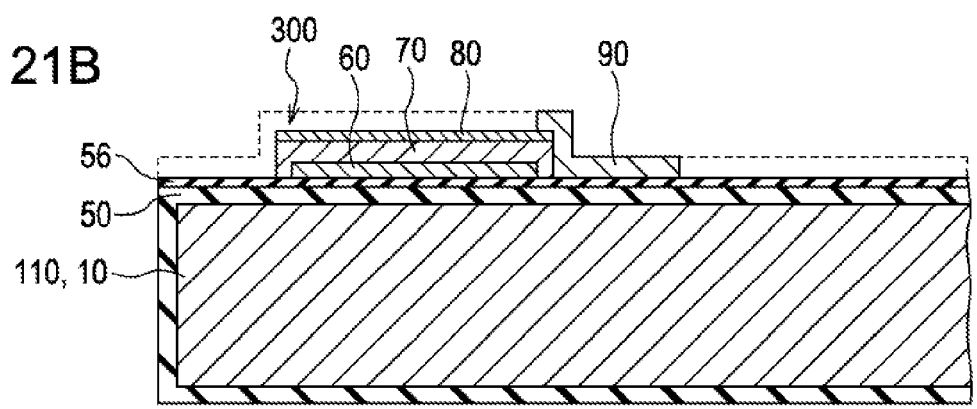

As shown in FIG. 21B, the lead electrodes 90 are formed over the channeled substrate-forming wafer 110 using, for example, gold (Au) or the like and are then patterned through a mask pattern (not shown) made of, for example, a resist so as to correspond to the piezoelectric elements 300.

Figure 21C:
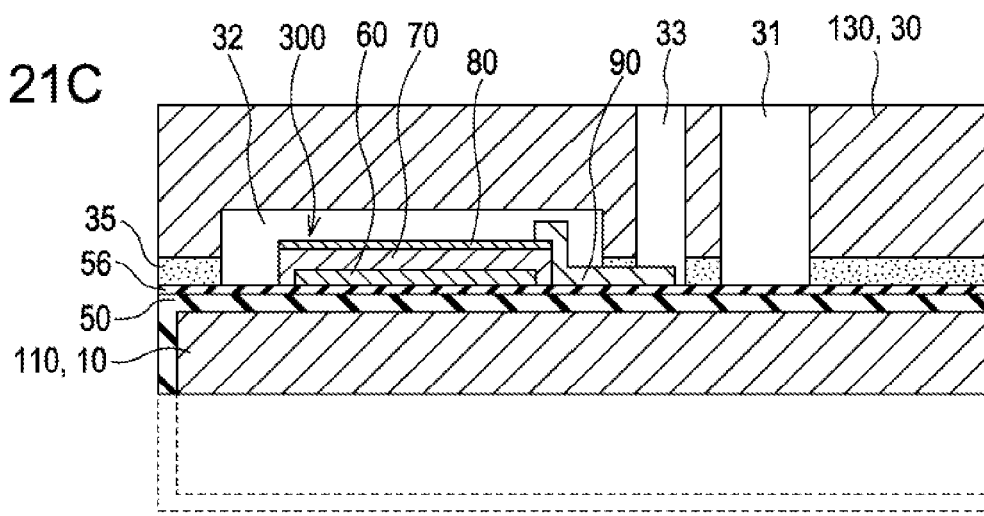

After a protective substrate-forming wafer 130, made of silicon, for forming the protective substrate 30 and other protective substrates is bonded to a surface of the channeled substrate-forming wafer 110 that is overlaid with the piezoelectric elements 300 with the adhesive 35, the channeled substrate-forming wafer 110 is thinned so as to have a predetermined thickness as shown in FIG. 21C.

Figure 22A:
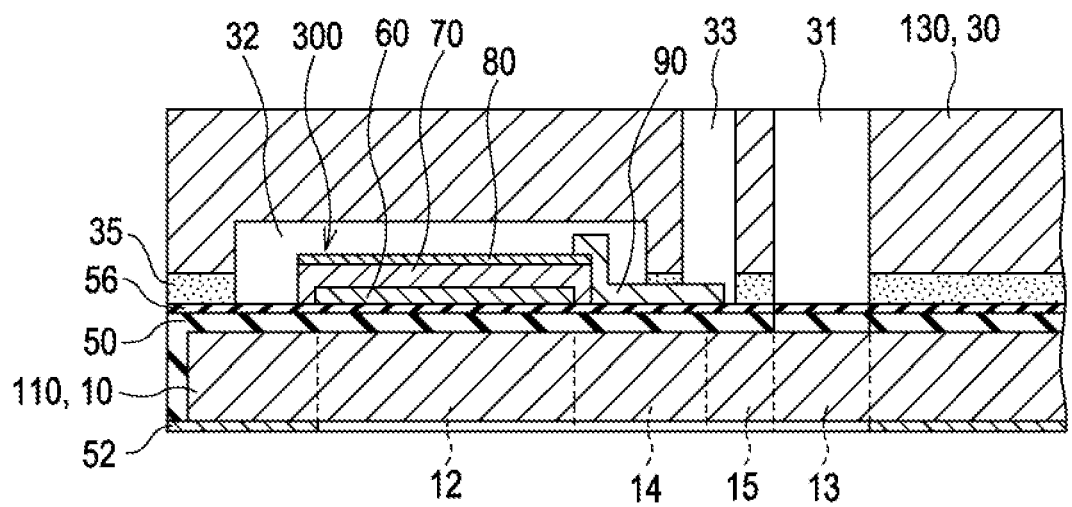
FIGS. 22A and 22B are sectional views illustrating steps of manufacturing the ink jet recording head according to the first embodiment.
Figure 22B:
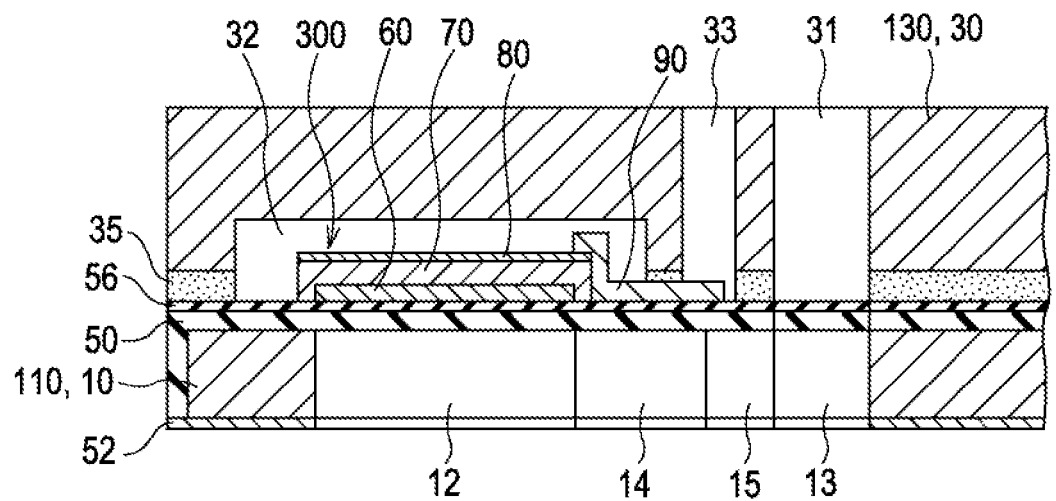
Figure 23:
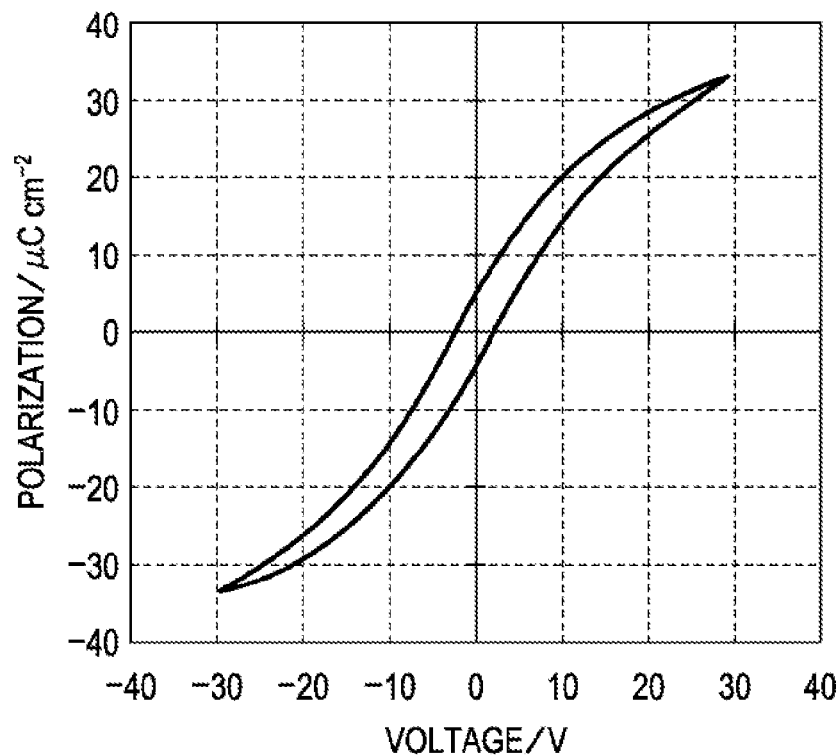
FIG. 23 is a graph showing a P-V curve of a piezoelectric element prepared in Example 1.
Figure 24:
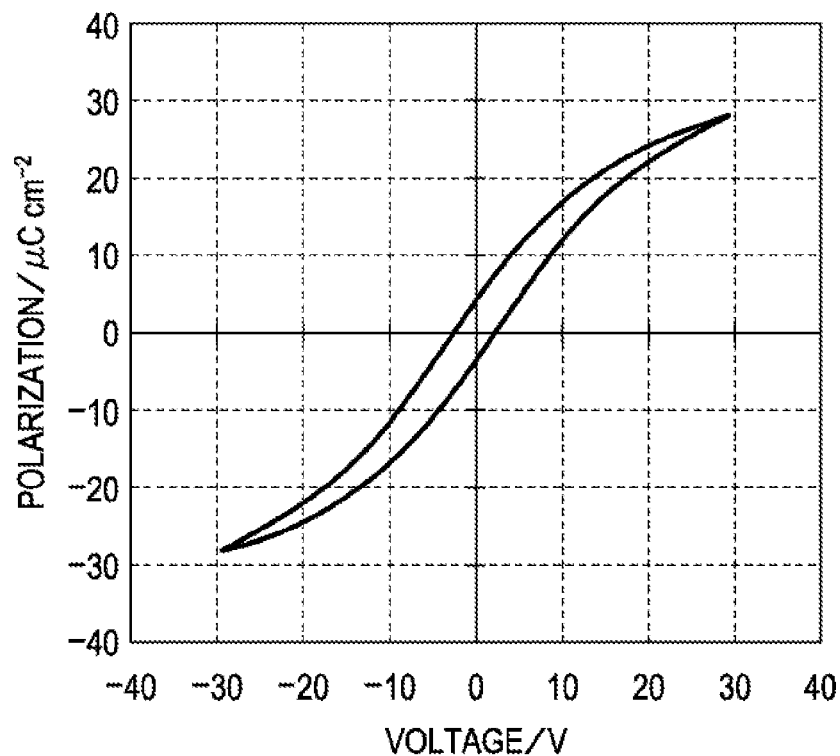
FIG. 24 is a graph showing a P-V curve of a piezoelectric element prepared in Example 2.
Figure 25:
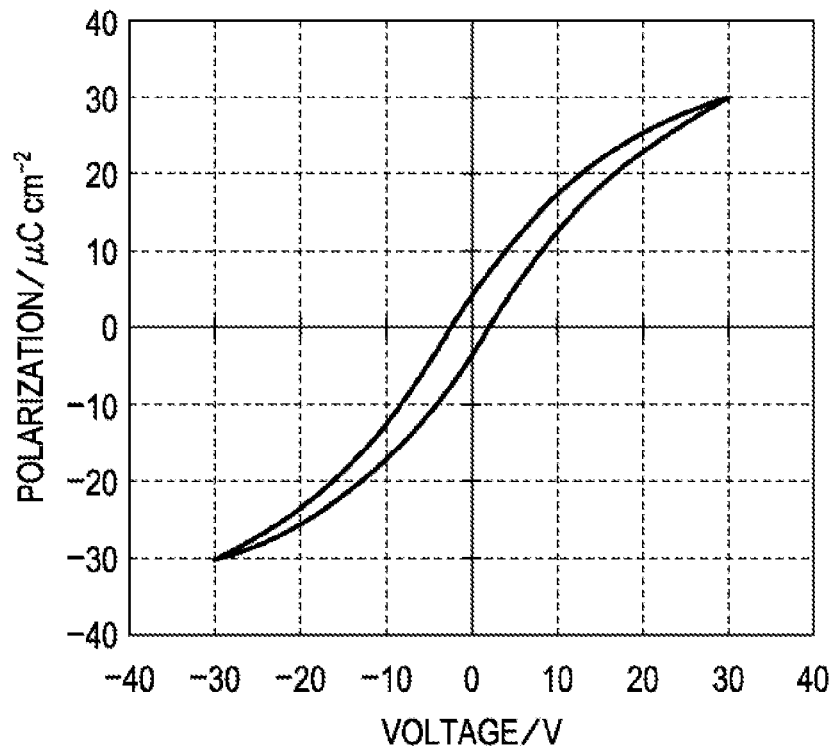
FIG. 25 is a graph showing a P-V curve of a piezoelectric element prepared in Example 3.
Figure 26:
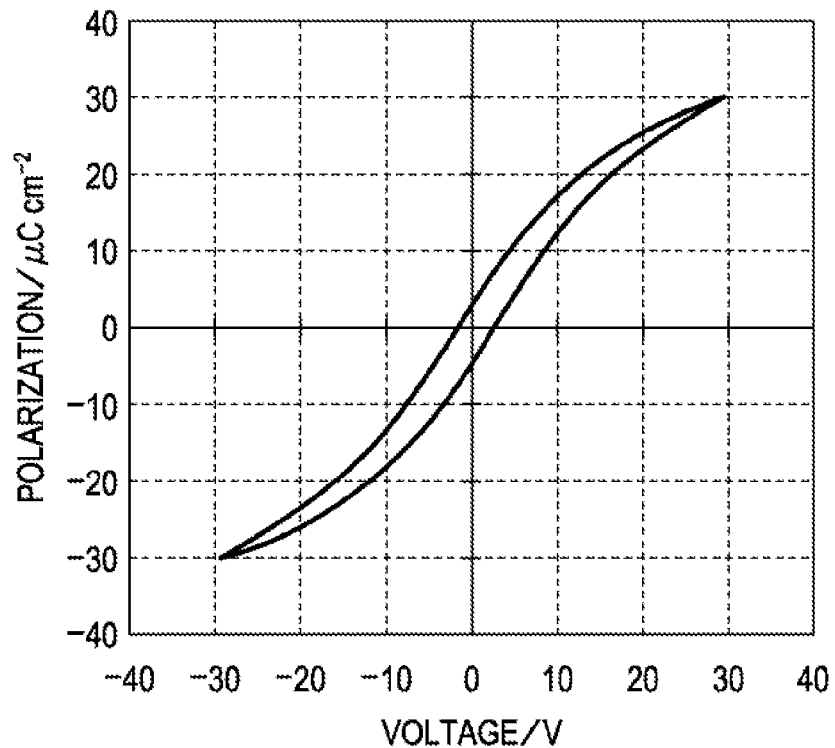
FIG. 26 is a graph showing a P-V curve of a piezoelectric element prepared in Example 4.
Figure 27:
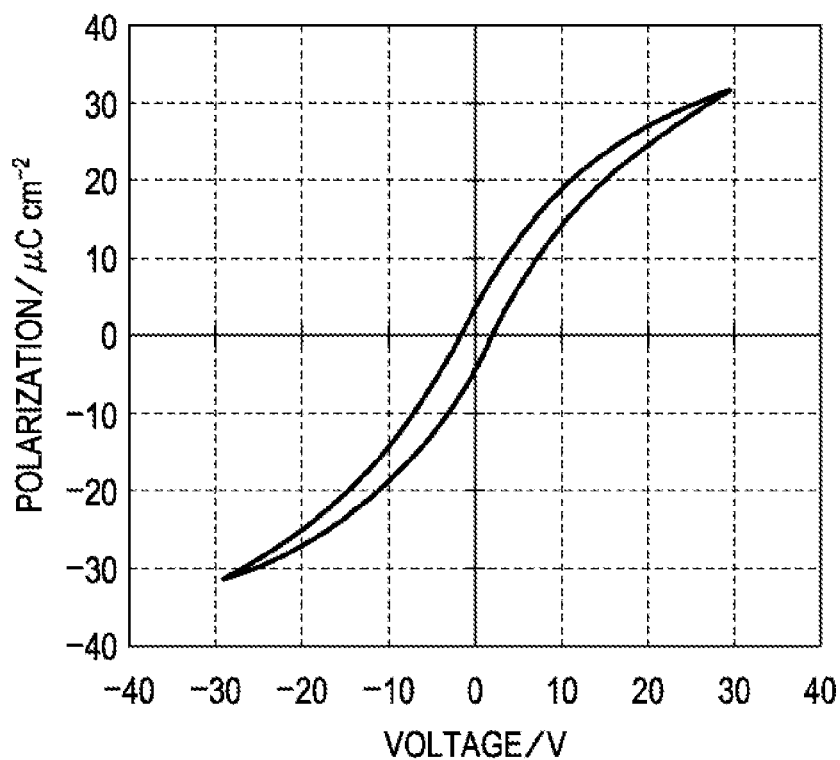
FIG. 27 is a graph showing a P-V curve of a piezoelectric element prepared in Example 5.
Figure 28:
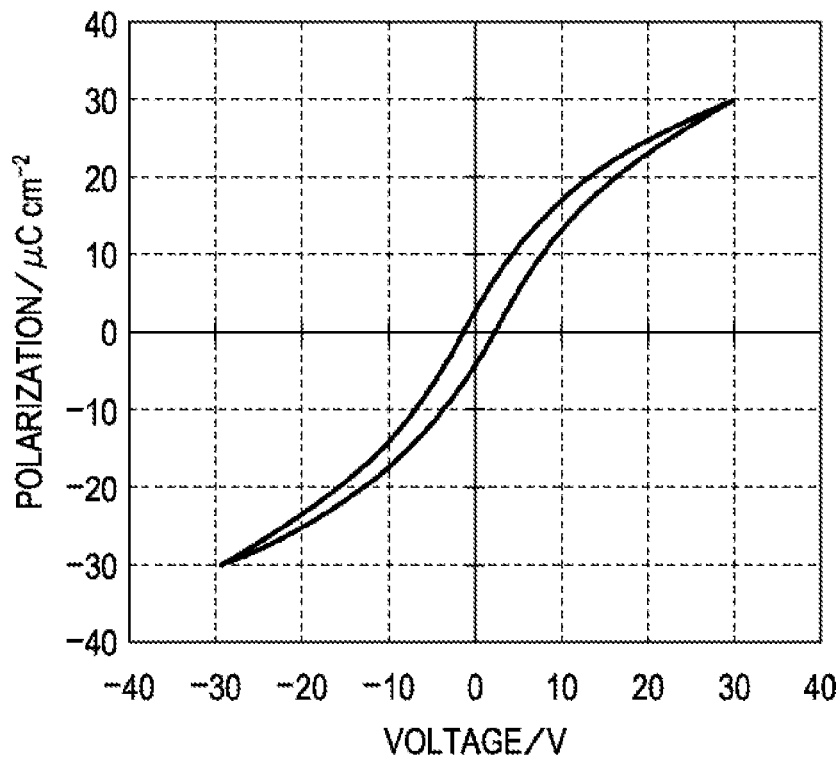
FIG. 28 is a graph showing a P-V curve of a piezoelectric element prepared in Example 6.
Figure 29:
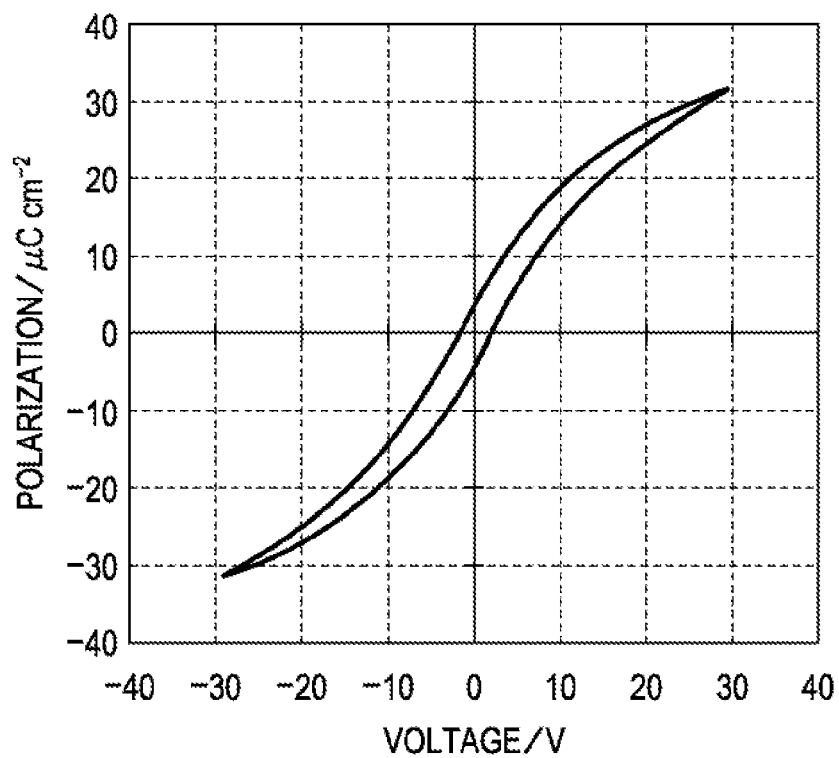
FIG. 29 is a graph showing a P-V curve of a piezoelectric element prepared in Example 7.
Figure 30:
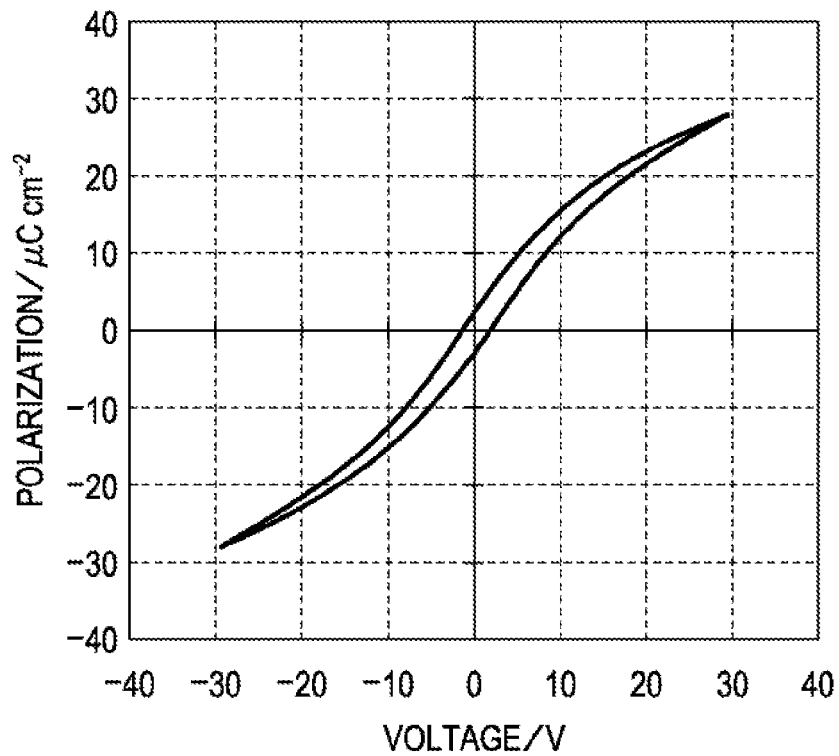
FIG. 30 is a graph showing a P-V curve of a piezoelectric element prepared in Example 8.
Figure 31:
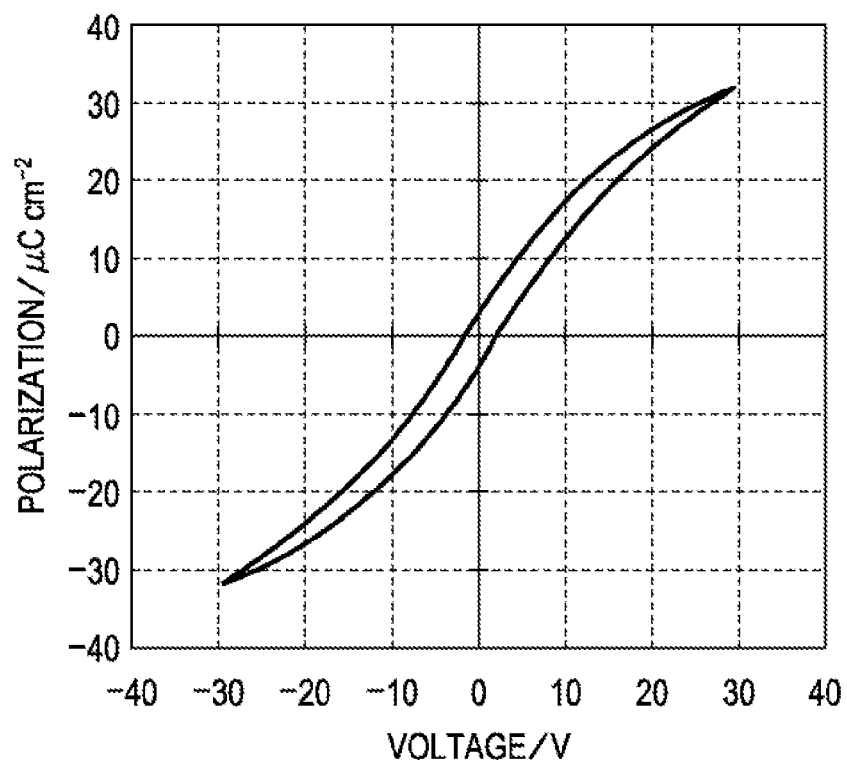
FIG. 31 is a graph showing a P-V curve of a piezoelectric element prepared in Example 9.
Figure 32:
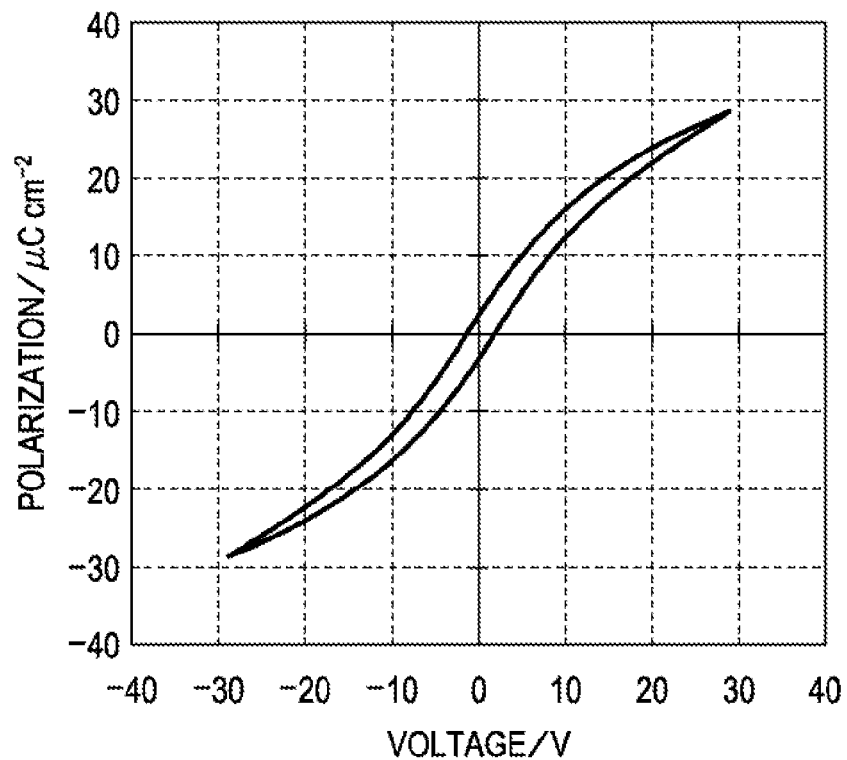
FIG. 32 is a graph showing a P-V curve of a piezoelectric element prepared in Example 10.
Figure 33:
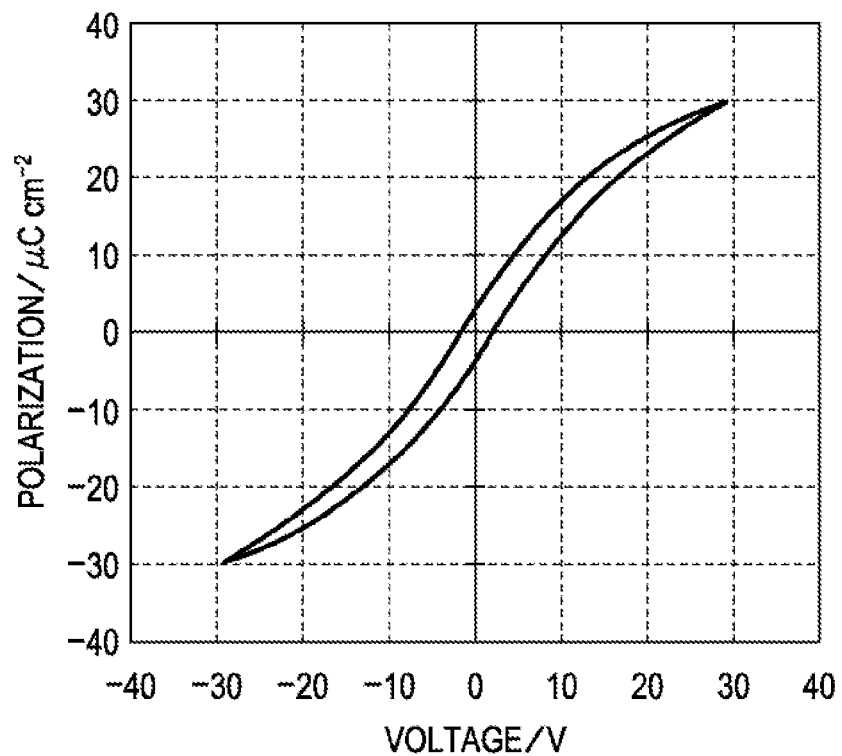
FIG. 33 is a graph showing a P-V curve of a piezoelectric element prepared in Example 11.
Figure 34:
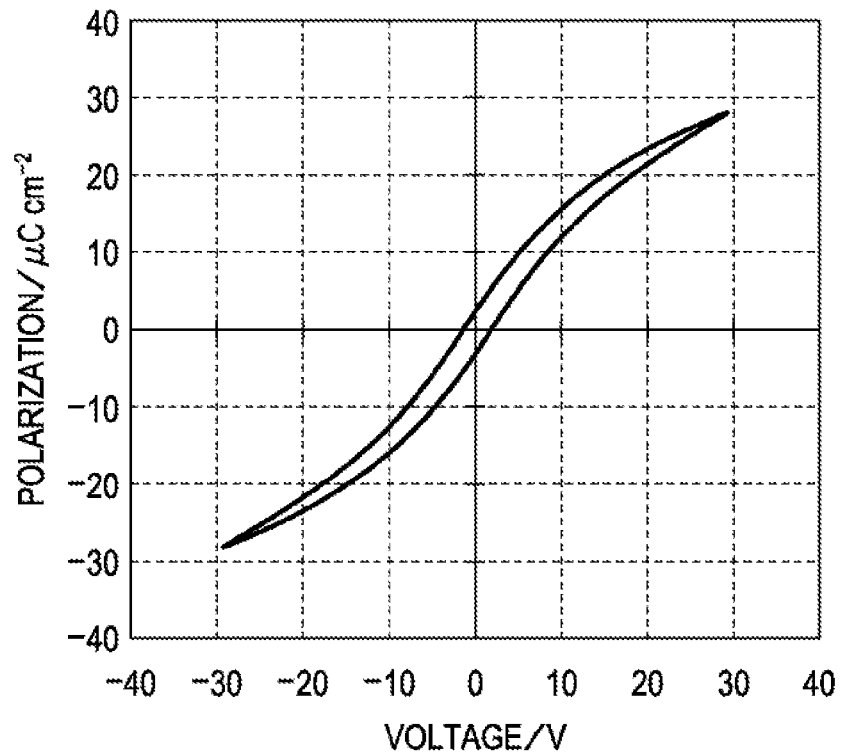
FIG. 34 is a graph showing a P-V curve of a piezoelectric element prepared in Example 12.
Figure 35:
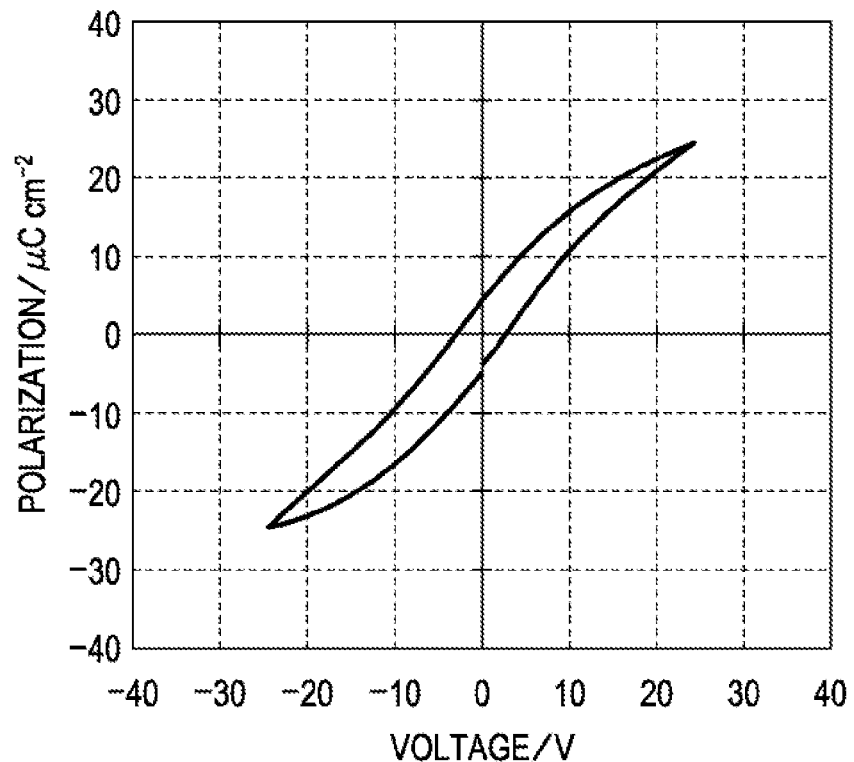
FIG. 35 is a graph showing a P-V curve of a piezoelectric element prepared in Example 13.
Figure 36:
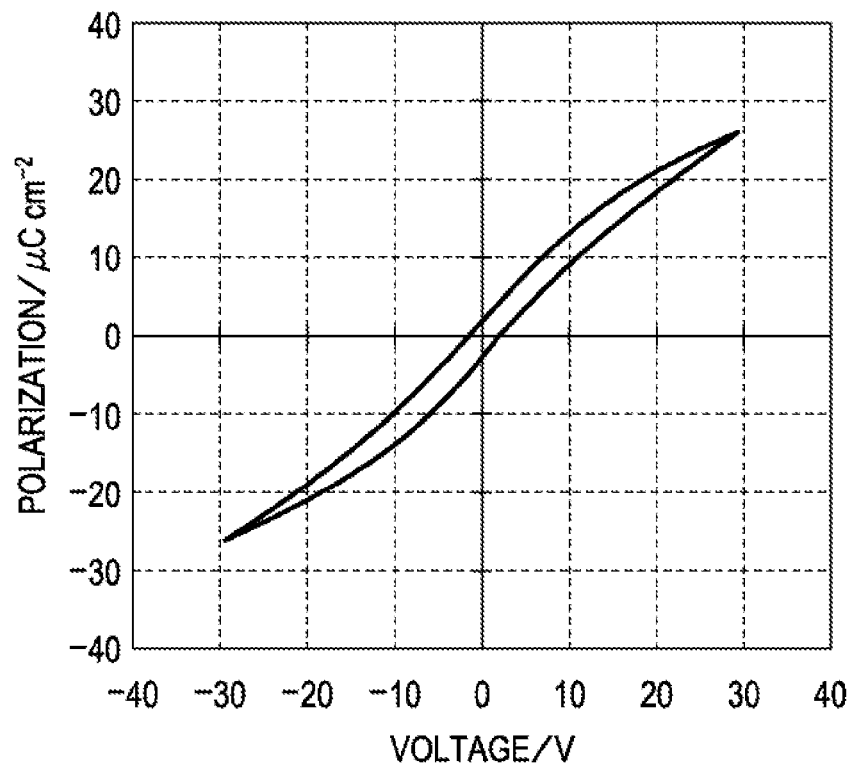
FIG. 36 is a graph showing a P-V curve of a piezoelectric element prepared in Example 14.
Figure 37:
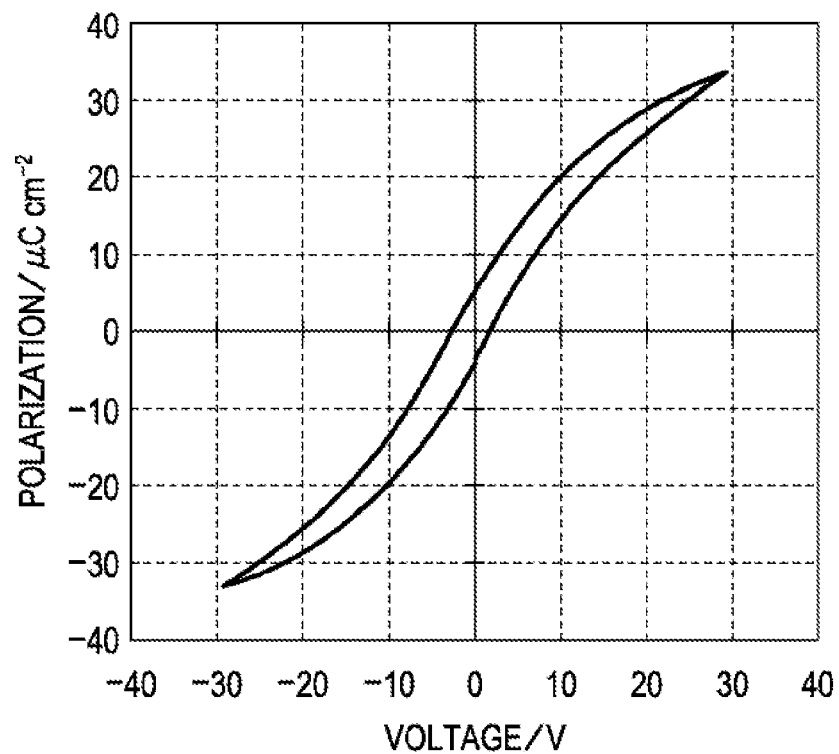
FIG. 37 is a graph showing a P-V curve of a piezoelectric element prepared in Example 15.
Figure 38:
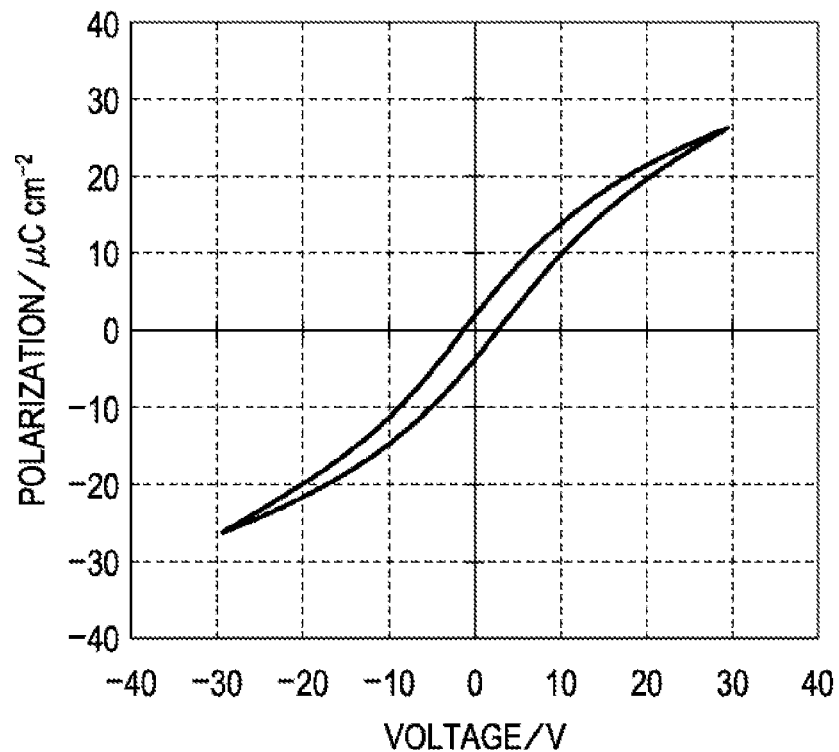
FIG. 38 is a graph showing a P-V curve of a piezoelectric element prepared in Example 16.
Figure 39:
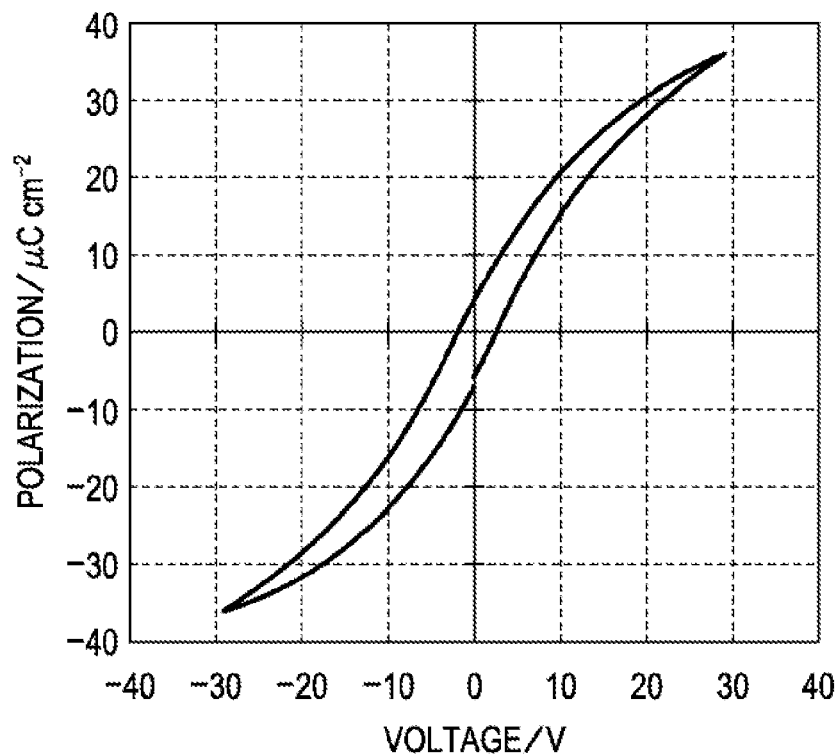
FIG. 39 is a graph showing a P-V curve of a piezoelectric element prepared in Example 17.
Figure 40:
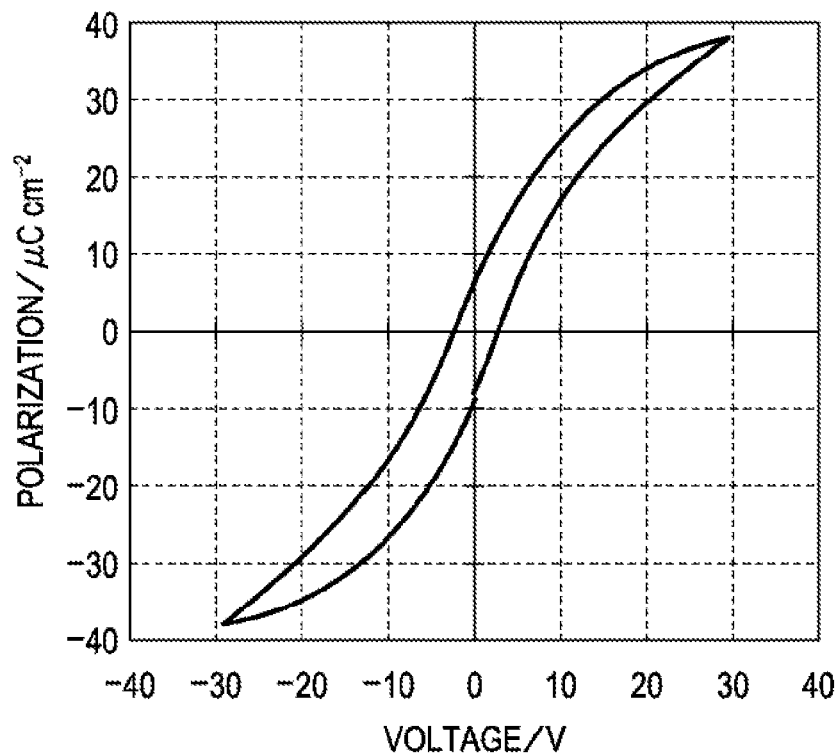
FIG. 40 is a graph showing a P-V curve of a piezoelectric element prepared in Example 18.
Figure 41:
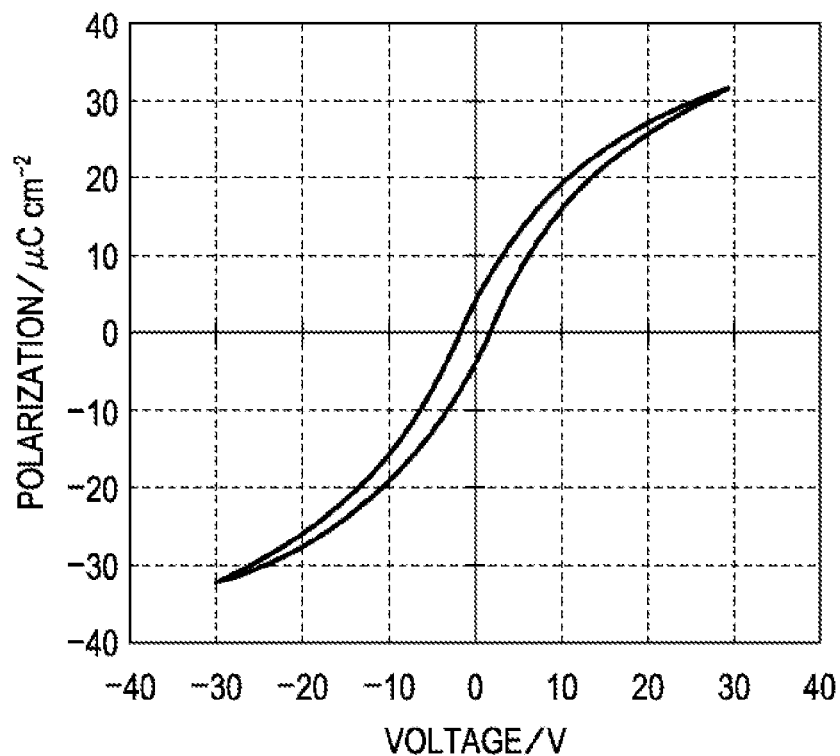
FIG. 41 is a graph showing a P-V curve of a piezoelectric element prepared in Example 19.
Figure 42:
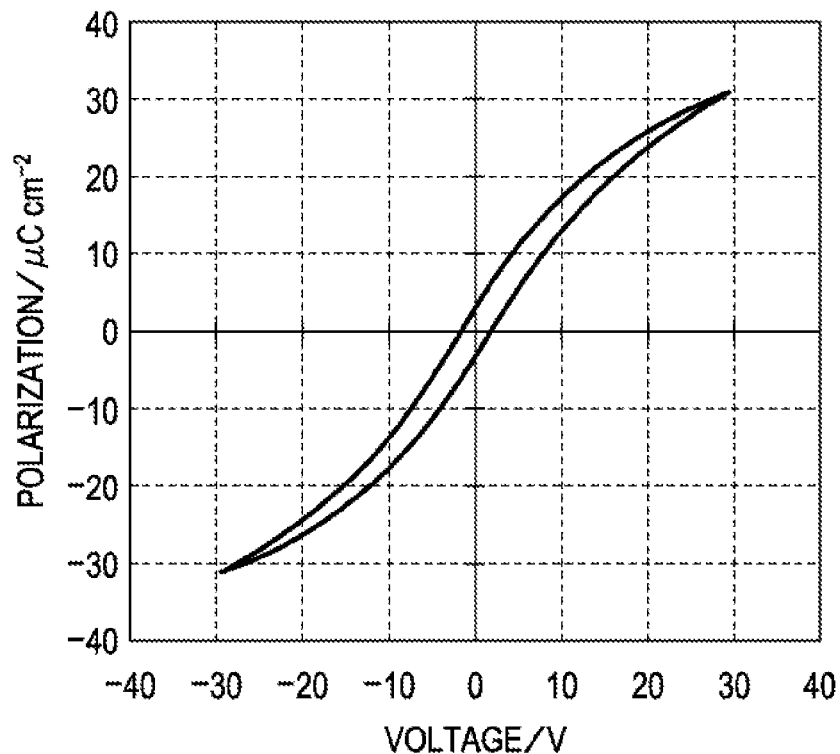
FIG. 42 is a graph showing a P-V curve of a piezoelectric element prepared in Example 20.
Figure 43:
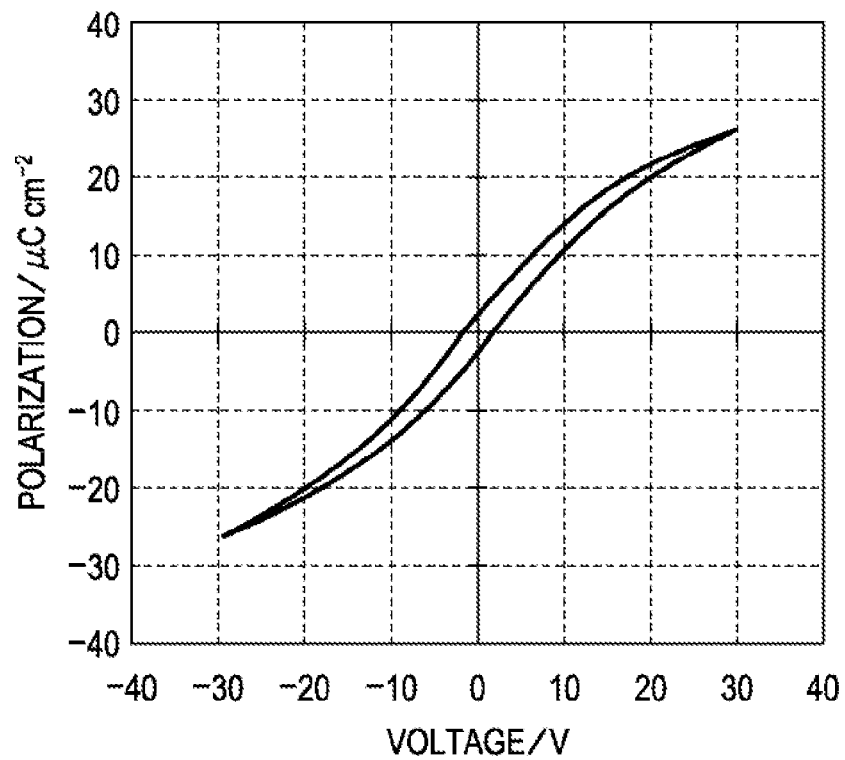
FIG. 43 is a graph showing a P-V curve of a piezoelectric element prepared in Example 21.
Figure 44:
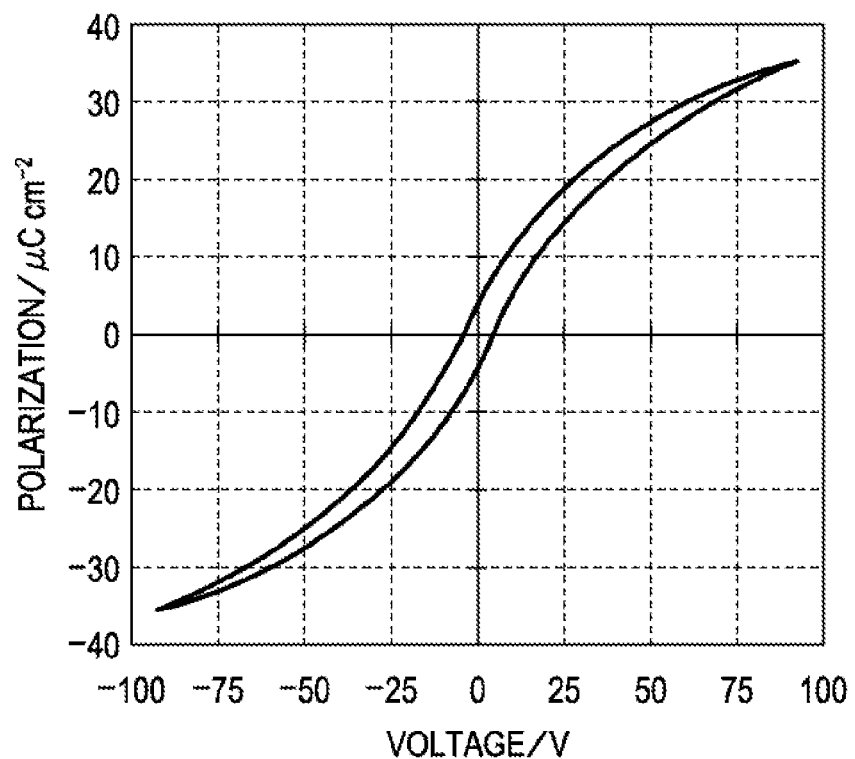
FIG. 44 is a graph showing a P-V curve of a piezoelectric element prepared in Example 22.

As shown in FIG. 22A, a mask film 52 is formed on the channeled substrate-forming wafer 110 and is then patterned so as to have a predetermined pattern. As shown in FIG. 22B, the communicating portion 13, the ink supply channels 14, the communicating channels 15, and the pressure-generating chambers 12, which correspond to the piezoelectric elements 300, are formed in such a manner that the channeled substrate-forming wafer 110 is anisotropically etched (wet-etched) through the mask film 52 using an alkali solution containing KOH or the like.

Unnecessary peripheral portions are cut off from the channeled substrate-forming wafer 110 and the protective substrate-forming wafer 130 by, for example, dicing or the like. After the mask film 52 is removed, the nozzle plate 20 having the nozzle openings 21 is bonded to a surface of the channeled substrate-forming wafer 110 that faces the protective substrate-forming wafer 130 and the compliance substrate 40 is bonded to the protective substrate-forming wafer 130. The channeled substrate-forming wafer 110 and the other members are divided into the channeled substrate 10 and chip-sized pieces as shown in FIG. 1, whereby the ink jet recording head I according to this embodiment is obtained.

EXAMPLES

The invention is further described below in detail with reference to examples. The invention is not limited to the examples.

Example 1

A silicon dioxide film was formed by the thermal oxidation of a surface portion of a silicon substrate. A titanium dioxide layer with a thickness of 40 nm was deposited on the silicon dioxide film and a (111)-oriented platinum layer with a thickness of 150 nm was deposited on the titanium dioxide layer, whereby a first electrode was formed.

A piezoelectric layer 70 was formed on the first electrode by a spin coating process. A procedure for forming the piezoelectric layer 70 was as described below. Butanol solutions each containing bismuth, potassium, sodium, or titanium were mixed at a predetermined ratio, whereby a precursor solution was prepared. The precursor solution was dripped onto the silicon substrate having the titanium dioxide layer and the first electrode and the silicon substrate was rotated at 2,500 rpm, whereby a piezoelectric precursor film was formed (a coating step). The piezoelectric precursor film was dried and degreased at 400° C. for three minutes (a drying and degreasing step). After the coating step and the drying and degreasing step were repeated four times, calcination was performed at 750° C. for three minutes by rapid thermal annealing (RTA) (a calcining step). A procedure in which the coating step and the drying and degreasing step were repeated four times and the calcining step was then performed was repeated twice, that is, the coating step was repeated eight times, whereby the piezoelectric layer 70 was formed so as to have a thickness of 512 nm.

Platinum was deposited on the piezoelectric layer 70 by a DC sputtering process, whereby a second electrode 80 with a thickness of 100 nm was formed. The second electrode 80 was calcined at 750° C. for five minutes by RTA, whereby a piezoelectric element 300 including the piezoelectric layer 70 was prepared. The piezoelectric layer 70 contained a complex oxide, having a perovskite structure, represented by Formula (1) in which x=0.81, a=0.5, and b=0.5.

Examples 2 and 3

Piezoelectric elements 300 were prepared in substantially the same manner as that described in Example 1 except that the mixing ratio of butanol solutions each containing bismuth, potassium, sodium, or titanium was varied and complex oxides represented by Formula (1) in which x, a, and b were as shown in Table 1 were contained in piezoelectric layers 70.

TABLE 1

|  | x | 1 − x | y | a | b |
|---|---|---|---|---|---|
| Example 1 | 0.81 | 0.19 | 0 | 0.5 | 0.5 |
| Example 2 | 0.71 | 0.29 | 0 | 0.5 | 0.5 |
| Example 3 | 0.61 | 0.39 | 0 | 0.5 | 0.5 |
| Example 4 | 0.90 | 0.10 | 0.04 | 0.5 | 0.5 |
| Example 5 | 0.81 | 0.19 | 0.04 | 0.5 | 0.5 |
| Example 6 | 0.71 | 0.29 | 0.04 | 0.5 | 0.5 |
| Example 7 | 0.61 | 0.39 | 0.04 | 0.5 | 0.5 |
| Example 8 | 0.51 | 0.49 | 0.04 | 0.5 | 0.5 |
| Example 9 | 0.90 | 0.10 | 0.06 | 0.5 | 0.5 |
| Example 10 | 0.81 | 0.19 | 0.06 | 0.5 | 0.5 |
| Example 11 | 0.71 | 0.29 | 0.06 | 0.5 | 0.5 |
| Example 12 | 0.61 | 0.39 | 0.06 | 0.5 | 0.5 |
| Example 13 | 0.90 | 0.10 | 0.12 | 0.5 | 0.5 |
| Example 14 | 0.81 | 0.19 | 0.12 | 0.5 | 0.5 |
| Example 15 | 0.71 | 0.29 | 0.12 | 0.5 | 0.5 |
| Example 16 | 0.61 | 0.39 | 0.12 | 0.5 | 0.5 |
| Comparative Example 1 | 0.90 | 0.10 | 0 | 0.5 | 0.5 |

Examples 4 to 16

Piezoelectric elements 300 were prepared in substantially the same manner as that described in Example 1 except that the mixing ratio of butanol solutions each containing bismuth, potassium, sodium, titanium, or barium, which were ingredients of precursor solutions, was varied and complex oxides represented by Formula (2) in which x, y, a, and b were as shown in Table 1 were contained in piezoelectric layers 70.

Example 17

A piezoelectric element 300 was prepared in substantially the same manner as that described in Example 1 except that the mixing ratio of butanol solutions each containing bismuth, potassium, sodium, titanium, or barium was varied; the amount of potassium used in this example was 20 mole percent greater than the amount of potassium used in Example 4; and a complex oxide similar in composition to that described in Example 4 was contained in a piezoelectric layer 70.

Example 18

A piezoelectric element 300 was prepared in substantially the same manner as that described in Example 1 except that the mixing ratio of butanol solutions each containing bismuth, potassium, sodium, titanium, or barium was varied; the amount of potassium used in this example was 20 mole percent greater than the amount of potassium used in Example 5; and a complex oxide similar in composition to that described in Example 5 was contained in a piezoelectric layer 70.

Example 19

A piezoelectric element 300 was prepared in substantially the same manner as that described in Example 1 except that the mixing ratio of butanol solutions each containing bismuth, potassium, sodium, titanium, or barium was varied; the amount of potassium used in this example was 20 mole percent greater than the amount of potassium used in Example 6; and a complex oxide similar in composition to that described in Example 6 was contained in a piezoelectric layer 70.

Example 20

A piezoelectric element 300 was prepared in substantially the same manner as that described in Example 1 except that the mixing ratio of butanol solutions each containing bismuth, potassium, sodium, titanium, or barium was varied; the amount of potassium used in this example was 20 mole percent greater than the amount of potassium used in Example 7; and a complex oxide similar in composition to that described in Example 7 was contained in a piezoelectric layer 70.

Example 21

A piezoelectric element 300 was prepared in substantially the same manner as that described in Example 1 except that the mixing ratio of butanol solutions each containing bismuth, potassium, sodium, titanium, or barium was varied; the amount of potassium used in this example was 10 mole percent greater than the amount of potassium used in Example 8; and a complex oxide similar in composition to that described in Example 8 was contained in a piezoelectric layer 70.

Example 22

A piezoelectric element 300 including a piezoelectric layer 70 formed as described below was prepared, the piezoelectric layer 70 being similar in composition to and different in thickness from that formed in Example 6. First, butanol solutions each containing bismuth, potassium, sodium, titanium, or barium were mixed at a predetermined ratio, whereby a precursor solution was prepared. The precursor solution was dripped onto a substrate having a titanium dioxide layer and a first electrode and the substrate was rotated at 2,500 rpm, whereby a piezoelectric precursor film was formed (a coating step). The piezoelectric precursor film was dried and degreased at 400° C. for three minutes (a drying and degreasing step). After the coating step and the drying and degreasing step were repeated three times, calcination was performed at 750° C. for three minutes by rapid thermal annealing (RTA) (a calcining step). A procedure in which the coating step and the drying and degreasing step were repeated three times and the calcining step was then performed was repeated six times, that is, the coating step was repeated 18 times, whereby the piezoelectric layer 70 was formed so as to have a thickness of 1,080 nm.

Comparative Example 1

A piezoelectric element 300 was prepared in substantially the same manner as that described in Example 1 except that the mixing ratio of butanol solutions each containing bismuth, potassium, sodium, or titanium, was varied and a complex oxide represented by Formula (1) in which x, a, and b were as shown in Table 1 was contained in the piezoelectric layer 70.

Comparative Example 2

A piezoelectric element 300 was prepared in substantially the same manner as that described in Example 1 except that the mixing ratio of butanol solutions each containing bismuth, potassium, sodium, titanium, or barium was varied; the amount of potassium used in this example was 20 mole percent greater than the amount of potassium used in Example 8; and a complex oxide similar in composition to that described in Example 8 was contained in a piezoelectric layer 70.

Comparative Example 3

A piezoelectric element was prepared by a solid phase process using metal oxides and metal carbonates as raw materials. A procedure for preparing the piezoelectric element was as described below. Raw materials, that is, powders of bismuth oxide, titanium oxide, sodium carbonate, potassium carbonate, and barium carbonate were weighed such that the molar ratio of Bi to Ti to Na to K to Ba was 0.486:1:0.426:0.6:0.028. The powders were mixed with ethanol, followed by mixing and pulverization in a planetary ball mill. The mixture was dried in a drying furnace, whereby a powder mixture containing the metal oxides and the metal carbonates was obtained. The powder mixture was mixed with a binder, that is, a 5 weight percent aqueous solution of polyvinyl alcohol, followed by granulation, whereby a granular powder was prepared. The granular powder was isostatically pressed into a powder pellet. The powder pellet was fired at 750° C. and then 1,200° C., whereby a ceramic pellet was prepared. The ceramic pellet was polished so as to have a thickness of 1 mm. The resulting ceramic pellet was coated with a silver paste by screen printing and was then baked at 650° C. The resulting ceramic pellet was sandwiched between electrodes and was then subjected to poling in such a manner that a direct current voltage of 3 kV was applied between the electrodes for three minutes in silicone oil, whereby the piezoelectric element was obtained. The piezoelectric element contained a complex oxide represented by the formula [(Bi, Na)TiO$_3$]–[(Bi, K)TiO$_3$]–[BaTiO$_3$].

The piezoelectric element was measured for piezoelectric constant d$_{33}$ and dielectric loss tan δ in the polarization direction thereof, resulting in that d$_{33}$=160 pC/N and tan δ=0.024. This showed that the piezoelectric element had characteristics substantially equivalent to those of a general complex oxide represented by the formula [(Bi, Na) TiO$_3$]–[(Bi, K)TiO$_3$]–[BaTiO$_3$]. The piezoelectric constant d$_{33}$ thereof was determined with a piezo-d$_{33}$ meter available from Chinese Academy of Sciences.

Comparative Example 4

A 1,320-nm piezoelectric element 300 was prepared in substantially the same manner as that described in Example 1 except that a precursor solution used was prepared by mixing titanium isopropoxide, zirconium acetylacetonate, lead acetate trihydrate, and 2-n-butoxyethanol at a predetermined ratio and a piezoelectric layer was made of Pb(Zr, Ti)O$_3$.

Experiment 1

Figure 45:
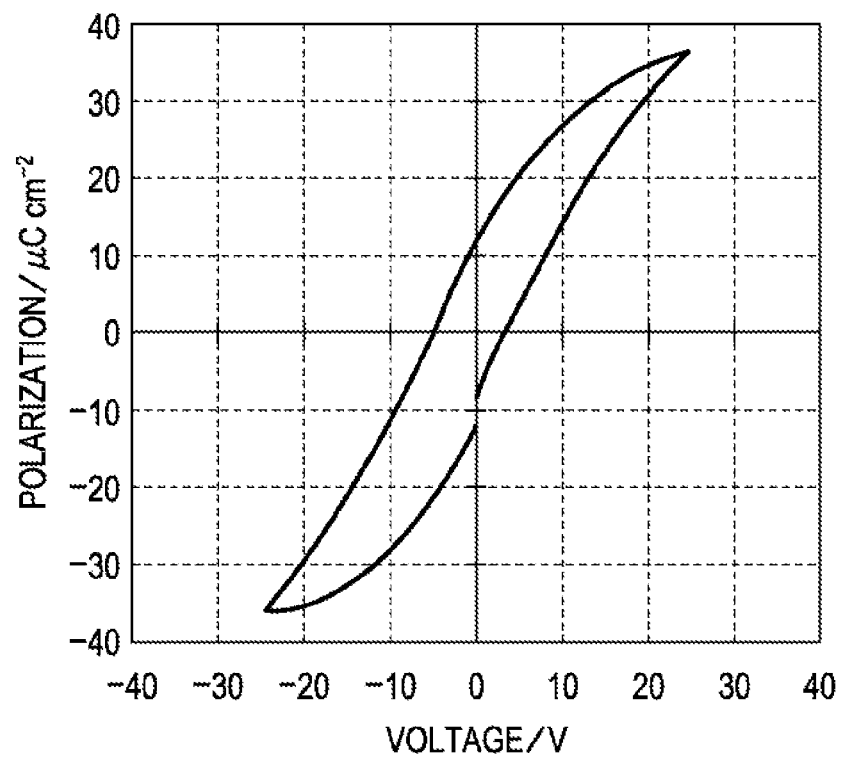
FIG. 45 is a graph showing a P-V curve of a piezoelectric element prepared in Comparative Example 1.
Figure 46:
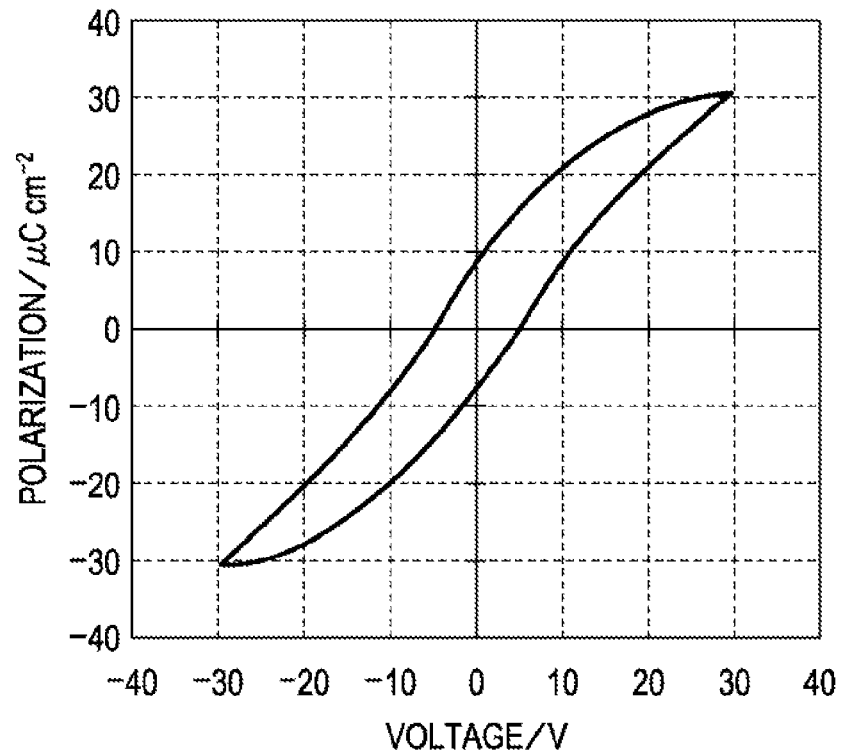
FIG. 46 is a graph showing a P-V curve of a piezoelectric element prepared in Comparative Example 2.

For the piezoelectric element prepared in each of Examples 1 to 22 and Comparative Examples 1 and 2, the relationship (a P-V curve) between the polarization and the voltage applied thereto was determined with a system, FCE-1A, available from TOYO Corporation in such a manner that a triangular wave with a frequency of 1 kHz was applied to the piezoelectric element at room temperature using an electrode pattern with a diameter of 400 μm. Results obtained from the piezoelectric elements of Examples 1 to 22 and Comparative Examples 1 and 2 are shown in FIGS. 23 to 44 (Examples 1 to 22) and FIGS. 45 and 46 (Comparative Examples 1 and 2).

For Examples 1 to 22, P$_r$ is extremely small with respect to P$_m$ and the inequality 0≤P$_r$/P$_m$≤0.25 holds. As shown in FIGS. 23 to 44, the P-V curves obtained from Examples 1 to 22 are entirely different in shape from the P-V curve obtained from Comparative Example 3. The P-V curves obtained from Comparative Examples 1 and 2 have a bulging shape like a rugby ball because of a leakage component and are similar in shape to the P-V curves obtained from Examples 1 to 22. However, for Comparative Examples 1 and 2, the inequality $0 \leq P_r/P_m \leq 0.25$ does not hold due to the leakage component. The P-V curve obtained from Example 22, which is different in thickness from and similar in composition to Example 6, is similar in shape to the P-V curve obtained from Example 6. For Example 22, $P_r$ is extremely small with respect to $P_m$ and the inequality $0 \leq P_r/P_m \leq 0.25$ holds. Therefore, it has been verified that the inequality $0 \leq P_r/P_m \leq 0.25$ holds even if the thickness of a piezoelectric layer is varied.

TABLE 2

|  | $P_r$ (μC/cm$^2$) | $P_r/P_m$ |
|---|---|---|
| Example 1 | 6.0 | 0.18 |
| Example 2 | 4.6 | 0.16 |
| Example 3 | 4.1 | 0.14 |
| Example 4 | 3.9 | 0.13 |
| Example 5 | 4.3 | 0.14 |
| Example 6 | 3.7 | 0.13 |
| Example 7 | 4.3 | 0.14 |
| Example 8 | 3.0 | 0.11 |
| Example 9 | 3.5 | 0.11 |
| Example 10 | 3.3 | 0.11 |
| Example 11 | 3.8 | 0.13 |
| Example 12 | 3.3 | 0.12 |
| Example 13 | 4.5 | 0.18 |
| Example 14 | 2.4 | 0.09 |
| Example 15 | 6.0 | 0.18 |
| Example 16 | 2.5 | 0.09 |
| Example 17 | 4.9 | 0.14 |
| Example 18 | 7.9 | 0.21 |
| Example 19 | 4.4 | 0.14 |
| Example 20 | 3.9 | 0.12 |
| Example 21 | 2.7 | 0.10 |
| Comparative Example 1 | 11.9 | 0.33 |
| Comparative Example 2 | 8.7 | 0.28 |

Experiment 2

Figure 47:
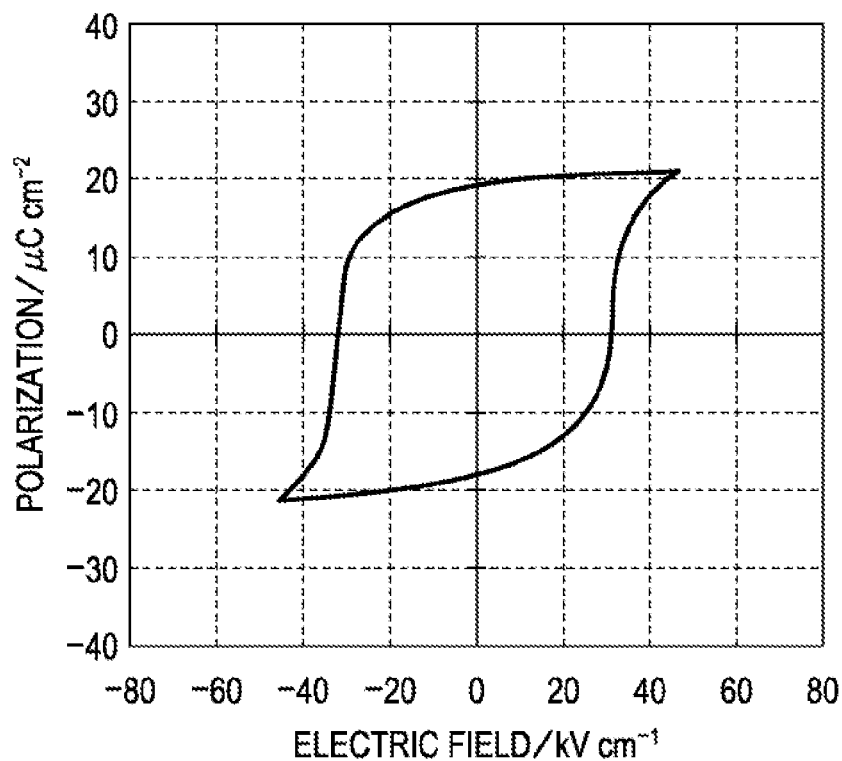
FIG. 47 is a graph showing a P-V curve of a piezoelectric element prepared in Comparative Example 3.

For the piezoelectric element prepared in Comparative Example 3, the relationship (a P-V curve) between the polarization and the voltage applied thereto was determined with a system, FCE-1A, available from TOYO Corporation in such a manner that a triangular wave with a frequency of 1 kHz was applied to the piezoelectric element at room temperature using an electrode pattern with a diameter of 400 μm. In order to prevent discharge in air, the piezoelectric element was measured in silicone oil. Results are shown in FIG. 47. As shown in FIG. 47, the piezoelectric element of Comparative Example 3 exhibits a hysteresis loop characteristic of ferroelectrics. The ratio of $P_r$ to $P_m$ is 0.92, that is, $P_r/P_m=0.92$, and therefore the value of $P_r$ is close to that of $P_m$. This proves that the hysteresis loop has good squareness.

Figure 48:
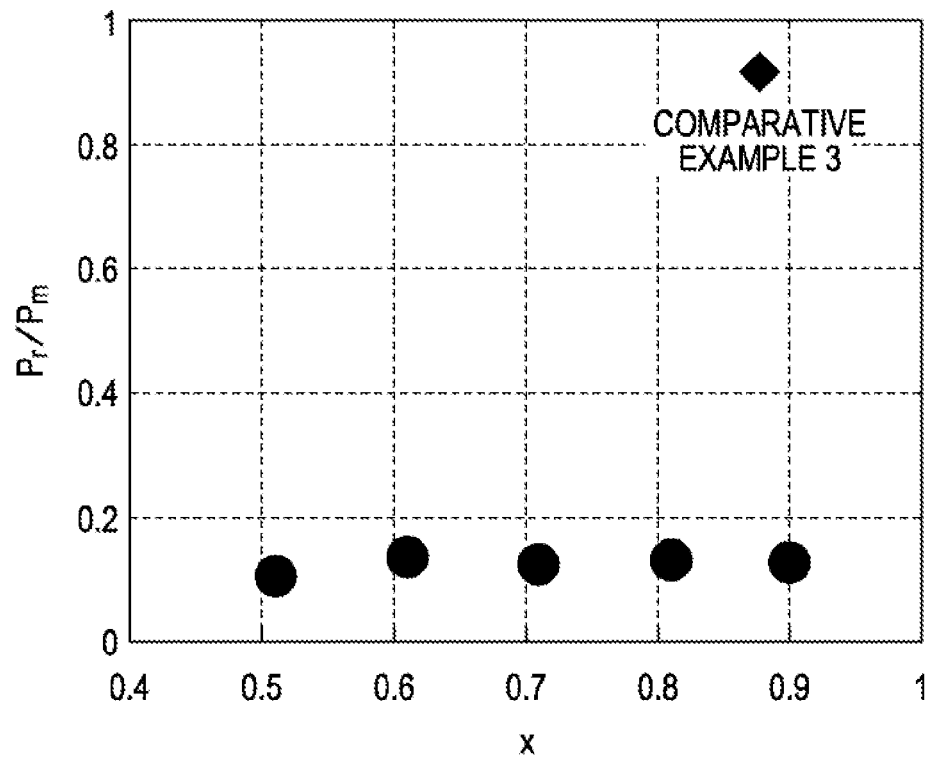
FIG. 48 is a graph obtained by plotting the ratio $P_r/P_m$ against the composition ratio x.
Figure 49:
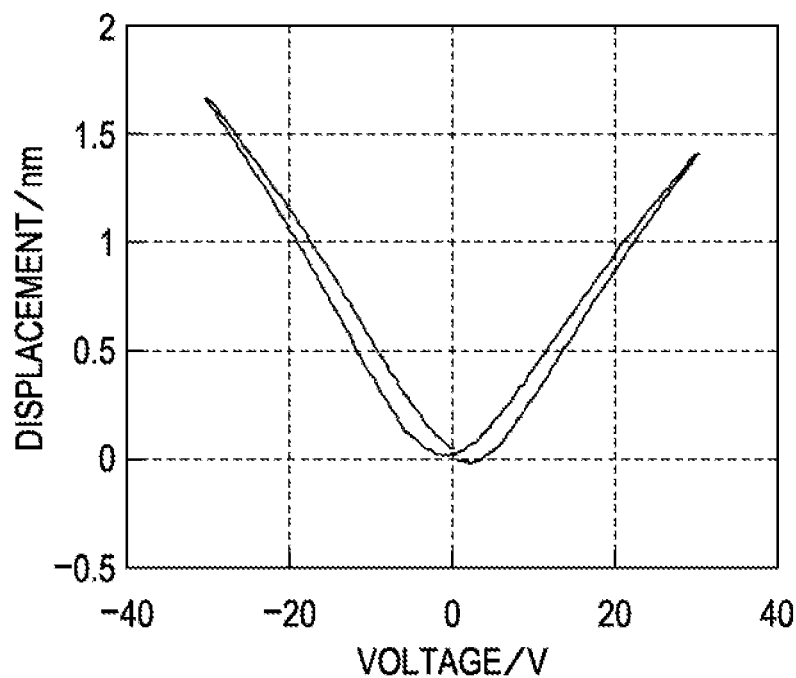
FIG. 49 is a graph showing an S-V curve of a piezoelectric element prepared in Example 1.
Figure 50:
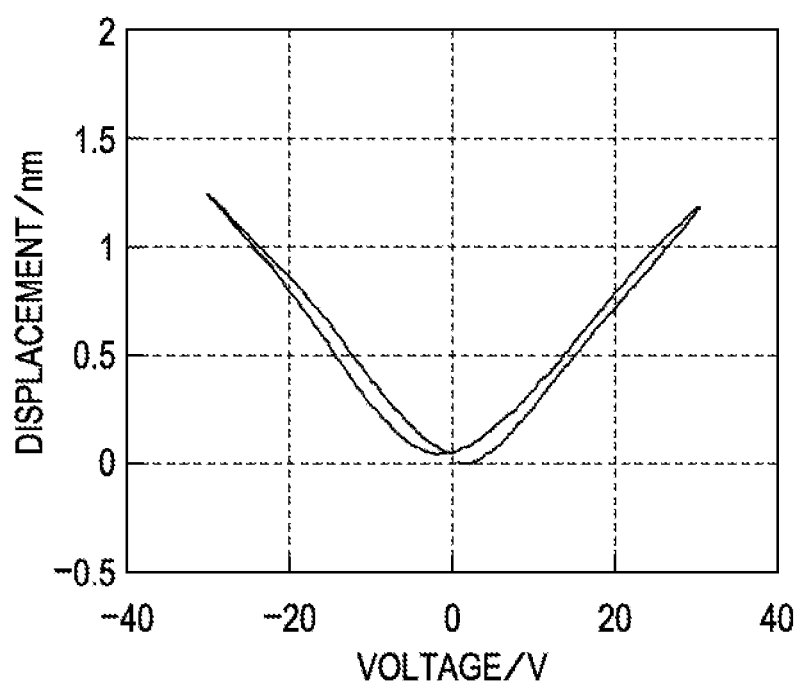
FIG. 50 is a graph showing an S-V curve of a piezoelectric element prepared in Example 2.
Figure 51:
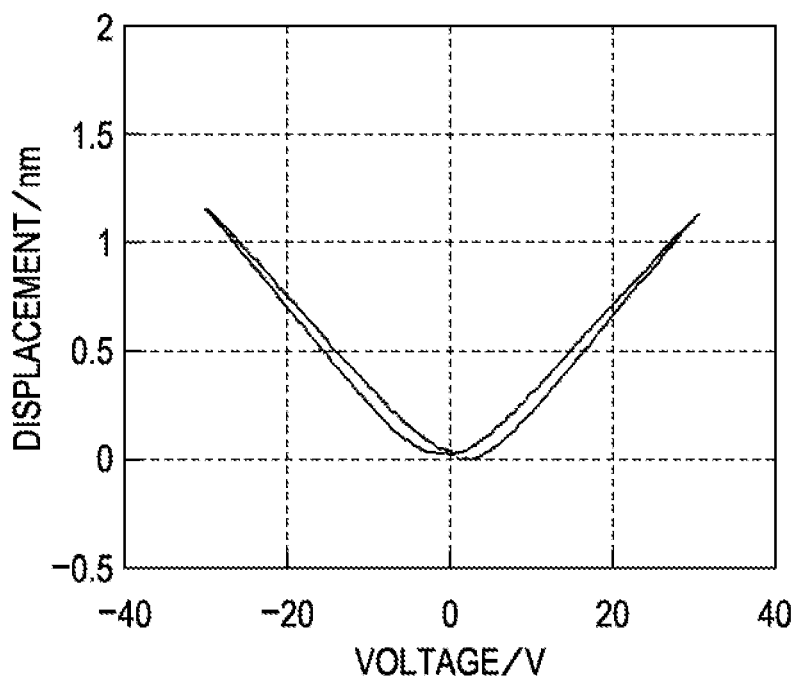
FIG. 51 is a graph showing an S-V curve of a piezoelectric element prepared in Example 3.
Figure 52:
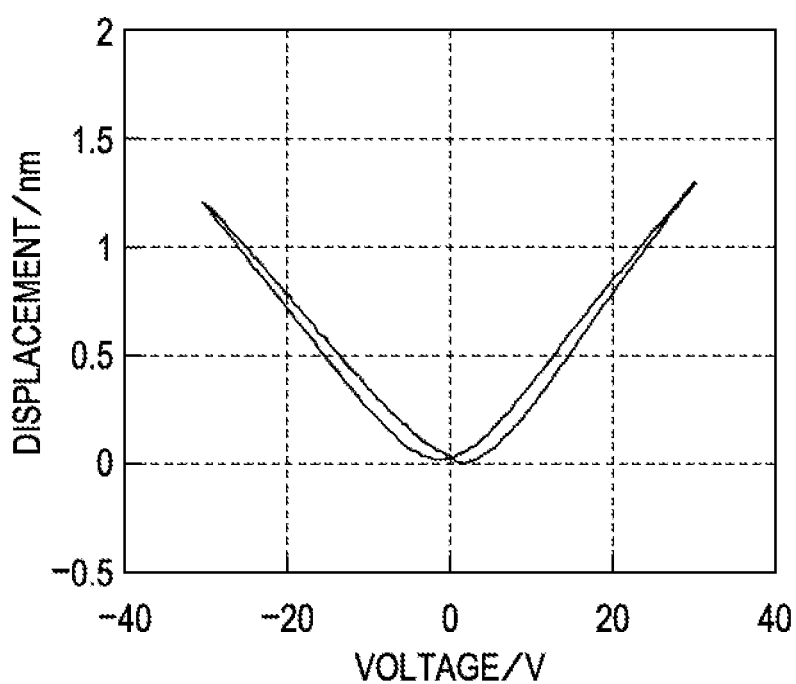
FIG. 52 is a graph showing an S-V curve of a piezoelectric element prepared in Example 4.
Figure 53:
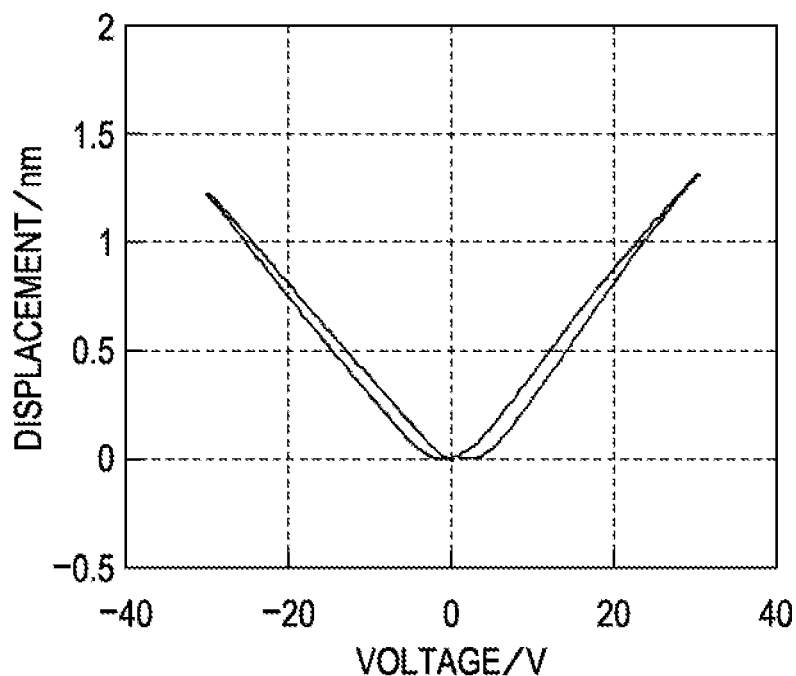
FIG. 53 is a graph showing an S-V curve of a piezoelectric element prepared in Example 5.
Figure 54:
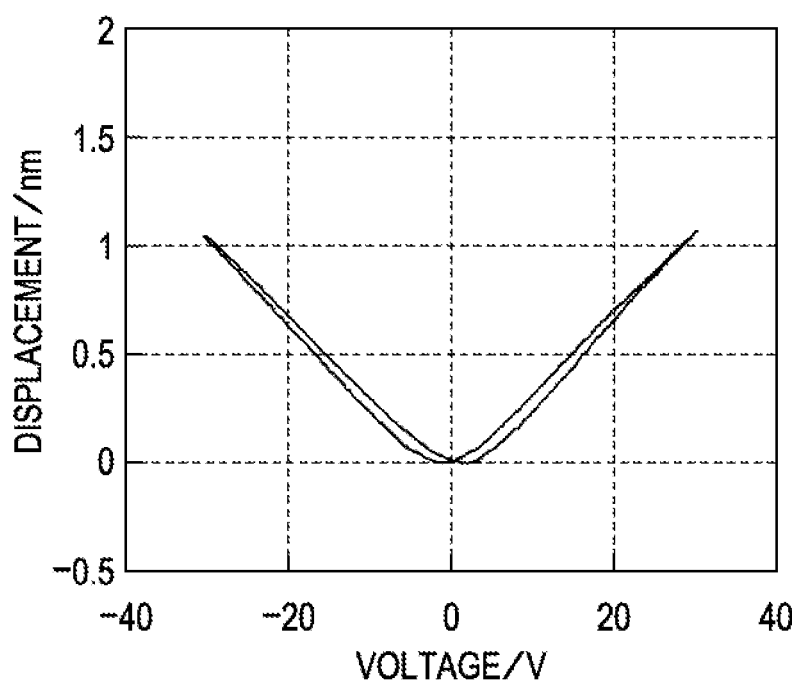
FIG. 54 is a graph showing an S-V curve of a piezoelectric element prepared in Example 6.
Figure 55:
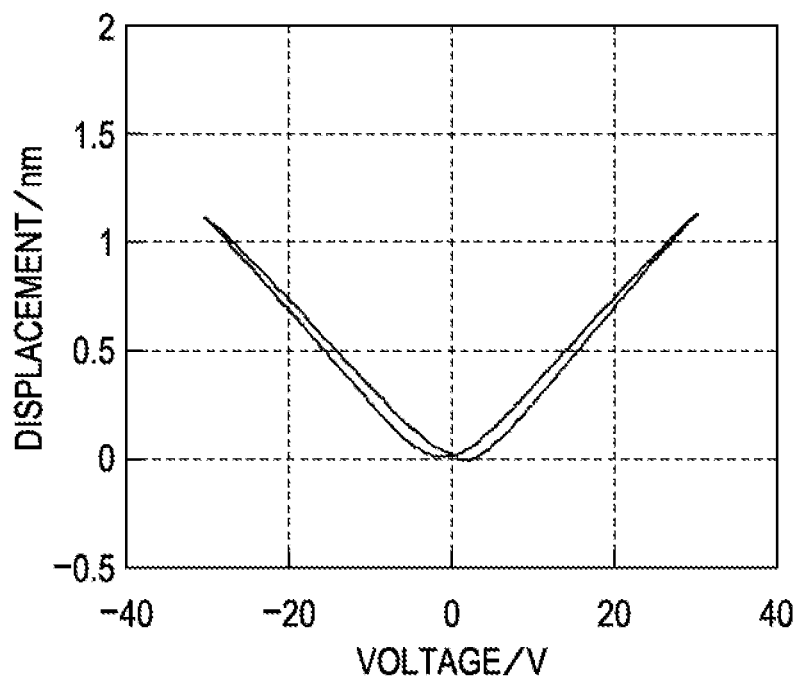
FIG. 55 is a graph showing an S-V curve of a piezoelectric element prepared in Example 7.
Figure 56:
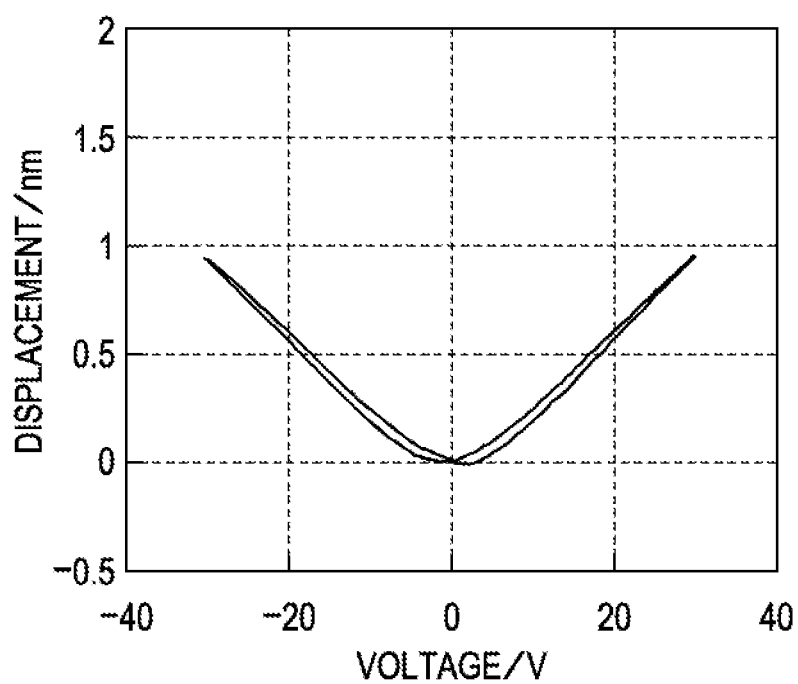
FIG. 56 is a graph showing an S-V curve of a piezoelectric element prepared in Example 8.
Figure 57:
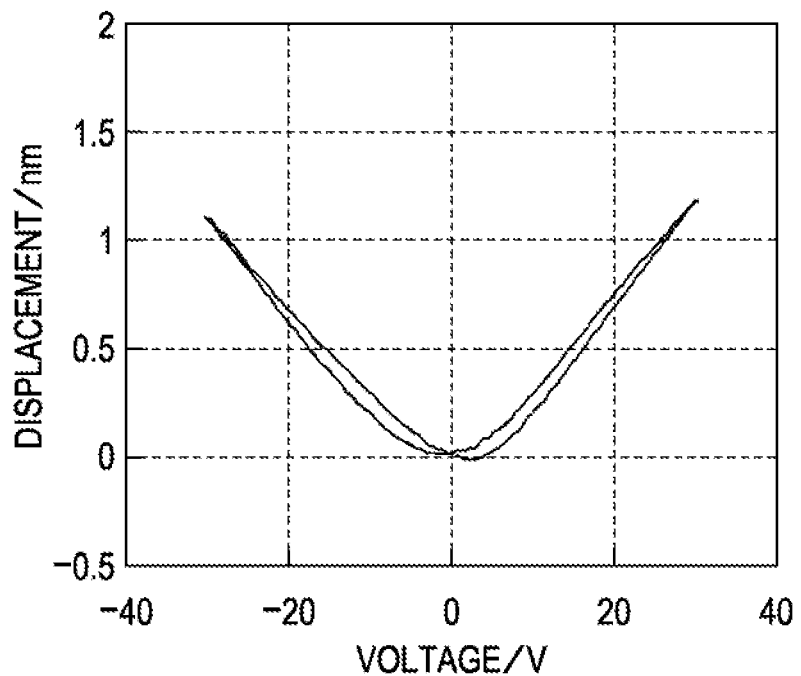
FIG. 57 is a graph showing an S-V curve of a piezoelectric element prepared in Example 9.
Figure 58:
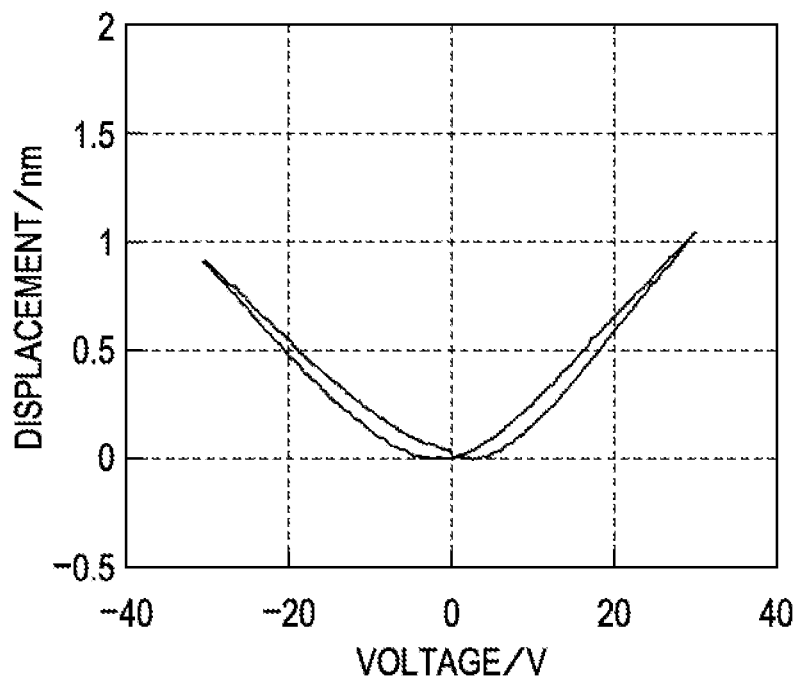
FIG. 58 is a graph showing an S-V curve of a piezoelectric element prepared in Example 10.
Figure 59:
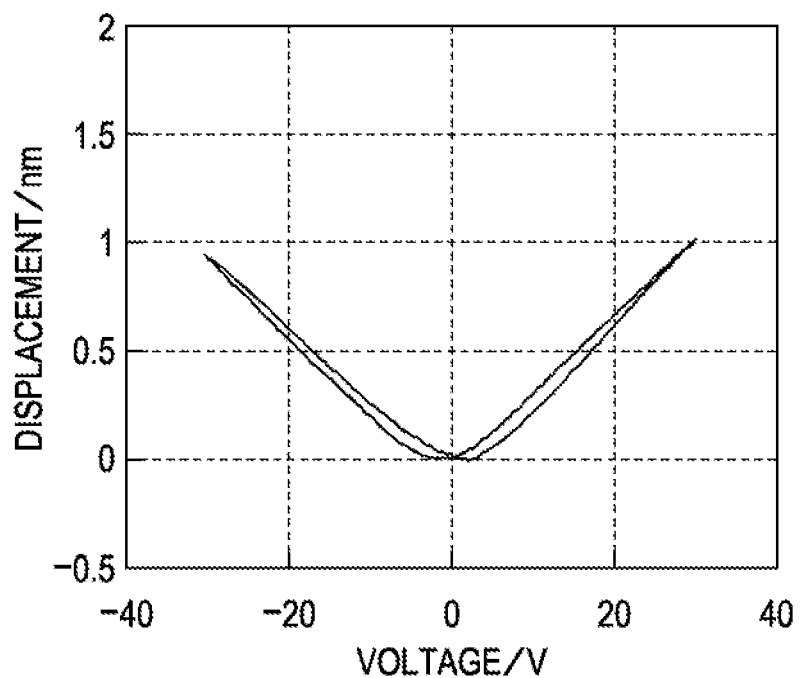
FIG. 59 is a graph showing an S-V curve of a piezoelectric element prepared in Example 11.
Figure 60:
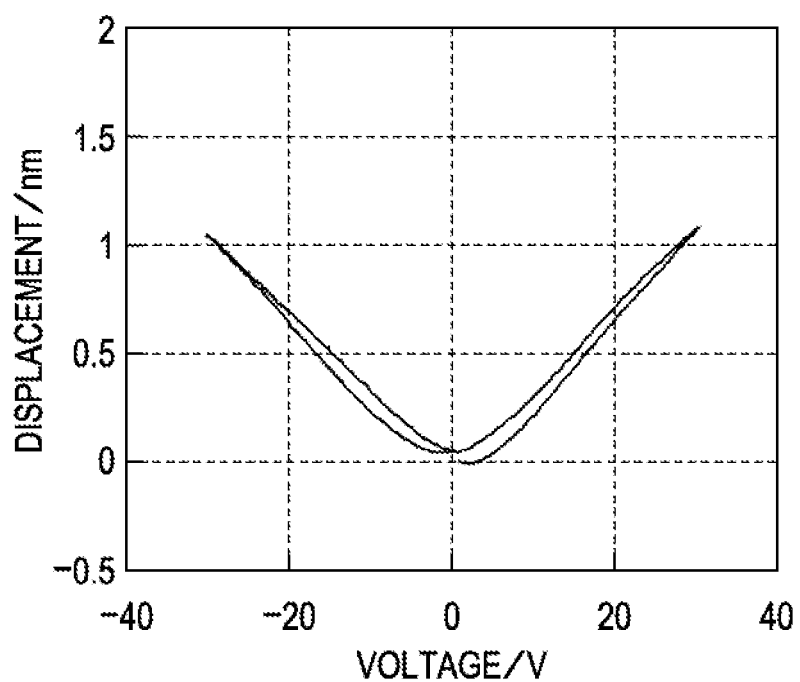
FIG. 60 is a graph showing an S-V curve of a piezoelectric element prepared in Example 12.
Figure 61:
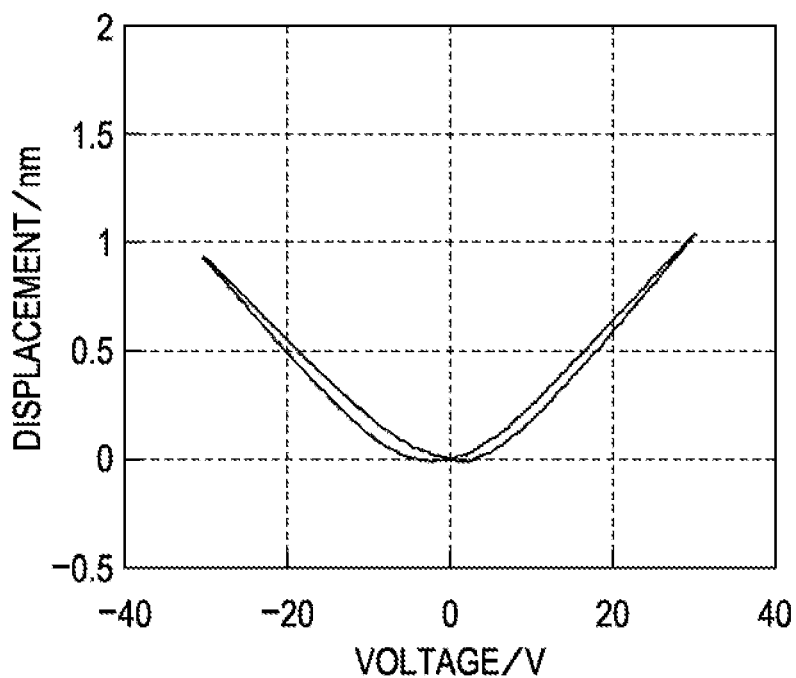
FIG. 61 is a graph showing an S-V curve of a piezoelectric element prepared in Example 13.
Figure 62:
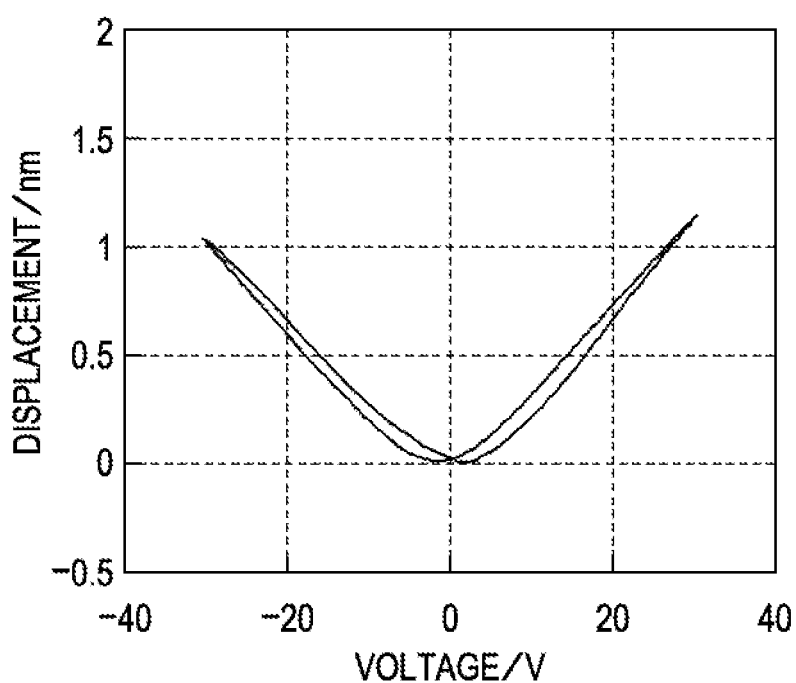
FIG. 62 is a graph showing an S-V curve of a piezoelectric element prepared in Example 14.
Figure 63:
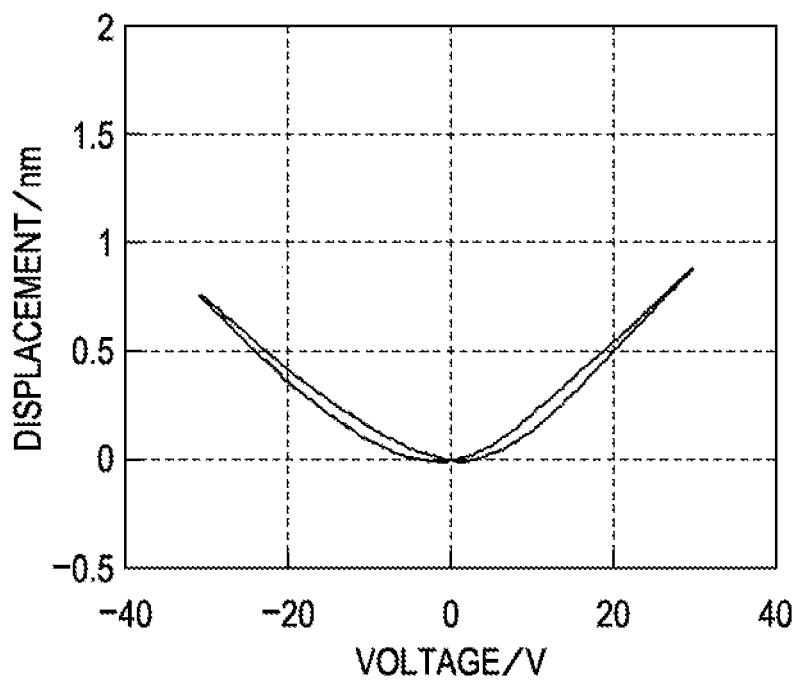
FIG. 63 is a graph showing an S-V curve of a piezoelectric element prepared in Example 15.
Figure 64:
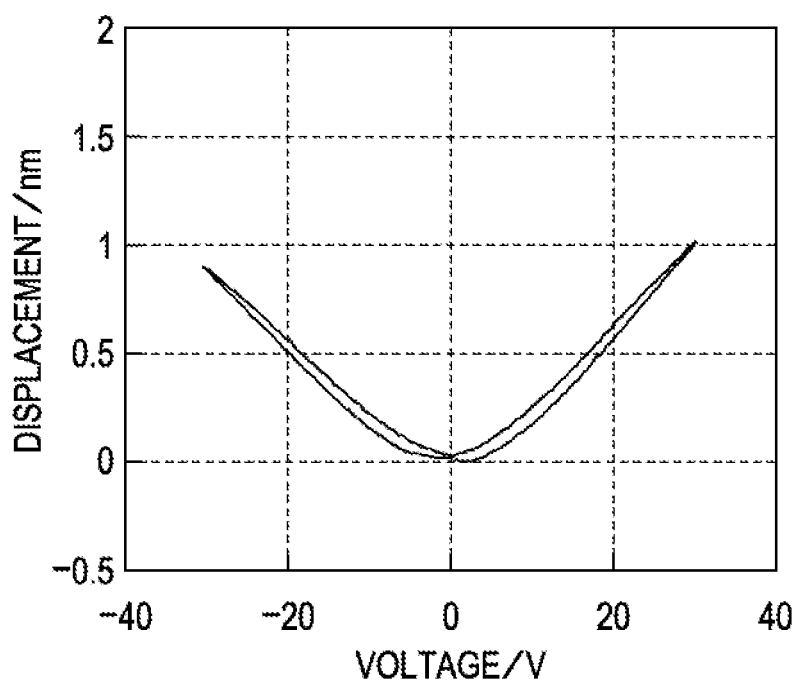
FIG. 64 is a graph showing an S-V curve of a piezoelectric element prepared in Example 16.
Figure 65:
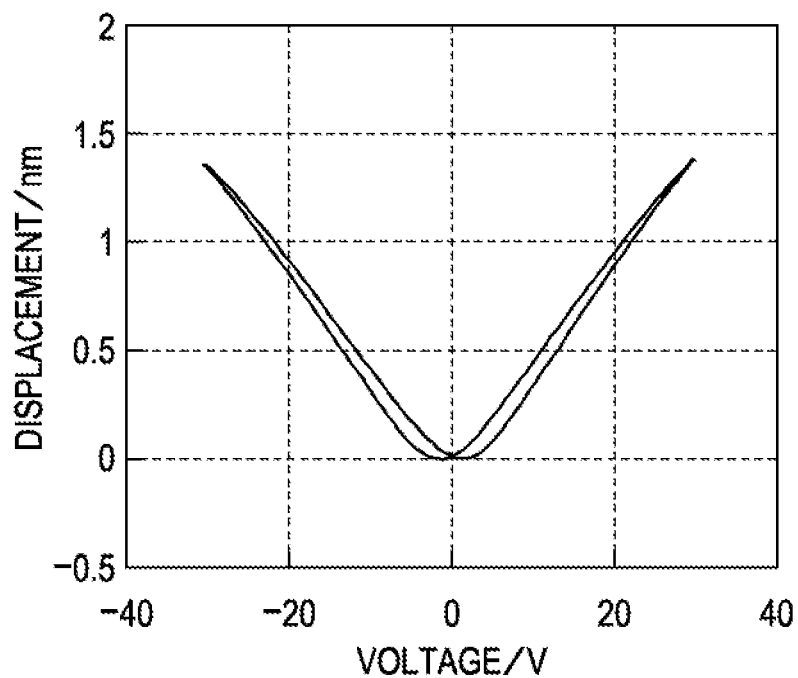
FIG. 65 is a graph showing an S-V curve of a piezoelectric element prepared in Example 19.
Figure 66:
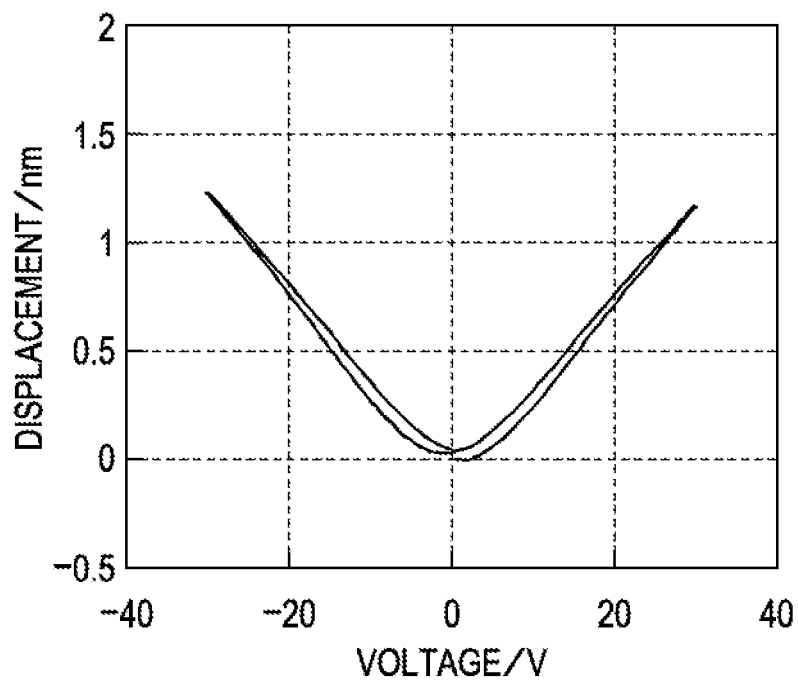
FIG. 66 is a graph showing an S-V curve of a piezoelectric element prepared in Example 20.
Figure 67:
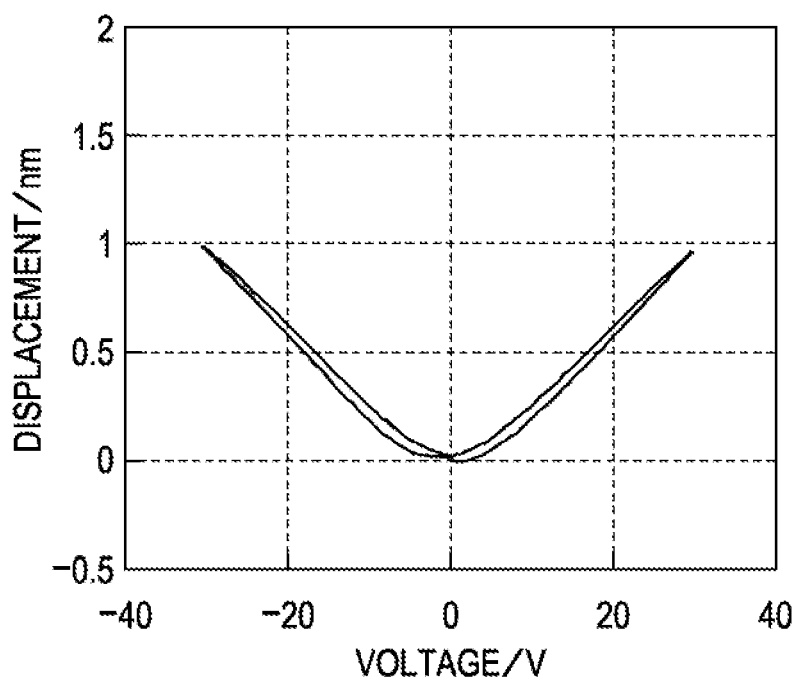
FIG. 67 is a graph showing an S-V curve of a piezoelectric element prepared in Example 21.
Figure 68:
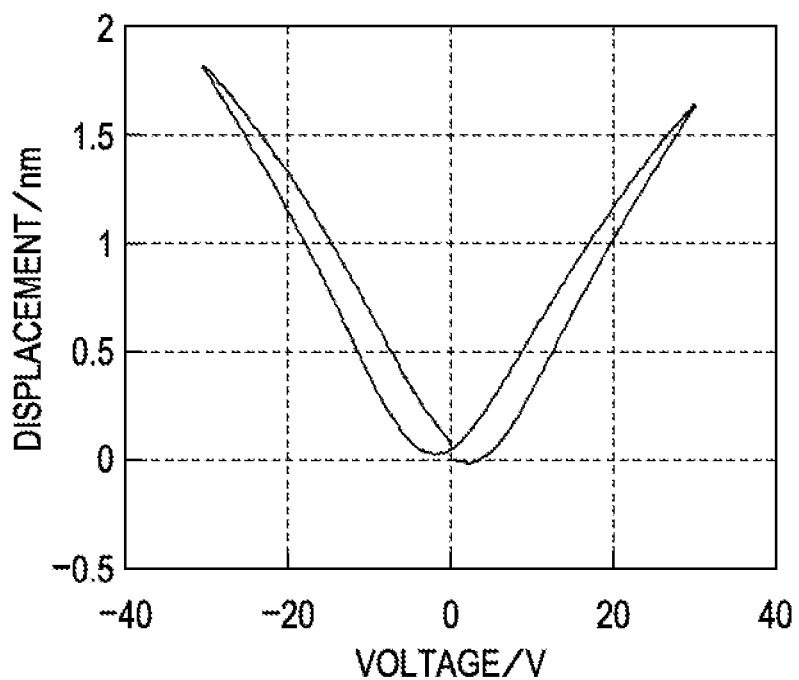
FIG. 68 is a graph showing an S-V curve of a piezoelectric element prepared in Comparative Example 1.
Figure 69:
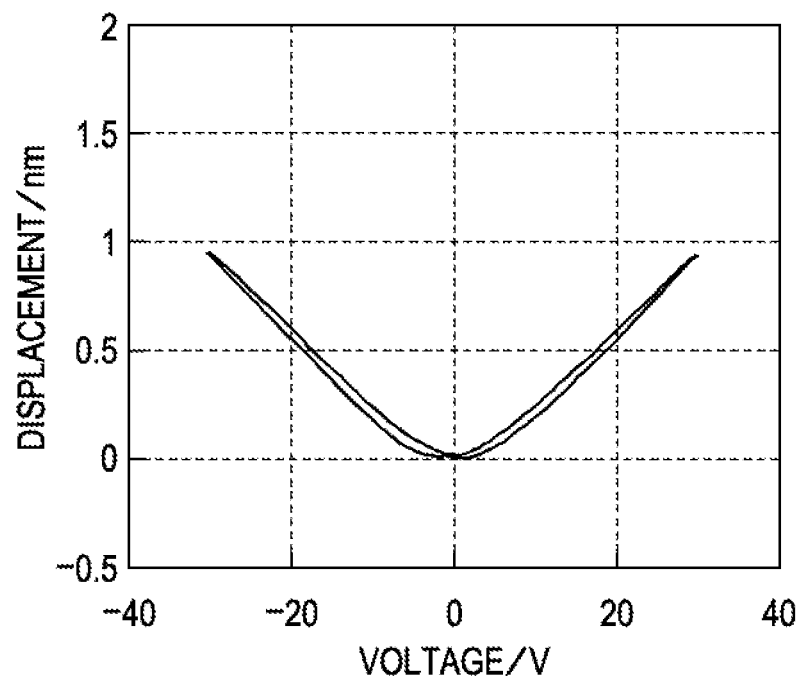
FIG. 69 is a graph showing an S-V curve of a piezoelectric element prepared in Comparative Example 2.

FIG. 48 shows a graph obtained by plotting the ratio $P_r/P_m$ against the composition ratio x in each of Examples 4 to 8 and Comparative Example 3. As shown in FIG. 48, the ratio $P_r/P_m$ in each of Examples 4 to 8 is 0.11 to 0.14 and is significantly different from that in Comparative Example 3, in which the ratio $P_r/P_m$ is 0.92.

Experiment 3

For the piezoelectric element prepared in each of Examples 1 to 22 and Comparative Examples 1 to 4, the X-ray powder diffraction pattern of the piezoelectric layer was determined at room temperature with a system, D8 Discover, available from Bruker AXS Inc. using Cu Kα as an X-ray source. This resulted in that in all of Examples 1 to 22 and Comparative Examples 1 to 4, an $ABO_3$ structure was formed and any peaks assigned to other phases were not observed.

Experiment 4

For the piezoelectric element 300 prepared in each of Examples 1 to 22 and Comparative Examples 1 and 2, the relationship between the electric field-induced strain and the electric field intensity was determined with a double beam laser interferometer (DBLI) available from aixACCT Systems in such a manner that a voltage with a frequency of 1 kHz was applied to the piezoelectric element at room temperature using an electrode pattern with a diameter of 500 μm. Results obtained from the piezoelectric elements of Examples 1 to 16 and 19 to 21 and Comparative Examples 1 and 2 are shown in FIGS. 49 to 69. It is clear that the piezoelectric elements 300 of Examples 1 to 22 are deformed at low voltages and therefore can be driven even if substantially no midpoint potentials are applied thereto.

Experiment 5

For the piezoelectric layer formed in each of Example 5 and Comparative Example 4, the relationship (a P-V curve) between the polarization and the voltage applied thereto was determined in the same manner as that described in Experiment 1 and $P_r$ and $P_m$ were determined. The piezoelectric layer of Example 5 exhibited that $P_r=4.3$ μC/cm, $P_m=32$ μC/cm, and $P_r/P_m=0.14$. The piezoelectric layer of Comparative Example 4 exhibited that $P_r=22$ μC/cm, $P_m=47$ μC/cm, and $P_r/P_m=0.47$. The piezoelectric layer of Example 5 was significantly different in $P_r/P_m$ from that of Comparative Example 4. For the piezoelectric element prepared in each of Example 5 and Comparative Example 4, the relationship between the unipolar electric field-induced strain and the electric field intensity was determined with a double beam laser interferometer (DBLI) available from aixACCT Systems in such a manner that a voltage with a frequency of 1 kHz was applied to the piezoelectric element at room temperature using an electrode pattern with a diameter of 500 μm. This resulted in that the displacement of the piezoelectric element of Example 5 was about 43% of that of Comparative Example 4 at the same voltage.

As described above, a piezoelectric layer included in a liquid-ejecting head according to the invention exhibits properties different from those of conventional ferroelectrics such as lead zirconate titanate and bismuth ferrate and those of so-called bulky bismuth sodium potassium titanate and the like.

Other Embodiments

Although the first embodiment of the invention has been described above, the scope of the invention is not limited to the first embodiment. In the first embodiment, the channeled substrate 10 is made from the single-crystalline silicon wafer. The channeled substrate 10 is not limited to the single-crystalline silicon wafer and may be an SOI substrate or may be made of a material such as glass.

In the first embodiment, the piezoelectric elements 300, which include the first electrode 60, the piezoelectric layers 70, and the second electrodes 80 arranged on a substrate (the channeled substrate 10) in that order, are exemplified. The invention is not limited to such a configuration and is applicable to longitudinally vibrating piezoelectric elements which are prepared by alternately depositing piezoelectric materials and electrode-forming materials and which expand and contract in the longitudinal direction thereof.

Figure 70:
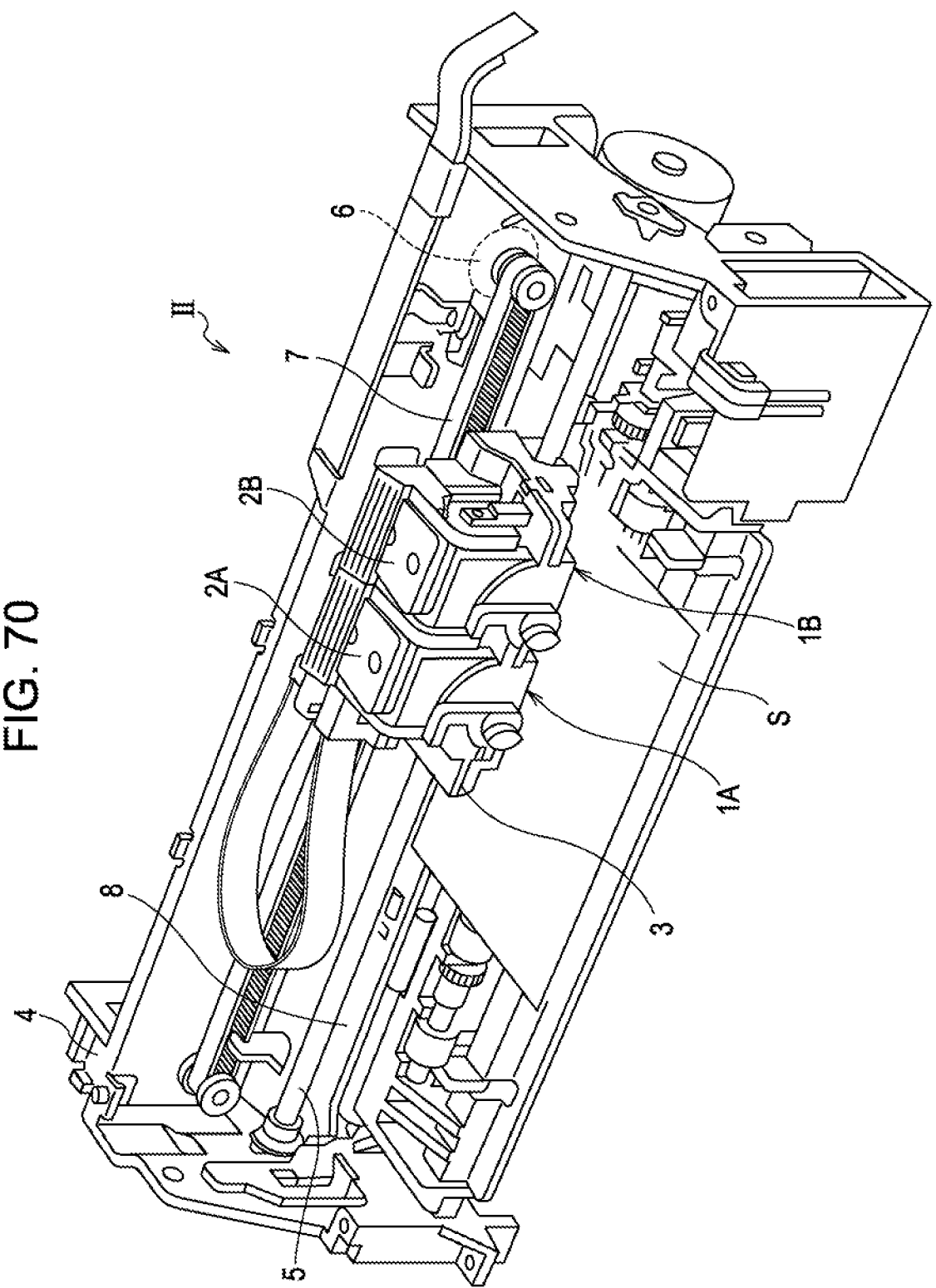
FIG. 70 is a schematic view of an ink jet recording apparatus according to an embodiment of the invention.

The ink jet recording head is a component of a recording head unit including an ink channel communicating with an ink cartridge or the like and is used in an ink jet recording apparatus. FIG. 70 is a schematic view of an example of the ink jet recording apparatus.

In an ink jet recording apparatus II shown in FIG. 70, recording head units 1A and 1B each including an ink jet recording head I are detachably attached to cartridges 2A and 2B. The recording head units 1A and 1B are mounted on a carriage 3. The carriage 3 is attached to a carriage shaft 5 attached to an apparatus body 4 so as to be movable along the carriage shaft 5. The recording head units 1A and 1B eject, for example, a black ink composition and a color ink composition, respectively.

The carriage 3, on which the recording head units 1A and 1B, is moved along the carriage shaft 5 in such a manner that the driving force generated by a driving motor 6 is transmitted to the carriage 3 through a plurality of gears, which are not shown, and a timing belt 7. The apparatus body 4 attached to a platen 8 extending along the carriage shaft 5. A recording sheet S which is a recording medium made of paper or the like is transported in such a manner that the recording sheet S is fed by feed rollers, which are not shown, and is then put on the platen 8.

In the first embodiment, the ink-jet recording head is described as an example of the liquid-ejecting head. The invention is directed to various liquid-ejecting heads and is applicable to liquid-ejecting heads ejecting liquids other than ink. Other examples of the liquid-ejecting head include various recording heads for use in image-recording apparatuses such as printers; colorant-ejecting heads used to manufacture color filters for liquid crystal displays; electrode material-ejecting heads used to form electrodes for organic EL displays, field emission displays (FEDs), and the like; and bio-organic substance-ejecting heads used to produce biochips.

The invention is not limited to piezoelectric elements for use in liquid-ejecting heads represented by ink-jet recording heads and is applicable to piezoelectric elements for use in ultrasonic devices such as ultrasonic oscillators and apparatuses such as ultrasonic motors.

What is claimed is:

1. A piezoelectric element comprising:
a piezoelectric layer having a thickness of less than 10 μm, and
a pair of electrodes associated with the piezoelectric layer, wherein the piezoelectric layer contains a perovskite structure bismuth sodium potassium titanate and satisfies the inequality $0 \leq Pr/Pm \leq 0.25$ at 25° C., where Pm and Pr are the saturation polarization and remanent polarization, respectively, of the piezoelectric layer, the saturation polarization (Pm) being a polarization of the piezoelectric layer when supplied with an electric field of 200 kV/cm to 1000 kV/cm.

2. The piezoelectric element according to claim 1, wherein the piezoelectric layer further contains perovskite-structured barium titanate.

3. The piezoelectric element according to claim 1, wherein the piezoelectric layer is one prepared in such a manner that a piezoelectric precursor film is formed on a substrate, is calcined, and is then crystallized.

4. The piezoelectric element according to claim 1, wherein the piezoelectric layer is a thin film with a thickness of 2 μm or less.

5. A liquid-ejecting head comprising a piezoelectric element, the piezoelectric element comprising:
a piezoelectric layer having a thickness of less than 10 μm, and
a pair of electrodes associated with the piezoelectric layer, wherein the piezoelectric layer contains a perovskite structure bismuth sodium potassium titanate and satisfies the inequality $0 \leq Pr/Pm \leq 0.25$ at 25° C., where Pm and Pr are the saturation polarization and remanent polarization, respectively, of the piezoelectric layer, the saturation polarization (Pm) being a polarization of the piezoelectric layer when supplied with an electric field of 200 kV/cm to 1000 kV/cm.

\* \* \* \* \*